(12) United States Patent
Park

(10) Patent No.: US 11,825,669 B2
(45) Date of Patent: *Nov. 21, 2023

(54) ELECTROLUMINESCENT DEVICE

(71) Applicant: SAMSUNG DISPLAY CO., LTD., Yongin-si (KR)

(72) Inventor: Myoung Seo Park, Yongin-si (KR)

(73) Assignee: SAMSUNG DISPLAY CO, LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/817,884

(22) Filed: Aug. 5, 2022

(65) Prior Publication Data
US 2022/0375999 A1 Nov. 24, 2022

Related U.S. Application Data

(63) Continuation of application No. 16/931,081, filed on Jul. 16, 2020, now Pat. No. 11,411,057.

(30) Foreign Application Priority Data

Jul. 17, 2019 (KR) ........................ 10-2019-0086097

(51) Int. Cl.
  *G09G 5/00* (2006.01)
  *H10K 59/65* (2023.01)
  (Continued)

(52) U.S. Cl.
  CPC ........... *H10K 59/65* (2023.02); *G06F 3/0421* (2013.01); *G06V 40/1318* (2022.01);
  (Continued)

(58) Field of Classification Search
  CPC ......... G06F 2203/04111; G06F 3/0421; G06V 40/1318; H01L 27/3223; H01L 27/3227;
  (Continued)

(56) References Cited

U.S. PATENT DOCUMENTS

| | | |
|---|---|---|
| 10,083,335 B2 | 9/2018 | Zhang |
| 10,199,440 B2 | 2/2019 | Park |
| 10,243,030 B2 | 3/2019 | Wu |
| 10,360,431 B2 | 7/2019 | Gozzini et al. |

(Continued)

FOREIGN PATENT DOCUMENTS

| | | |
|---|---|---|
| CN | 204028936 | 12/2014 |
| CN | 205880882 | 1/2017 |

(Continued)

*Primary Examiner* — Insa Sadio
(74) *Attorney, Agent, or Firm* — F. CHAU & ASSOCIATES, LLC

(57) ABSTRACT

Embodiments of the present invention relate to an electroluminescent device. The electroluminescent device includes an image sensor structure, a first light blocking structure, a first insulation layer, and an electroluminescent structure, which are sequentially stacked. The electroluminescent structure includes lower electrodes, luminous layers disposed on the lower electrodes, and an upper electrode disposed on the luminous layers. The first light blocking structure has effective pinholes. The image sensor structure includes effective image sensors that overlap the effective pinholes. The lower electrodes do not overlap the effective pinholes. The electroluminescent device has a good fingerprint recognition function.

28 Claims, 27 Drawing Sheets

(51) Int. Cl.
  *G06V 40/13* (2022.01)
  *G06F 3/042* (2006.01)
  *H10K 50/11* (2023.01)
  *H10K 50/86* (2023.01)
  *H10K 59/40* (2023.01)
  *H10K 59/88* (2023.01)
  *H10K 59/122* (2023.01)

(52) U.S. Cl.
  CPC ........... *H10K 50/11* (2023.02); *H10K 50/865* (2023.02); *H10K 59/122* (2023.02); *H10K 59/40* (2023.02); *H10K 59/88* (2023.02); *G06F 2203/04111* (2013.01)

(58) Field of Classification Search
  CPC ............... H01L 27/323; H01L 27/3234; H01L 27/3246; H01L 27/3272; H01L 51/5012; H01L 51/5284
  See application file for complete search history.

(56) References Cited

U.S. PATENT DOCUMENTS

| | | |
|---|---|---|
| 10,369,430 B2 | 7/2019 | Zhang et al. |
| 11,411,057 B2 | 8/2022 | Park |
| 2018/0089491 A1 | 3/2018 | Kim et al. |
| 2018/0175125 A1* | 6/2018 | Chung ................ H01L 27/3234 |
| 2019/0006440 A1 | 1/2019 | Sun et al. |
| 2019/0213379 A1* | 7/2019 | Zhao .................. G06V 40/1318 |
| 2020/0075605 A1 | 3/2020 | Zhao et al. |

FOREIGN PATENT DOCUMENTS

| | | |
|---|---|---|
| CN | 205910951 | 1/2017 |
| CN | 105760808 | 7/2018 |
| CN | 108899344 | 11/2018 |
| CN | 109148540 | 1/2019 |
| EP | 3 306 526 | 4/2018 |
| EP | 3 358 500 | 8/2018 |
| KR | 10-2017-0087556 | 7/2017 |
| KR | 10-2018-0034750 | 4/2018 |
| WO | WO 2017/202197 | 11/2017 |
| WO | WO 2017/206676 | 12/2017 |

* cited by examiner

ELECTROLUMINESCENT DEVICE

CROSS-REFERENCE TO RELATED APPLICATION

The present application is a continuation of U.S. patent application Ser. No. 16/931,081, filed in the U.S. Patent and Trademark Office on Jul. 16, 2020, which claims priority under 35 U.S.C. § 119 from, and the benefit of, Korean patent application number 10-2019-0086097, filed on Jul. 17, 2019 in the Korean Intellectual Property Office, the contents of both of which are herein incorporated by reference in their entireties.

BACKGROUND

Technical Field

Various embodiments of the present disclosure are directed to an electroluminescent device. More particularly, embodiments of the present disclosure are directed to an electroluminescent device that includes a fingerprint sensor.

Discussion of the Related Art

An electroluminescent device has a fast response speed and high luminous efficiency, luminance and field of view by using a self-emitting light emitting diode. Recently, as electroluminescent devices such as smartphones and tablet PCs are used in various ways, biometric information authentication methods that use fingerprints, etc., of a user have become widely used. To provide a fingerprint sensing function, an electroluminescent device is provided with a fingerprint sensor in such a way that the fingerprint sensor is installed in or mounted to the electroluminescent device.

For example, the fingerprint sensor can be configured as a photo-sensing type sensor. A photo-sensing fingerprint sensor includes a light source, a lens, and an optical sensor array. If a fingerprint sensor is attached to a luminous panel, the thickness of the electroluminescent device may increase, and the production cost of the electroluminescent device may increase.

SUMMARY

Various embodiments of the present disclosure are directed to an electroluminescent device that is thinner than previous devices while improving reliability.

Some embodiments of the present disclosure provide an electroluminescent device, comprising a first insulation layer, an electroluminescent structure that includes lower electrodes disposed on the first insulation layer, luminous layers disposed on the lower electrodes, and an upper electrode disposed on the luminous layers, a first light blocking structure disposed under the first insulation layer and that includes first effective pinholes, and an image sensor structure disposed under the first light blocking structure and that includes effective image sensors that overlap the first effective pinholes. Here, the lower electrodes do not overlap the first effective pinholes.

In an embodiment, the first light blocking structure further comprises first dummy pinholes. Here, the first dummy pinhole is located between the first effective pinholes, and the first effective pinholes and the first dummy pinholes form a single grid arrangement in plan view.

In an embodiment, the electroluminescent device further comprises a second light blocking structure disposed between the first light blocking structure and the image sensor structure, and that includes a second light blocking area and second effective pinholes. Here, the second light blocking area does not overlap the first effective pinholes and blocks light passing through the first dummy pinholes, and the second effective pinholes overlap the first effective pinholes.

In an embodiment, the electroluminescent device further comprises a second light blocking structure disposed between the first light blocking structure and the image sensor structure, and that includes a second light blocking area and second effective pinholes. Here, the second light blocking area does not overlap the first effective pinholes, and the second effective pinholes overlap the first effective pinholes.

In an embodiment, the second light blocking area includes an additional pinhole.

In an embodiment, the electroluminescent device further comprises a light blocking member provided over or under the additional pinhole and that overlaps the additional pinhole.

In an embodiment, the additional pinhole is smaller than the second effective pinhole.

In an embodiment, a shortest plane distance from an optical center of the first effective pinhole to the lower electrodes is greater than a plane distance measured from the optical center of the first effective pinhole to an inner wall of the first effective pinhole in a first direction in which the shortest plane distance from the optical center of the first effective pinhole to the lower electrodes is measured.

In an embodiment, the lower electrodes include a single first lower electrode that is firstly closest in plan view to the optical center of the first effective pinhole, and a single second lower electrode that is secondly closest in plan view to the optical center of the first effective pinhole.

In an embodiment, a shortest plane distance from the optical center of the first effective pinhole to the single second lower electrode is measured in a second direction, and an angle between the first and second directions is not k×180°, where k is integers other than zero.

In an embodiment, the lower electrodes include a single first lower electrode that is firstly closest in plan view to the optical center of the first effective pinhole, and at least two second lower electrodes that are secondly closest in plan view to the optical center of the first effective pinhole.

In an embodiment, the lower electrodes include at least two first lower electrodes that are firstly closest in plan view to the optical center of the first effective pinhole.

In an embodiment, the electroluminescent device further comprises a pixel defining layer disposed on the first insulation layer and that covers edges of the lower electrodes, and spacers disposed on the pixel defining layer to be higher than the pixel defining layer. Here, a shortest plane distance from the optical center of the first effective pinhole to the spacers is greater than the shortest plane distance from the optical center of the first effective pinhole to the lower electrodes.

In an embodiment, the electroluminescent device further comprises a touch sensing structure including touch sensing electrodes and bridges, and located above the electroluminescent structure. Here, the bridge electrically couples two neighboring touch sensing electrodes to each other, and a shortest plane distance from the optical center of the first effective pinhole to the bridges is greater than the shortest plane distance from the optical center of the first effective pinhole to the spacers.

In an embodiment, the electroluminescent device further comprises a pixel defining layer disposed on the first insulation layer and that covers edges of the lower electrodes, and spacers disposed on the pixel defining layer to be higher than the pixel defining layer. Here, a shortest plane distance from the optical center of the first effective pinhole to the spacers is greater than a plane distance measured from the optical center of the first effective pinhole to an inner wall of the first effective pinhole in a third direction in which the shortest plane distance from the optical center of the first effective pinhole to the spacers is measured.

In an embodiment, the spacers include a single first spacer that is firstly closest in plan view to the optical center of the first effective pinhole, and a single second spacer that is secondly closest in plan view to the optical center of the first effective pinhole.

In an embodiment, a shortest plane distance from the optical center of the first effective pinhole to the second spacer is measured in a fourth direction, and the third and fourth directions form a single second angle, and the second angle is not m×180°, where m is integers other than zero.

In an embodiment, the spacers include a single first spacer that is firstly closest in plan view to the optical center of the first effective pinhole, and at least two second spacers that are secondly closest in plan view to the optical center of the first effective pinhole.

In an embodiment, the spacers include at least two first spacers that are firstly closest in plan view to the optical center of the first effective pinhole.

In an embodiment, the electroluminescent device further comprises a touch sensing structure that includes touch sensing electrodes and bridges, and is located above the electroluminescent structure. Here, the bridge electrically couples two neighboring touch sensing electrodes to each other, and a shortest plane distance from the optical center of the first effective pinhole to the bridges is greater than the shortest plane distance from the optical center of the first effective pinhole to the spacers.

In an embodiment, the electroluminescent device further comprises a touch sensing structure that includes touch sensing electrodes and bridges, and is located above the electroluminescent structure. Here, the bridge electrically couples two neighboring touch sensing electrodes to each other, and a shortest plane distance from the optical center of the first effective pinhole to the bridges is greater than a plane distance measured from the optical center of the first effective pinhole to an inner wall of the first effective pinhole in a fifth direction in which the shortest plane distance from the optical center of the first effective pinhole to the bridges is measured.

In an embodiment, the bridges include a single first bridge that is firstly closest in plan view to the optical center of the first effective pinhole, and a single second bridge that is secondly closest in plan view to the optical center of the first effective pinhole.

In an embodiment, a shortest plane distance from the optical center of the first effective pinhole to the single second bridge is measured in a sixth direction, and the fifth and sixth directions form a third angle, and the third angle is n×180°, where n is integers other than zero.

In an embodiment, the bridges include a single first bridge that is firstly closest in plan view to the optical center of the first effective pinhole, and at least two second bridges that are secondly closest in plan view to the optical center of the first effective pinhole.

In an embodiment, the bridges include at least two first bridges that are firstly closest in plan view to the optical center of the first effective pinhole.

In an embodiment, the electroluminescent device further comprises a touch sensing structure that includes bridges and touch sensing electrodes disposed on a different layer from the bridges, and that is located above the electroluminescent structure. Here, the bridge electrically couples two neighboring touch sensing electrodes to each other, the bridges include overlap areas that overlap the touch sensing electrodes, and a shortest plane distance from the optical center of the first effective pinhole to the overlap areas is greater than a plane distance measured from the optical center of the first effective pinhole to an inner wall of the first effective pinhole in a direction in which the shortest plane distance from the optical center of the first effective pinhole to the overlap areas is measured.

In an embodiment, the electroluminescent structure has overlap areas where at least two luminous layers overlap, and the first effective pinhole overlaps the overlap area.

In an embodiment, the electroluminescent device further comprises a pixel defining layer disposed on the first insulation layer and that covers edges of the lower electrodes, and spacers disposed on the pixel defining layer to be higher than the pixel defining layer. Here, the overlap area does not overlap the spacers.

In an embodiment, the electroluminescent device further comprises a pixel defining layer disposed on the first insulation layer and that covers edges of the lower electrodes, and spacers disposed on the pixel defining layer to be higher than the pixel defining layer. Here, the spacer has a curved edge between side and upper surfaces of the spacer in a cross-section, the spacer has a curved edge in plan view, and the spacer overlaps the first effective pinhole.

In an embodiment, the image sensor structure further includes a dummy image sensor located between the effective image sensors.

Some embodiments of the present disclosure provide an electroluminescent device, comprising an electroluminescent structure that includes lower electrodes disposed on an insulation layer, luminous layers disposed on the lower electrodes, and an upper electrode disposed on the luminous layers, a first light blocking structure located on a same layer as the lower electrodes, and an image sensor structure located under the insulation layer and that includes effective image sensors. Here, the electroluminescent structure includes luminous areas where the lower electrodes, the luminous layers and the upper electrode overlap each other to emit light, and the first light blocking structure includes a first effective pinhole that overlaps the effective image sensor.

In an embodiment, the first light blocking structure is integrally formed with the lower electrode as a single piece.

In an embodiment, the first light blocking structure is not electrically coupled to the lower electrodes, the first light blocking structure has a shape of an island that does not surround the lower electrode, and the first light blocking structure is provided in plurality.

In an embodiment, the first light blocking structure is electrically coupled to the upper electrode.

In an embodiment, the first light blocking structure is not electrically coupled to the lower electrodes, the first light blocking structure has a mesh shape with a hole, and the hole surrounds the lower electrode.

In an embodiment, the first light blocking structure is electrically coupled to the upper electrode.

In an embodiment, the electroluminescent device further comprises a second light blocking structure located between the first light blocking structure and the image sensor structure, and that includes second effective pinholes. Here, the first effective pinhole overlaps the second effective pinhole, and the first effective pinhole is smaller than the second effective pinhole.

Some embodiments of the present disclosure provide an electroluminescent device, comprising an electroluminescent structure that includes lower electrodes, luminous layers disposed on the lower electrodes, and an upper electrode disposed on the luminous layers, a light blocking structure disposed under the electroluminescent structure and that includes effective pinholes, an image sensor structure disposed under the light blocking structure and that includes image sensors that overlap the effective pinholes, and a touch sensing structure that includes touch sensing electrodes and bridges and that is located above the electroluminescent structure. Here, the lower electrodes do not overlap the effective pinholes, the bridge electrically couples two neighboring touch sensing electrodes to each other, and at least one of the touch sensing electrode and/or the bridge includes at least one opening that overlaps the effective pinholes.

In an embodiment, the electroluminescent structure comprises luminous areas where the lower electrodes, the luminous layers and the upper electrode overlap each other to emit light, the at least one of the touch sensing electrode and/or the bridge further includes a hole that overlaps the luminous area, and a size of the opening is greater than a size of the hole.

DETAILED DESCRIPTION

Figure 1A:
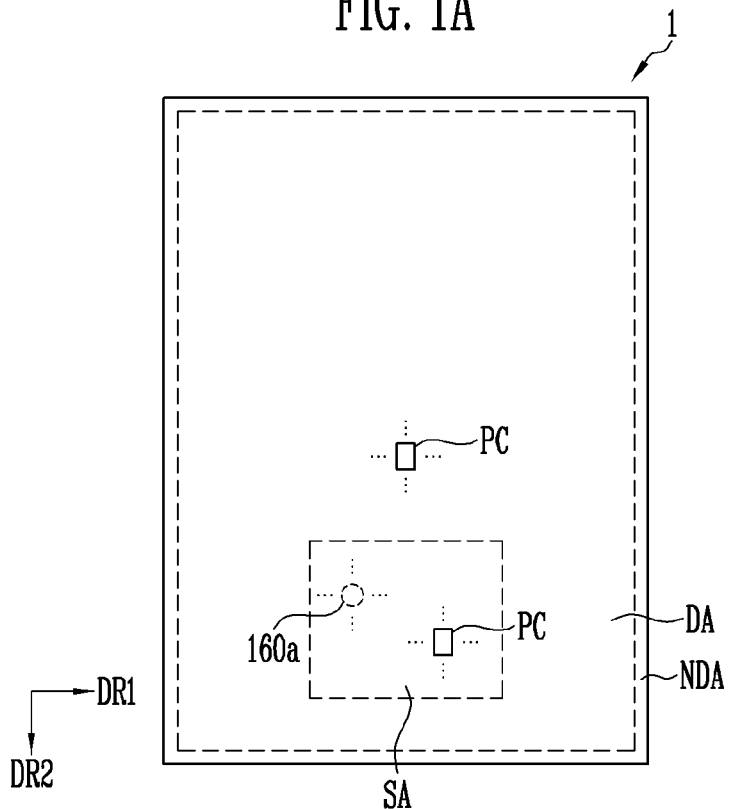
FIGS. 1A and 1B are plan views of an electroluminescent device in accordance with an embodiment of the present disclosure.

As the present disclosure allows for various changes and numerous embodiments, particular embodiments will be illustrated in the drawings and described in detail in the written description.

Throughout the disclosure, like reference numerals may refer to like parts throughout the various figures and embodiments of the present disclosure. The sizes of elements in the accompanying drawings may be exaggerated for clarity of illustration.

Hereinafter, exemplary embodiments of the present disclosure will be described in detail with reference to the accompanying drawings. Exemplary embodiments of the present disclosure are not mutually exclusive but may be used in combination.

Figure 1B:
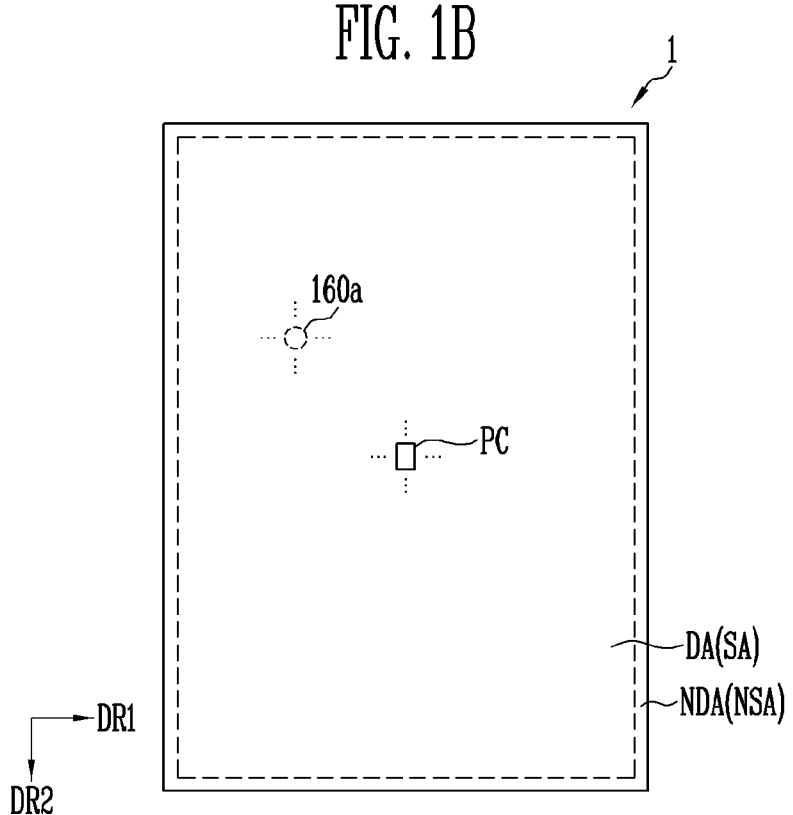

FIGS. 1A and 1B are plan views of an electroluminescent device in accordance with an embodiment of the present disclosure. To be more specific, FIGS. 1A and 1B are plan views of an electroluminescent device that has a display area in which an image sensor is located, in accordance with an embodiment of the present disclosure.

Referring to FIGS. 1A and 1B, the electroluminescent device 1 in accordance with an embodiment of the present disclosure includes a display area DA and a non-display area NDA.

According to embodiments, the electroluminescent device 1 may have various shapes. For example, the electroluminescent device 1 may have the shape of a flat rectangle having two pairs of parallel sides that are respectively parallel to a first direction DR1 and a second direction DR2 that is substantially perpendicular to the first direction DR1. The electroluminescent device 1 can display visual information in an image display direction. The visual information may include text, video, photographs, 3D stereoscopic images, etc.

According to embodiments, the electroluminescent device 1 may be entirely flexible or may be flexible only in some areas. As one example, when the electroluminescent device 1 is entirely flexible, the electroluminescent device 1 is a rollable device. As another example, when only some areas of the electroluminescent device 1 are flexible, the electroluminescent device 1 is a foldable device.

Figure 21:
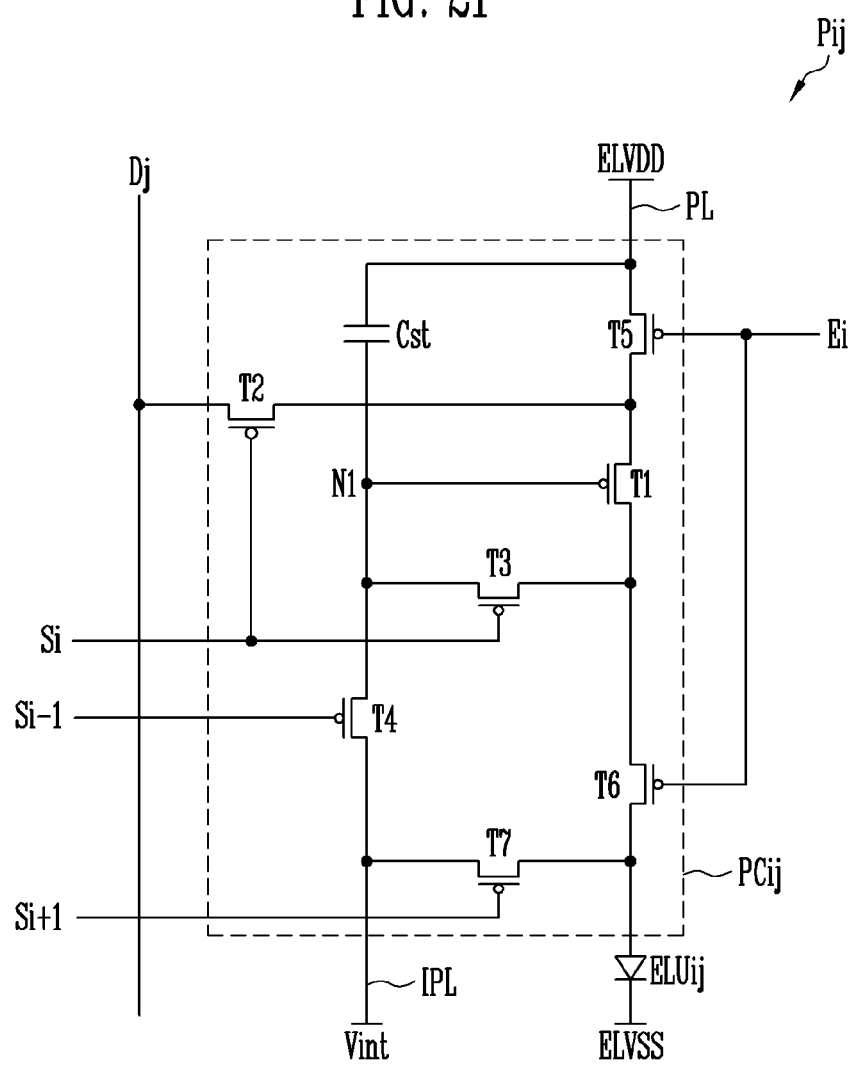
FIG. 21 is a circuit diagram of a pixel circuit shown in FIG. 1A or FIG. 1B in accordance with an embodiment of the present disclosure.

According to embodiments, the display area DA includes pixel circuits PC. The pixel circuit PC is electrically connected to an electroluminescent unit ELU, shown in FIG. 2. The electroluminescent unit ELU and the pixel circuit PC are illustrated in FIG. 21.

According to embodiments, the non-display area NDA is located on at least one side of the display area DA. For example, the non-display area NDA surrounds the display area DA. For example, the non-display area NDA is an area of the electroluminescent device 1 other than the display area DA. Peripheral wiring, peripheral circuits, pads, dummy pixels, etc., are located in the non-display area NDA.

According to embodiments, at least one area of the display area DA is a sensing area SA that can sense a user's fingerprint, etc. As one example, as illustrated in FIG. 1A, only some of the display area DA is the sensing area SA. As another example, as illustrated in FIG. 1B, the whole of the display area DA is the sensing area SA. The non-display area NDA that surrounds the display area DA is a non-sensing area NSA. At least one image sensor 160a (hereinafter, also referred as effective image sensor 160a) is located within the sensing area SA.

Figure 2:
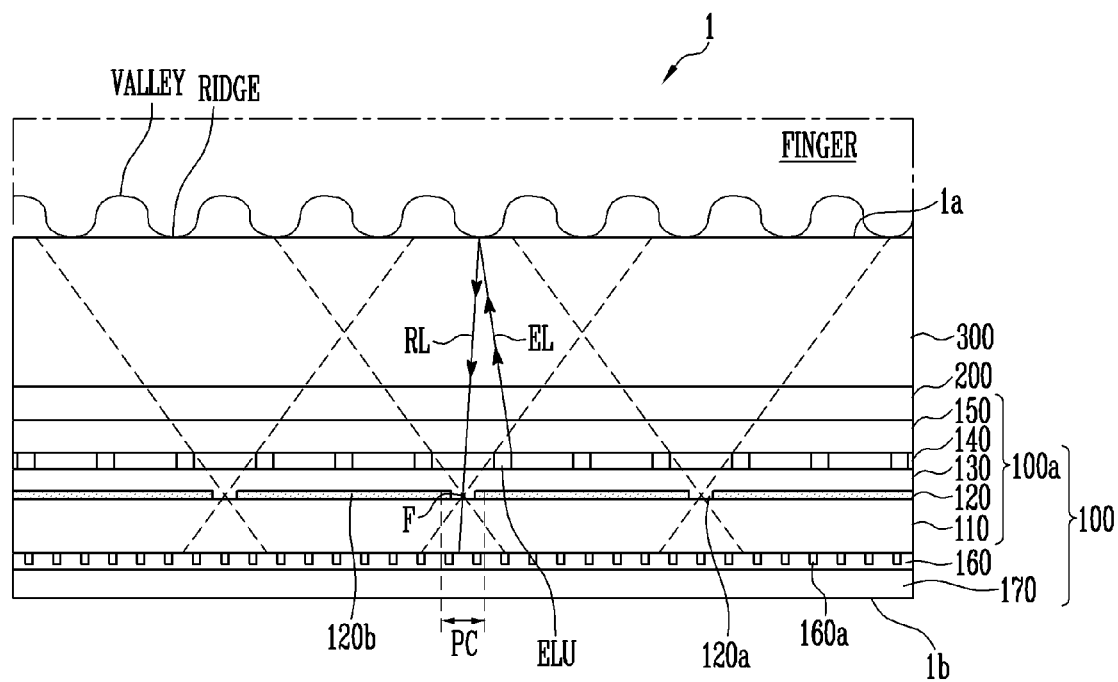
FIG. 2 is a sectional view of an electroluminescent device illustrated in FIG. 1A or FIG. 1B in accordance with an embodiment of the present disclosure.

According to embodiments, the electroluminescent device 1 has a first surface 1a, shown in FIG. 2, on which the image is displayed, and a second surface 1b, shown in FIG. 2, which is opposite to the first surface 1a, and image sensors 160a are located closer to the second surface 1b than the first surface 1a. The electroluminescent unit ELU connected to the pixel circuit PC, which is located in or adjacent to the sensing area SA, is used as the light source for the fingerprint sensing of the image sensor 160a. To be more specific, light EL, shown in FIG. 2, emitted from the electroluminescent unit ELU is reflected by a user's finger to be changed into reflected light RL, shown in FIG. 2, and the image sensor 160a senses the reflected light RL. Thus, both the electroluminescent unit ELU and the image sensor 160a are located in the sensing area SA. Since the electroluminescent device 1 does not use an external light source but uses the electroluminescent unit ELU as a light source, the thickness of the electroluminescent device 1 can be reduced and a manufacturing cost thereof can be reduced. However, embodiments of the present disclosure can adopt a separate external light source for sensing the fingerprint, without being limited to the above configuration.

According to embodiments, the image sensors 160a can perform various functions, such as those of a touch sensor, a scanner, a camera, etc., in addition to sensing a fingerprint.

Figure 3:
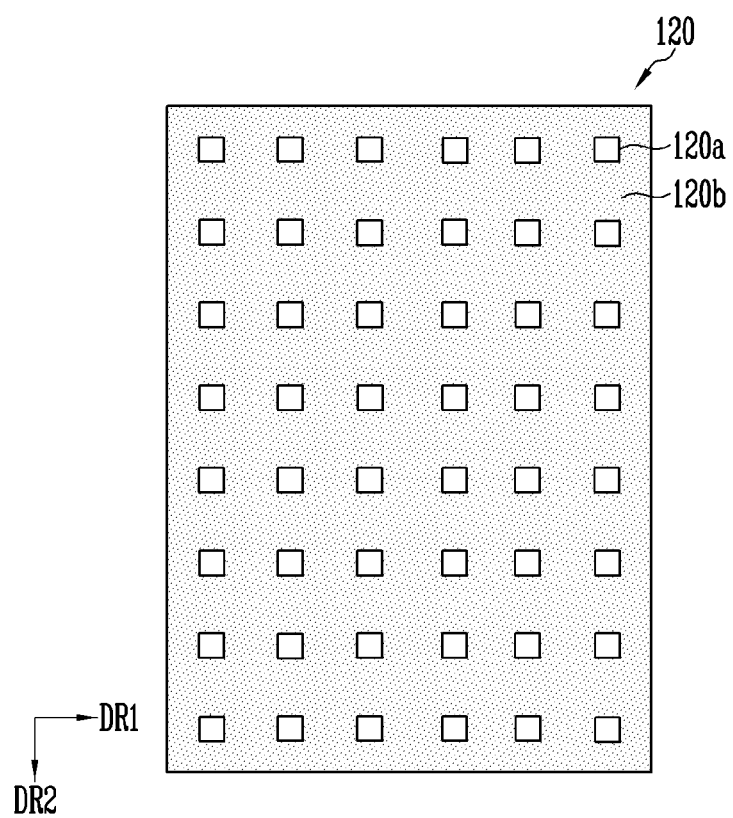
FIG. 3 is a plan view of a light blocking structure of FIG. 2 in accordance with an embodiment of the present disclosure.
Figure 4:
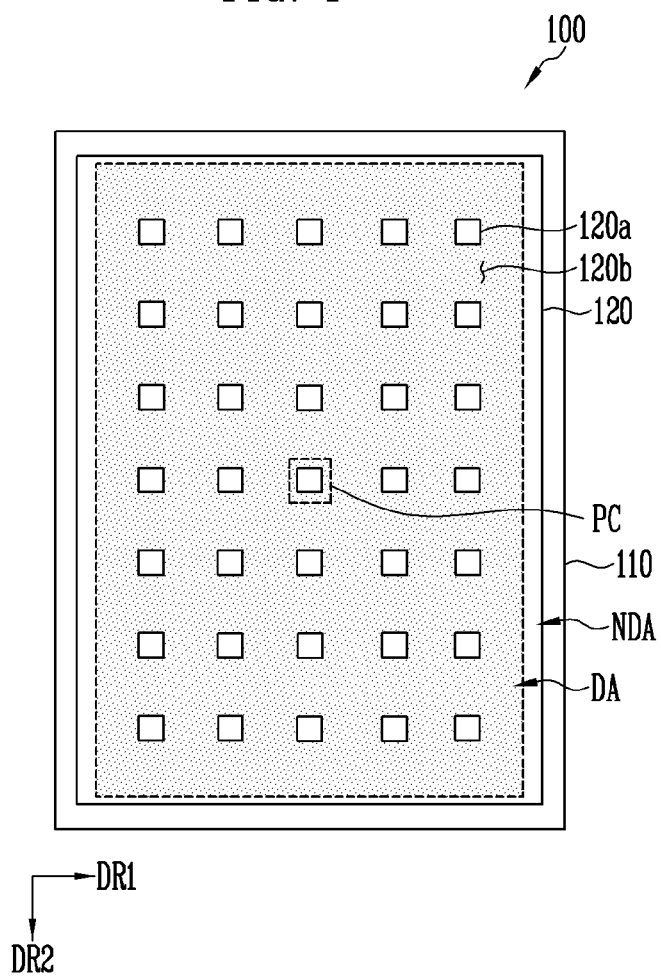
FIG. 4 is a plan view of an electroluminescent device that includes a light blocking structure of FIG. 2 in accordance with an embodiment of the present disclosure.

FIG. 2 is a sectional view of an electroluminescent device illustrated in FIG. 1A or FIG. 1B in accordance with an embodiment of the present disclosure. FIG. 3 is a plan view of a light blocking structure of FIG. 2 in accordance with an embodiment of the present disclosure. FIG. 4 is a plan view of an electroluminescent device that includes a light blocking structure of FIG. 2 in accordance with an embodiment of the present disclosure.

Referring to FIGS. 1A to 4, according to embodiments, the electroluminescent device 1 includes an electroluminescent panel 100 that has an image sensor structure 160. The electroluminescent device 1 includes a touch sensing structure 200 located on the electroluminescent panel 100, and a window 300 located on the touch sensing structure 200.

According to embodiments, the electroluminescent panel 100 displays an image. The electroluminescent panel 100 uses current as a driving power supply. The electroluminescent panel 100 may be an organic electroluminescent panel or an inorganic electroluminescent panel. Alternatively, the electroluminescent device 1 may employ a luminous panel that uses voltage as the driving power supply, instead of the electroluminescent panel 100. The luminous panel may be a liquid crystal panel, an electrophoretic panel or an electrowetting panel.

According to embodiments, the electroluminescent panel 100 includes a luminous module 100a, the image sensor structure 160, and a protective layer 170.

According to embodiments, the luminous module 100a includes a transparent layer 110, a light blocking structure 120, a pixel circuit structure 130, an electroluminescent structure 140, and an encapsulation structure 150.

According to embodiments, the transparent layer 110 may include glass, tempered glass, transparent plastics, etc., and may be rigid or flexible. For example, the transparent layer 110 is a substrate. Here, the expression "the transparent layer 110 is the substrate" means that stacking processes are performed on the transparent layer 110 with the transparent layer 110 being at the lowermost position, or that, after stacking processes are performed on the transparent layer 110, a structure located under the transparent layer 110 is detached from the transparent layer 110 so that the transparent layer 110 is located at the lowermost position.

According to embodiments, the pixel circuit structure 130 is located above the transparent layer 110. The pixel circuit structure 130 includes at least one conductive layer and at least one insulation layer. The pixel circuit structure 130 includes a pixel circuit PC that has a circuit element such as a transistor or a capacitor, and wiring connected to the pixel circuit PC, such as a signal line or a power line. The pixel circuit structure 130 further includes peripheral wiring located in the non-display area NDA, a peripheral circuit, etc.

According to embodiments, the electroluminescent structure 140 is disposed on the pixel circuit structure 130. The electroluminescent structure 140 includes the electroluminescent unit ELU, which is connected to the pixel circuit PC of the pixel circuit structure 130 through a contact hole.

According to embodiments, the encapsulation structure 150 is disposed on the electroluminescent structure 140 and covers the display area DA of at least the transparent layer 110. The encapsulation structure 150 includes a first inorganic layer, an organic layer on the first inorganic layer, and a second inorganic layer on the organic layer. Alternatively, the encapsulation structure 150 may be a glass layer.

According to embodiments, the light blocking structure 120 is located between the transparent layer 110 and the pixel circuit structure 130 in at least the sensing area SA. The light blocking structure 120 includes pinholes 120a (hereinafter, also referred as effective pinholes 120a) and a light blocking area 120b. The light blocking area 120b includes a light blocking material that can absorb or reflect light. For example, the light blocking area 120b includes an opaque metal. The pinhole 120a is a through hole. A focus F of the reflected light RL is located in the pinhole 120a.

According to embodiments, the pinholes 120a are the same size. For example, a width of the pinhole 120a is approximately ten times or more the wavelength of incident light so as to prevent diffraction of the light. Alternatively, in other embodiments, the sizes of the pinholes 120a may differ.

According to embodiments, the pinholes 120a are spaced apart from each other at regular intervals. As illustrated in FIG. 4, the pinholes 120a form a grid arrangement. A distance between the pinholes 120a in the light blocking structure 120 is determined based on a distance between the light blocking structure 120 and the image sensor structure 160, the wavelength of the emitted light EL, and the field of view (FOV) required for the pinholes 120a. For example, 3 to 15 pixel circuits PC may be located between two neighboring pinholes 120a to sense the shape of a relatively clear fingerprint. Alternatively, in other embodiments, the distances between the pinholes 120a may not be uniform.

According to embodiments, the planar shape of the pinhole 120a can be any one of a circle, a regular triangle, a square and a regular hexagon. Alternatively, in other embodiments, the pinhole 120a may have plane shapes other than the circle, regular triangle, the square or the regular hexagon. The density of the pinholes 120a is uniform throughout the sensing area SA. Alternatively, in other embodiments, the density of the pinholes 120a is non-uniform, such that it is high in a first area of the sensing area SA and is low in a second area different from the first area.

According to embodiments, the light blocking structure 120 selectively transmits the reflected light RL reflected by a user's fingerprint that touches the first surface 1a of the electroluminescent device 1. Some of the reflected light RL incident on the light blocking structure 120 is blocked by the light blocking area 120b, while the remaining reflected light RL passes through the pinholes 120a to reach the image sensor structure 160 located under the light blocking structure 120.

According to embodiments, in a plan view, the light blocking structure 120 has an area that is greater than or equal to the sensing area SA such that an outline of the sensing area SA does not extend out from an outline of the light blocking structure 120. As one example, when the sensing area SA is the whole of the display area DA, the light blocking structure 120 has an area that is greater than or equal to the area of the display area DA. As another example, when the sensing area SA is a part of the display area DA, the light blocking structure 120 has an area that is equal to or greater than the sensing area SA and is equal to or less than the display area DA, or has the same area as the sensing area SA.

According to embodiments, the image sensor structure 160 is located under the transparent layer 110 and overlaps at least one area of the luminous module 100a. For example, the image sensor structure 160 is attached to a lower portion of the transparent layer 110. The image sensor structure 160 overlaps at least sensing area SA. The image sensor structure 160 includes image sensors 160a that are separated by a predetermined distance to have a predetermined density.

According to embodiments, the image sensor 160a receives reflected light RL passing through the pinhole 120a and generates image data that corresponds to the reflected light RL. The image data includes information related to valleys and ridges of the user's fingerprint, and the information is converted into a preliminary image. An inverted image is obtained by inverting the preliminary image with respect to an optical center of the preliminary image. A single fingerprint image is obtained by joining the inverted images obtained from the image sensors 160a together in plan view. Here, the optical center of the preliminary image is a point where the preliminary image intersects a vertical line that passes through a focus F.

According to embodiments, the protective layer 170 is located under the image sensor structure 160. The protective layer 170 is attached to a lower surface of the image sensor structure 160 via an adhesive layer.

According to embodiments, a touch sensing structure 200 and a window 300 are located above the electroluminescent panel 100.

According to embodiments, the touch sensing structure 200 is located on an upper surface of the electroluminescent panel 100 and senses the touch of a user's finger.

According to embodiments, the window 300 is located on the touch sensing structure 200. The window 300 protects the electroluminescent panel 100 from external shocks. The window 300 may be flexible. In this case, the window 300 contains a colorless transparent plastic material or the window 300 is a transparent glass layer having a thickness of from about 25 μm to 150 μm. Alternatively, the window 300 may be rigid. In this case, the window 300 is a transparent glass layer having a thickness that is greater than 150 μm.

According to embodiments, security disabling through fingerprint recognition includes at least first to seventh steps.

First, according to embodiments, when it is determined by the touch sensing structure 200 that a user's finger has come into contact with the window 300, a first step is performed to determine whether or not to recognize the fingerprint.

As one example, if the contact continues for a predetermined period, such as contact of 0.5 seconds or more, it can be determined that the contact is for recognizing the fingerprint. As another example, if the contact area is at least two or more fingers, such as a double touch by two fingers, it can be determined that the contact is for recognizing the fingerprint.

According to embodiments, when it is determined that the contact is for recognizing the fingerprint at the first step, a second step is performed to turn on at least one electroluminescent unit ELU that corresponds to the contact area and to emit light to the user's finger.

As one example, a plurality of electroluminescent units ELU in the contact area is turned on to form a surface light source. To be more specific, at least some of the electroluminescent units ELU located in the contact area simultaneously emit light.

As another example, a plurality of electroluminescent units ELU in the contact area is turned on to form a line light source. As one example, at least some of the electroluminescent units ELU located in the contact area sequentially emit light in a scan manner. In this case, linear beams are emitted to form straight or curved lines. In one example, the linear beam scans the contact area from one side of the contact area to the other side of the contact area. In another example, the linear beam scans the contact area from a center of the contact area towards an edge thereof. In yet another example, the linear beam may scan the contact area from the edge of the contact area towards the center thereof.

As another example, only those electroluminescent units ELU in the contact area emit light of a specific color, such as a blue color having a short wavelength.

According to embodiments, a third step is for at least one image sensor 160a to receive the reflected light RL from the user's finger. At the third step, the reflected light RL passes through the pinholes 120a and is incident on the image sensors 160a.

Subsequently, according to embodiments, a fourth step is performed to obtain the preliminary image from the image data obtained from the image sensor 160a. To be more specific, the image sensor 160a receives the reflected light RL passing through the pinhole 120a and generates image data corresponding to the reflected light RL. The image data has information related to valleys and ridges of the fingerprint of a user's finger, and is converted into the preliminary image.

Next, a fifth step is performed to obtain the inverted image from the preliminary image. To be more specific, the inverted image is obtained by inverting the preliminary image with respect to the optical center of the preliminary image.

Subsequently, according to embodiments, a sixth step is performed to obtain a single comparison fingerprint image by joining the inverted images obtained from the image sensors 160a together in plan view.

Next, according to embodiments, a seventh step is performed to compare a previously stored reference fingerprint image with the comparison fingerprint image and thereby determine whether they match each other. When the reference fingerprint image is the same as the comparison fingerprint image, i.e., the reference fingerprint image matches with the comparison fingerprint image, security can be disabled. In contrast, if the reference fingerprint image differs from the comparison fingerprint image, i.e., does not match the comparison fingerprint image, security is not disabled.

According to embodiments, the electroluminescent device 1 enhances the touch input of the touch sensing structure 200 through the image sensing of the image sensors 160a. As one example, it is possible to obtain more accurate contact information, such as a position of the contact area, by simultaneously using a first sensing signal sensed in the contact area through the touch sensing structure 200 and a second sensing signal sensed from the image sensors 160a. Alternatively, if the image sensors 160a have a relatively high sensitivity, it is possible to obtain contact information such as a location of the contact area without the touch sensing structure 200. Furthermore, if the image sensors 160a have a relatively high sensitivity, the image sensors 160a can be used as a camera that photographs an object distant from the electroluminescent device 1.

FIGS. 5A to 5D are plan views of an arrangement of pixel circuits, pinholes and image sensors in accordance with an embodiment of the present disclosure. To be more specific, FIGS. 5A to 5D are plan views that illustrate the relative size, resolution and/or arrangement of the pixel circuits PC, the pinholes 120a, and the image sensors 160a, located in the sensing area SA of the display area DA shown in FIGS. 1A and 1B.

Figure 5A:
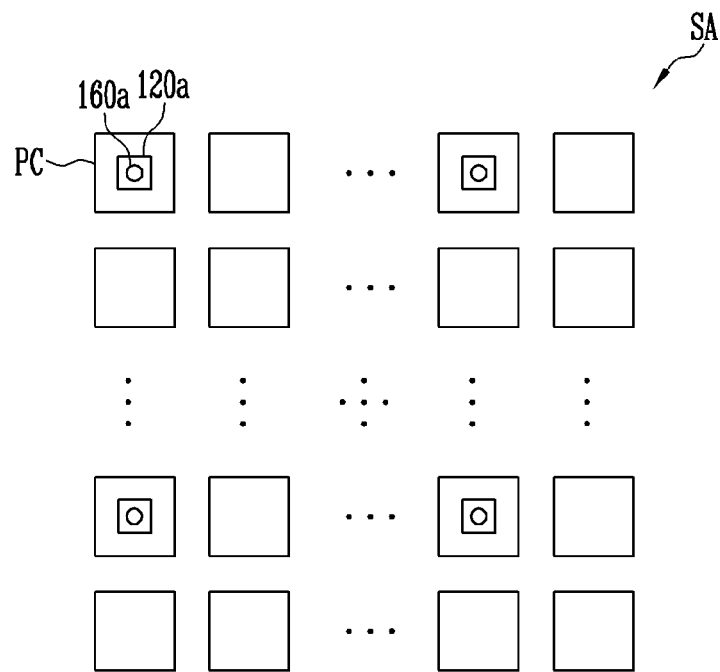
FIGS. 5A to 5D are plan views of an arrangement of pixel circuits, pinholes and image sensors in accordance with an embodiment of the present disclosure.

Referring to FIG. 5A, according to embodiments, the sensing area SA includes the pinholes 120a, of which there are fewer than there are pixel circuits PC, and the image sensors 160a, of which there are fewer than there are pixel circuits PC. For example, the pinholes 120a and the image sensors 160a are smaller in size than the pixel circuits PC, and have a distribution density in the sensing area SA that is less than that of the pixel circuits PC. Alternatively, the density of the pinholes 120a and the image sensors 160a is not less than that of the pixel circuits PC.

According to embodiments, the number and spacing of pinholes 120a distributed in the sensing area SA is the same as those of the image sensors 160a distributed in the sensing area SA such that there is a one-to-one correspondence between the pinholes 120a and the image sensors 160a. In this case, the pinholes 120a and the image sensors 160a overlap each other.

According to embodiments, the pinholes 120a and the image sensors 160a have the same size. As one alternative, the pinhole 120a is larger than the image sensor 160a. As another alternative, the pinhole 120a is smaller than the image sensor 160a.

Figure 5B:
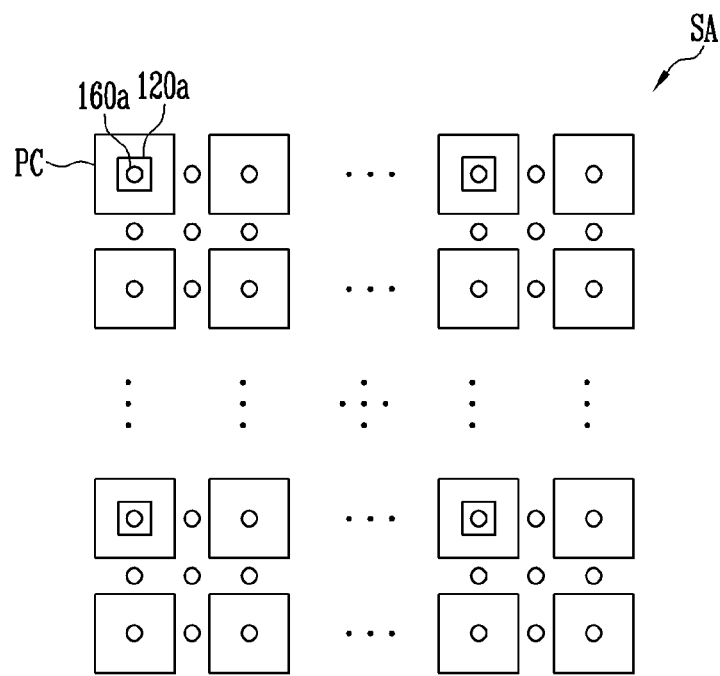

Referring to FIG. 5B, according to embodiments, the sensing area SA has fewer pinholes 120a than pixel circuits PC, but more image sensors 160a than pixel circuits PC. The pinholes 120a and the image sensors 160a are smaller in size than the pixel circuits PC. The pinholes 120a have a lower distribution density in the sensing area SA than the pixel circuits PC, and the image sensors 160a are compactly distributed in the sensing area SA with a higher density than pixel circuits PC.

According to embodiments, some of the image sensors 160a overlap the pinhole 120a and/or the pixel circuit PC. Alternatively, some of the image sensors 160a overlap the pinhole 120a and/or the pixel circuit PC, while other image sensors 160a are located in gaps between the pixel circuits PC.

Figure 5C:
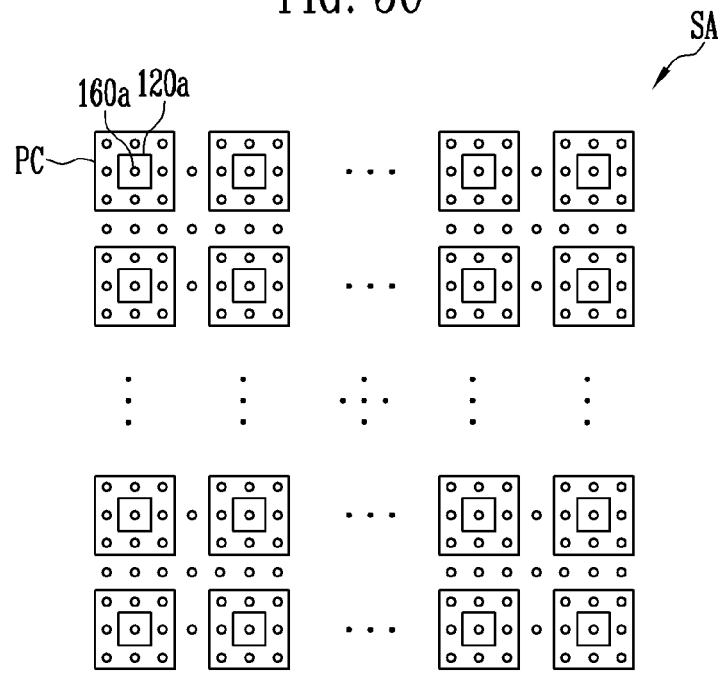
Figure 5D:
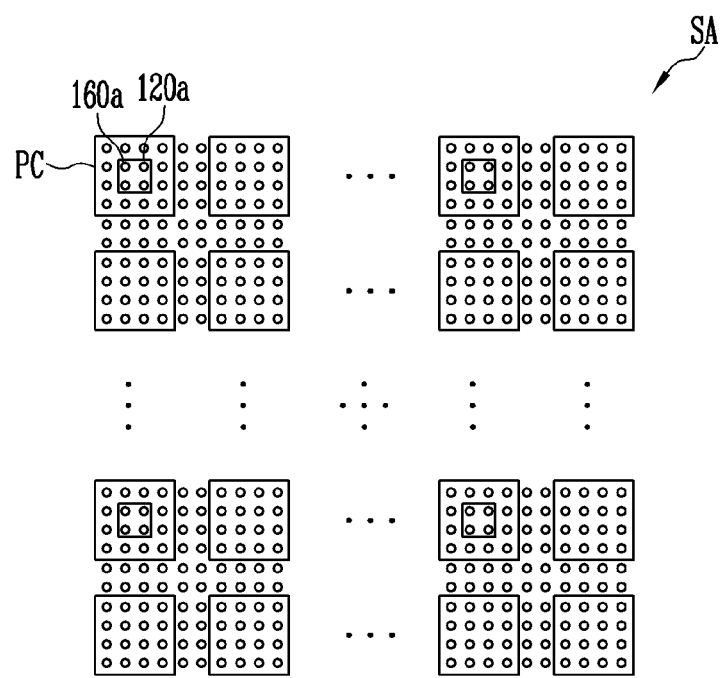

Referring to FIGS. 5C and 5D, according to embodiments, the image sensors 160a distributed in the sensing area SA have smaller sizes and higher density than the image sensors 160a illustrated in FIG. 5B. For example, the image sensors 160a in the sensing area SA are separated by intervals that are about 1/10 to 1/100 times smaller than the spacing of the pinholes 120a. In this case, the image sensors 160a may be compactly distributed in the sensing area SA so that there is no longer a one-to-one correspondence between the image sensors 160a and the pixel circuits PC and/or the pinholes 120a. Therefore, a moiré phenomenon can be prevented or minimized regardless of arrangement of the image sensors 160a with respect to the pixel circuits PC and/or the pinholes 120a.

According to embodiments, the pinholes 120a have a distribution density in the sensing area SA that is equal to or different from that of the pixel circuits PC. As one example, as illustrated in FIG. 5C, the pinholes 120a have a distribution density in the sensing area SA that is the same as that of the pixel circuits PC. As another example, as illustrated in FIG. 5D, the pinholes 120a have a distribution density in the sensing area SA that is lower than that of the pixel circuits PC.

As illustrated in FIGS. 5A to 5D, according to embodiments, the pinholes 120a and the image sensors 160a are regularly arranged in the sensing area SA. Alternatively, in other embodiments, the pinholes 120a and/or the image sensors 160a can be irregularly distributed within the sensing area SA, or may have different densities in different areas of the sensing area SA.

Figure 6:
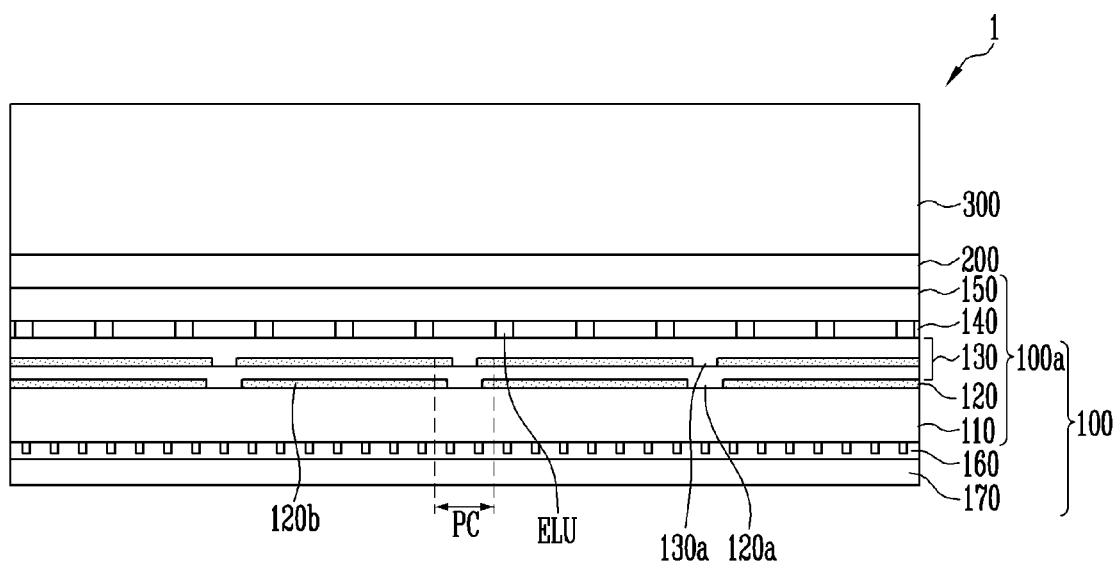
FIG. 6 is a sectional view of an electroluminescent device illustrated in FIG. 1A or FIG. 1B in accordance with an embodiment of the present disclosure.

FIG. 6 is a sectional view of an electroluminescent device illustrated in FIG. 1A or FIG. 1B in accordance with an embodiment of the present disclosure. The description of components that are the same as or similar to those of the electroluminescent device described in FIG. 2 will be omitted herein.

Referring to FIG. 6, according to embodiments, the pixel circuit structure 130 is used as a first light blocking structure 130 to selectively block or transmit reflected light RL reflected by a user's fingerprint. The first light blocking structure 130 includes pinholes 130a (hereinafter, also referred as effective pinholes 130a).

According to embodiments, a second light blocking structure 120 is located between the first light blocking structure 130 and the transparent layer 110. The first light blocking structure 130 has a plurality of pinholes 130a. The pinholes 130a of the first light blocking structure 130 overlap the pinholes 120a of the second light blocking structure 120.

According to embodiments, the pinholes 130a of the first light blocking structure 130 have the same size as the pinholes 120a of the second light blocking structure 120. Alternatively, in other embodiments, the pinholes 130a of the first light blocking structure 130 differ in size from the pinholes 120a of the second light blocking structure 120.

As one example, as illustrated in FIG. 6, the pinholes 130a of the first light blocking structure 130 have a smaller width than the pinholes 120a of the second light blocking structure 120. To be more specific, the pinholes 130a of the first light blocking structure 130 and the pinholes 120a of the second light blocking structure 120 respectively have first and second widths in a range of 5 μm to 20 μm, where the second width is larger than the first width. In this case, a focus F is located at the pinhole 130a of the first light blocking structure 130.

As another example, the pinholes 130a of the first light blocking structure 130 have a larger width than the pinholes 120a of the second light blocking structure 120. To be more specific, the pinholes 130a of the first light blocking structure 130 and the pinholes 120a of the second light blocking structure 120 respectively have first and second widths in a range of 5 μm to 20 μm, where the second width is smaller than the first width. In this case, the focus F is located at the pinhole 120a of the second light blocking structure 120.

Figure 7:
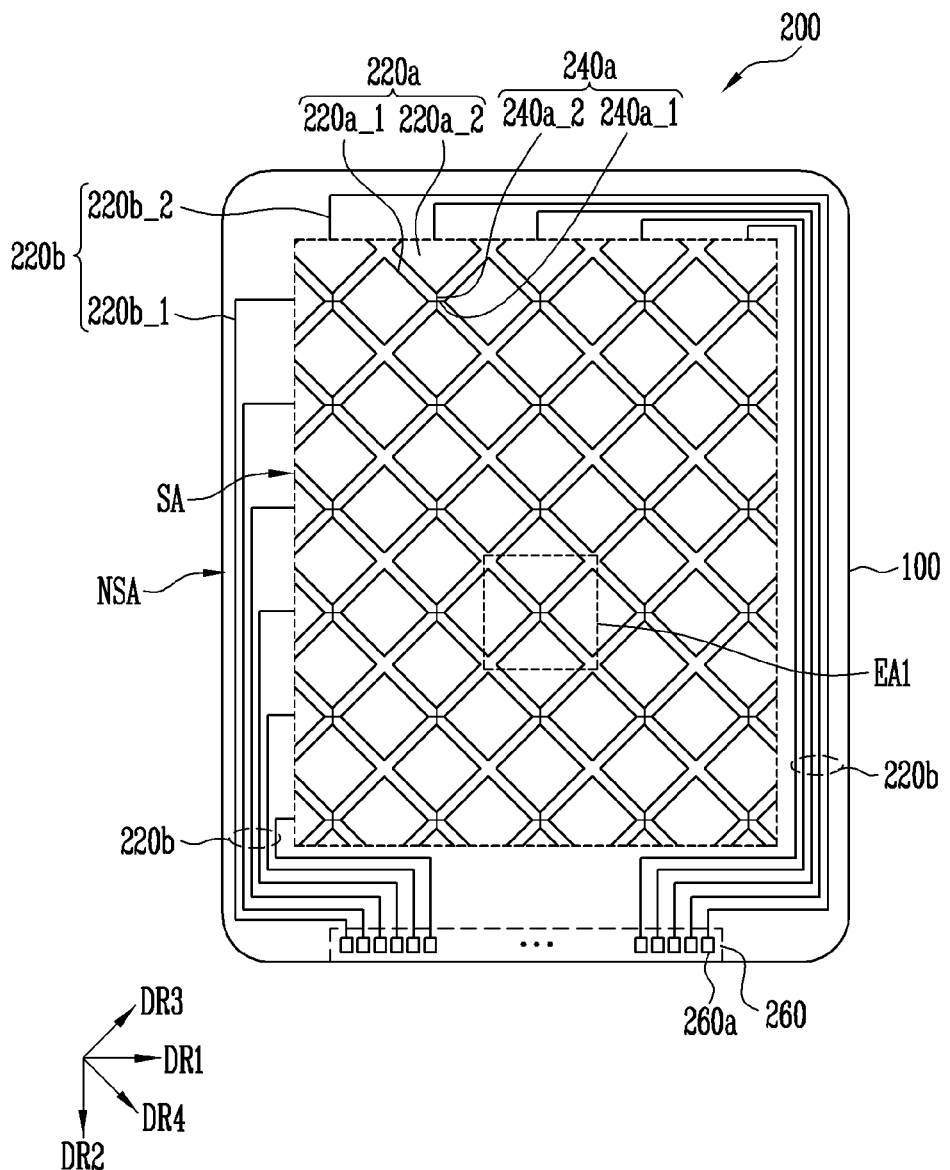
FIG. 7 is a plan view of a touch sensing structure illustrated in FIG. 2.
Figure 8A:
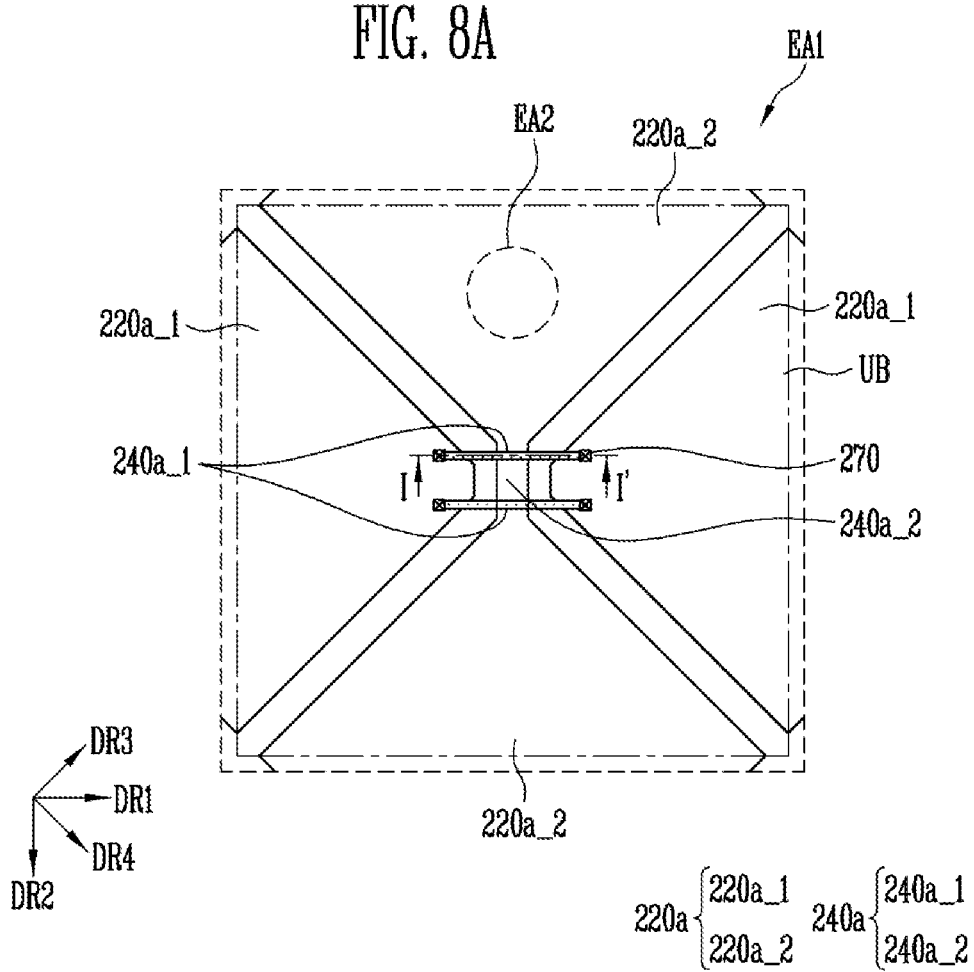
FIG. 8A is an enlarged plan view of portion EA1 of FIG. 7.
Figure 8B:
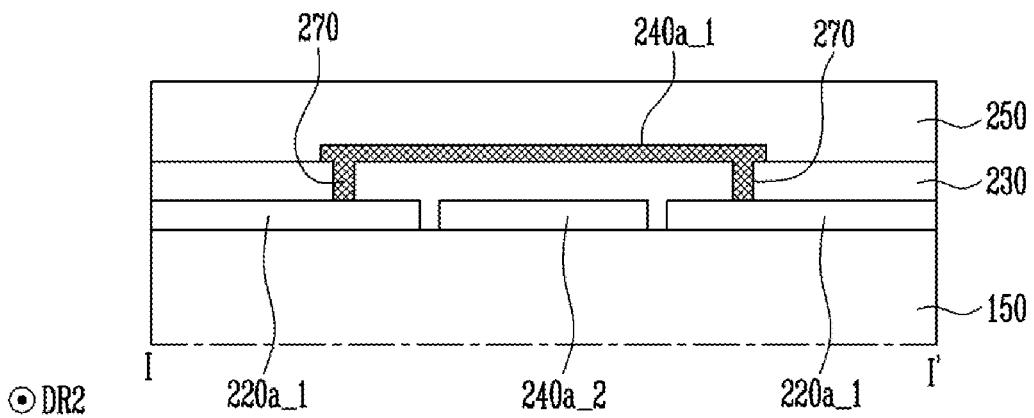
FIG. 8B is a sectional view taken along line I-I' of FIG. 8A in accordance with an embodiment of the present disclosure.
Figure 8C:
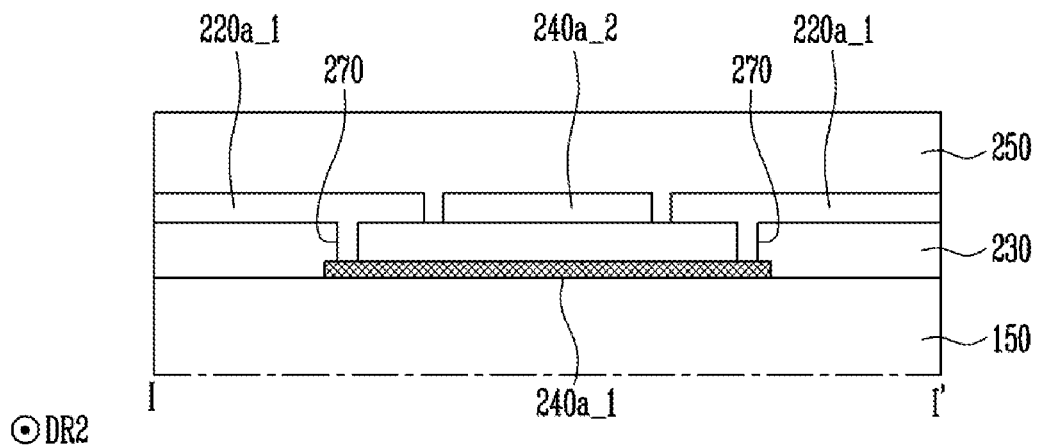
FIG. 8C is a sectional view taken along line I-I' of FIG. 8A in accordance with an embodiment of the present disclosure.
Figure 8D:
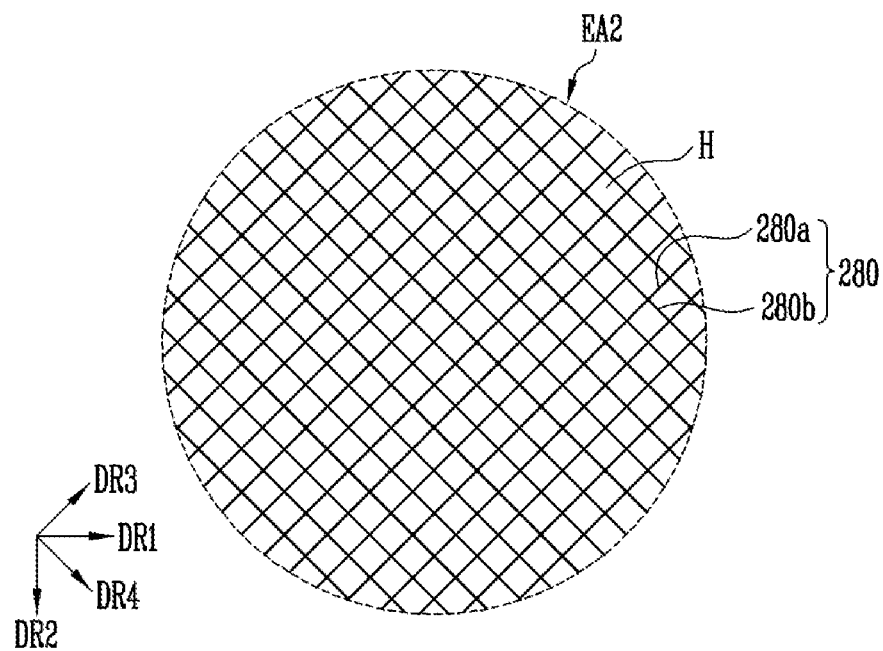
FIG. 8D is an enlarged plan view of portion EA2 of FIG. 8A.

FIG. 7 is a plan view of a touch sensing structure illustrated in FIG. 2, FIG. 8A is an enlarged plan view of portion EA1 of FIG. 7. FIG. 8B is a sectional view taken along line I-I' of FIG. 8A in accordance with an embodiment of the present disclosure. FIG. 8C is a sectional view taken along line I-I' of FIG. 8A in accordance with an embodiment of the present disclosure. FIG. 8D is an enlarged plan view of portion EA2 of FIG. 8A.

Referring to FIGS. 1A to 8D, according to embodiments, the touch sensing structure 200 is located above the electroluminescent panel 100. In addition, an intermediate insulation layer may be located between the encapsulation structure 150 and the touch sensing structure 200.

According to embodiments, the touch sensing structure 200 includes the sensing area SA and the non-sensing area NSA that surrounds at least a part of the sensing area SA. The sensing area SA of the touch sensing structure 200 overlaps the display area DA of the electroluminescent panel 100.

According to embodiments, the touch sensing structure 200 includes a sensing electrode 220a that includes a first sensing electrode 220a_1 and a second sensing electrode 220a_2, and a bridge 240a that includes a first bridge 240a_1 and a second bridge 240a_2. The sensing electrode 220a and the bridge 240a are located in the sensing area SA of the touch sensing structure 200. The first sensing electrode 220a_1 and the first bridge 240a_1 are alternately connected in a first direction DR1, and the second sensing electrode 220a_2 and the second bridge 240a_2 are alternately connected in a second direction DR2. The first bridge 240a_1 and the second bridge 240a_2 intersect in plan view. The touch sensing structure 200 further includes a first insulation layer 230 and a second insulation layer 250 whose configurations will be described below with reference to FIGS. 8B and 8C.

According to embodiments, the first bridge 240a_1 extends in the first direction DR1 and connects two neighboring first sensing electrodes 220a_1 to each other. Alternatively, the first bridge 240a_1 extends in a third direction DR3 and connects two neighboring first sensing electrodes 220a_1 in the first direction DR1 to each other. Furthermore, the first bridge 240a_1 extends in a fourth direction DR4 and connects two neighboring first sensing electrodes 220a_1 in the first direction DR1 to each other. Furthermore, a first portion of the first bridge 240a_1 extends in the third direction DR3 and a second portion connected to the first portion extends in the fourth direction DR4 and connect two neighboring first sensing electrodes 220a_1 in the first direction DR1 to each other.

According to embodiments, the second bridge 240a_2 extends in the second direction DR2 and connects two neighboring second sensing electrodes 220a_2 in the second direction DR2 to each other. Alternatively, the second bridge 240a_2 extends in the third direction DR3 and connects two neighboring second sensing electrodes 220a_2 in the second direction DR2 to each other. Alternatively, the second bridge 240a_2 extends in the fourth direction DR4 and connects two neighboring second sensing electrodes 220a_2 in the second direction DR2 to each other. Furthermore, a first portion of the second bridge 240a_2 extends in the third direction DR3 and a second portion connected to the first portion extends in the fourth direction DR4 and connect two neighboring second sensing electrodes 220a_2 in the second direction DR2 to each other.

The first bridge 240a_1 and the first sensing electrode 220a_1 are located at different layers. Alternatively, the first bridge 240a_1 is integrated with the first sensing electrode 220a_1. The second bridge 240a_2 is integrated with the second sensing electrode 220a_2. Alternatively, the second bridge 240a_2 and the second sensing electrode 220a_2 are located at different layers.

According to embodiments, the non-sensing area NSA of the touch sensing structure 200 overlaps the non-display area NDA of the electroluminescent panel 100. A pad area 260 that includes pads 260a and a peripheral wiring 220b that connects the sensing electrodes 220a and the pads 260a are located in the non-sensing area NSA of the touch sensing structure 200.

As illustrated in FIG. 7, according to embodiments, the peripheral wiring 220b includes first peripheral wiring 220b_1 connected to the first sensing electrode 220a_1 and second peripheral wiring 220b_2 connected to the second sensing electrode 220a_2.

As illustrated in FIG. 8D, according to embodiments, the first sensing electrode 220a_1 includes a conductive fine line 280 and holes H. The conductive fine line 280 includes a first conductive fine line 280a and a second conductive fine line 280b.

As one example, the first sensing electrode 220a_1 includes the first conductive fine line 280a extending parallel to the third direction DR3, and the second conductive fine line 280b extending parallel to the fourth direction DR4. The first conductive fine line 280a and the second conductive fine line 280b are integrated with each other. Since the first sensing electrode 220a_1 includes the first conductive fine line 280a and the second conductive fine line 280b, the first sensing electrode 220a_1 has a mesh structure with holes H formed by the crossings of the first conductive fine lines 280a and the second conductive fine lines 280b.

Figure 9A:
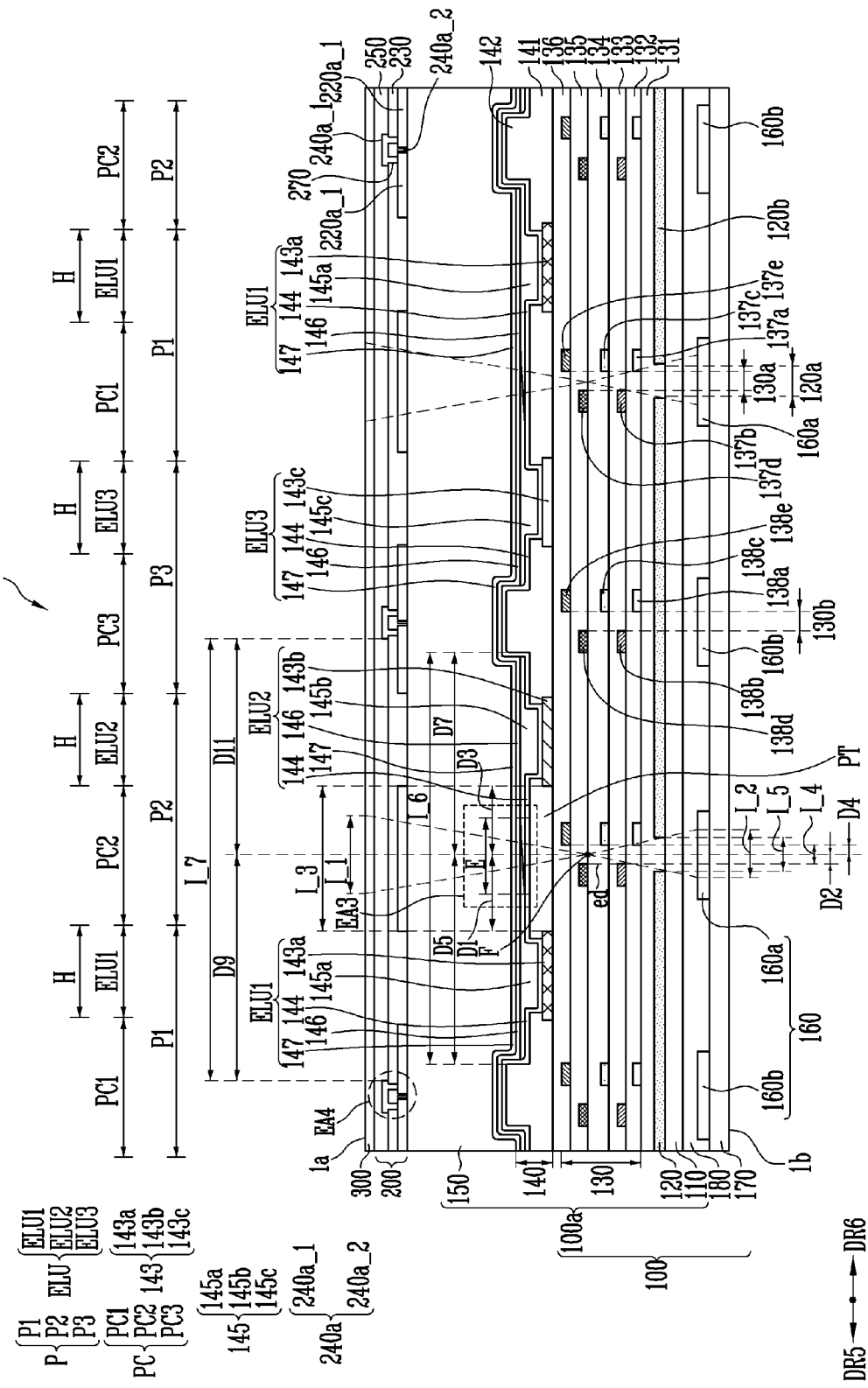
FIG. 9A is a sectional view of an electroluminescent device shown in FIG. 6 in accordance with an embodiment of the present disclosure.

According to embodiments, an area where all of a lower electrode, such as 143 of FIG. 9A, a luminous layer, such as 145 of FIG. 9A, and an upper electrode, such as 147 of FIG. 9A, overlap each other without the intervention of the insulation layer to substantially emit light is defined as a luminous area. The hole H of the first sensing electrode 220a_1 overlaps the luminous area. Thus, even if the first sensing electrode 220a_1 includes a flexible opaque metal, it does not block light emitted from the luminous area. At least one of the second sensing electrode 220a_2, the first bridge 240a_1 and/or the second bridge 240a_2 has a mesh structure with holes H while including a flexible opaque metal, like the first sensing electrode 220a_1.

As illustrated in FIG. 8B, according to embodiments, the first sensing electrode 220a_1, the second sensing electrode 220a_2 and the second bridge 240a_2 are disposed on the encapsulation structure 150. The second sensing electrode 220a_2 is connected to the second bridge 240a_2 in the second direction DR2. The second sensing electrode 220a_2 is integrated with the second bridge 240a_2.

According to embodiments, the first insulation layer 230 that covers the first sensing electrode 220a_1, the second sensing electrode 220a_2 and the second bridge 240a_2 is disposed on the encapsulation structure 150. The first insulation layer 230 includes contact holes 270 that expose the first sensing electrode 220a_1.

According to embodiments, the first bridge 240a_1 is disposed on the first insulation layer 230 and fills the contact hole 270. The first bridge 240a_1 is connected to neighboring first sensing electrodes 220a_1. The second insulation layer 250 is disposed to cover the first bridge 240a_1 on the first insulation layer 230.

According to embodiments, the touch sensing structure 200 illustrated in FIG. 8B can be formed by directly performing deposition processes and etching processes on the encapsulation structure 150.

To be more specific, according to embodiments, a first metal layer is formed by performing a sputtering process on the encapsulation structure 150. Thereafter, the first sensing electrode 220a_1, the second sensing electrode 220a_2 and the second bridge 240a_2 are formed by performing an etching process on the first metal layer.

Subsequently, according to embodiments, a preliminary insulation layer that covers the first sensing electrode 220a_1, the second sensing electrode 220a_2 and the second bridge 240a_2 is formed through a chemical vapor deposition (CVD) process. Thereafter, the first insulation layer 230 with contact holes 270 that expose the first sensing electrode 220a_1 is formed by performing an etching process on the preliminary insulation layer. A second metal layer is formed by performing a sputtering process on the first insulation layer 230. Subsequently, the first bridge 240a_1 connected to the first sensing electrode 220a_1 and filling the contact hole 270 is formed by performing an etching process on the second metal layer.

Alternatively, according to other embodiments, as illustrated in FIG. 8C, the first bridge 240a_1 is placed on the encapsulation structure 150. For example, the first bridge 240a_1 is placed directly on the encapsulation structure 150. According to embodiments, the first insulation layer 230 that covers the first bridge 240a_1 is disposed on the encapsulation structure 150. The first insulation layer 230 includes contact holes 270 that expose the first bridge 240a_1.

According to embodiments, the first sensing electrode 220a_1 and the second bridge 240a_2 are disposed on the first insulation layer 230. The first sensing electrode 220a_1 fills the contact hole 270. The second bridge 240a_2 is disposed between neighboring first sensing electrodes 220a_1. The second insulation layer 250 is disposed on the first insulation layer 230 and covers the first sensing electrode 220a_1 and the second bridge 240a_2.

According to embodiments, the touch sensing structure 200 illustrated in FIG. 8C can be formed by performing deposition processes and etching processes directly on the encapsulation structure 150.

To be more specific, according to embodiments, a first metal layer is formed by performing a sputtering process directly on the encapsulation structure 150. Thereafter, the first bridge 240a_1 is formed by performing an etching process on the first metal layer.

Subsequently, according to embodiments, a preliminary insulation layer that covers the first bridge 240a_1 is formed by a CVD process. Thereafter, the first insulation layer 230 with contact holes 270 that expose the first bridge 240a_1 is formed by performing an etching process on the preliminary insulation layer. A second metal layer is formed by performing a sputtering process on the first insulation layer 230. Subsequently, the first sensing electrode 220a_1, the second sensing electrode 220a_2, and the second bridge 240a_2 are formed on the first insulation layer 230 by performing an etching process on the second metal layer. The second sensing electrode 220a_2 is connected to the second bridge 240a_2 in the second direction DR2. The second sensing electrode 220a_2 is integrated with the second bridge 240a_2.

According to embodiments, the first sensing electrode 220a_1 is connected to the first bridge 240a_1 by filling the contact hole 270.

As illustrated in FIG. 8A, according to embodiments, the touch sensing structure 200 includes a repeated arrangement of unit blocks UB, where each unit block UB includes portions of neighboring first sensing electrodes 220a_1 that are adjacent in the first direction DR1, the first bridges 240a_1 that connect the neighboring first sensing electrodes 220a_1, portions of neighboring second sensing electrodes 220a_2 that are adjacent in the second direction DR2, and the second bridges 240a_2 that connect the neighboring second sensing electrodes 220a_2.

Figure 9B:
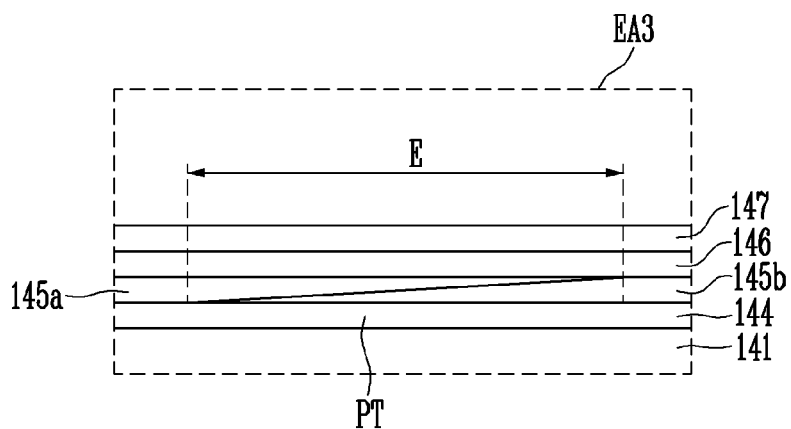
FIG. 9B is an enlarged sectional view of portion EA3 of FIG. 9A.
Figure 9C:
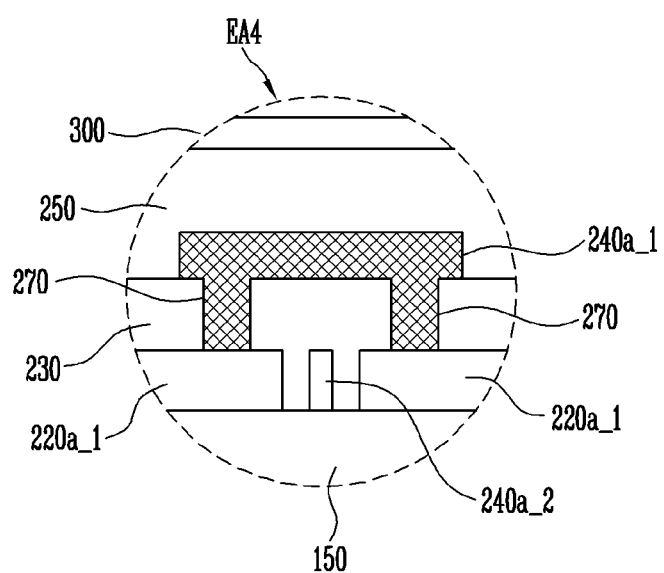
FIG. 9C is an enlarged sectional view of portion EA4 of FIG. 9A.

FIG. 9A is a sectional view of an electroluminescent device shown in FIG. 6 in accordance with an embodiment of the present disclosure. To be more specific, FIG. 9A illustrates five pixels located in the sensing area of the electroluminescent device illustrated in FIGS. 1A and 1B. FIG. 9B is an enlarged sectional view of portion EA3 of FIG. 9A. FIG. 9C is an enlarged sectional view of portion EA4 of FIG. 9A.

Referring to FIG. 1A to FIGS. 9A and 9B, according to embodiments, the electroluminescent device 1 includes the electroluminescent panel 100, the touch sensing structure 200, and the window 300.

According to embodiments, the electroluminescent panel 100 includes the luminous module 100a, the image sensor structure 160, and the protective layer 170. The luminous module 100a includes the transparent layer 110, the second light blocking structure 120, the insulation layer 131, the first light blocking structure 130, the electroluminescent structure 140, and the encapsulation structure 150.

Referring to FIG. 9C, according to embodiments, the touch sensing structure 200 has a structure described in FIG. 8B. Alternatively, according to other embodiments, the touch sensing structure 200 has a structure described in FIG. 8C.

Figure 15:
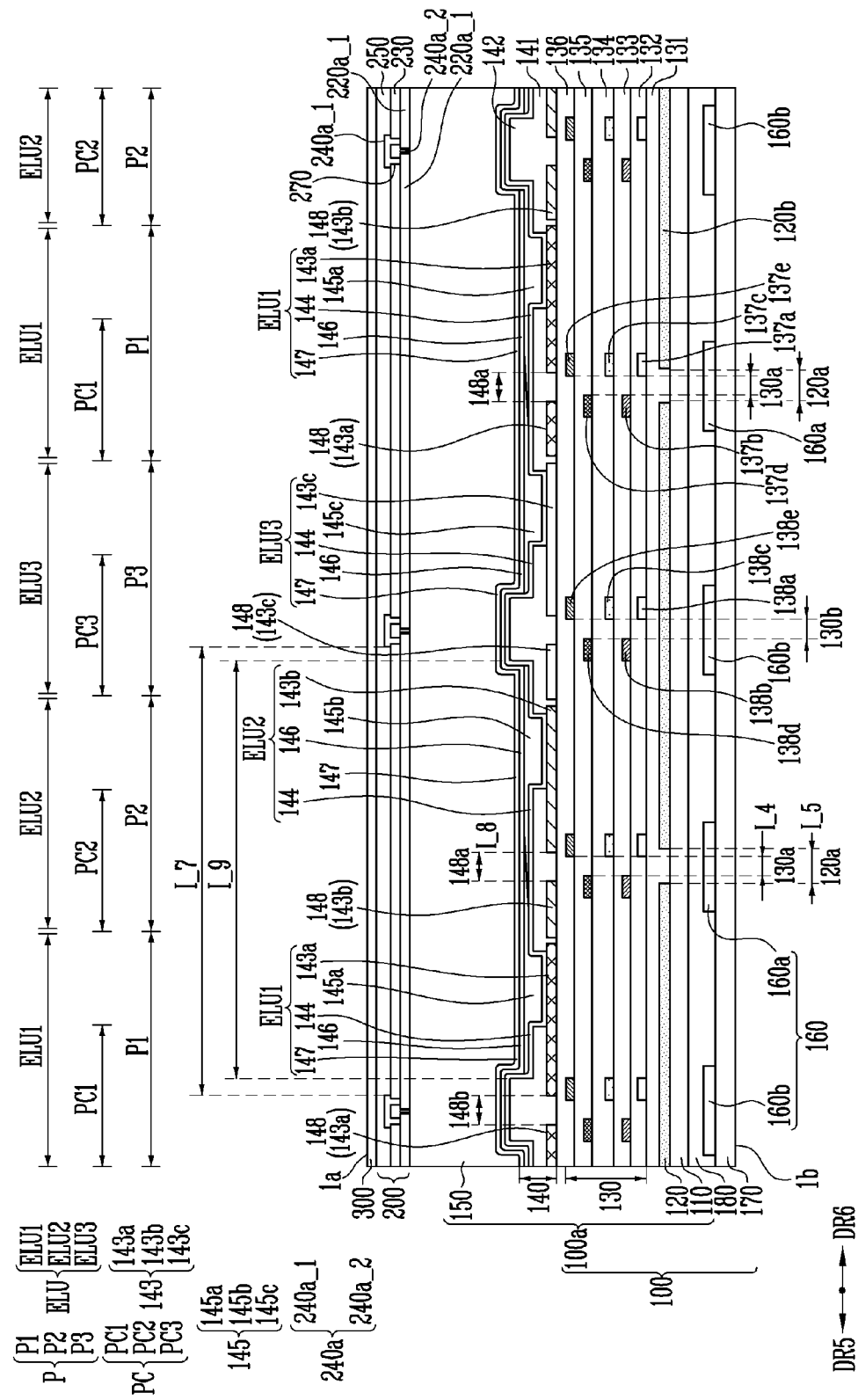
FIG. 15 is a sectional view of an electroluminescent device shown in FIG. 6 in accordance with an embodiment of the present disclosure.
Figure 16:
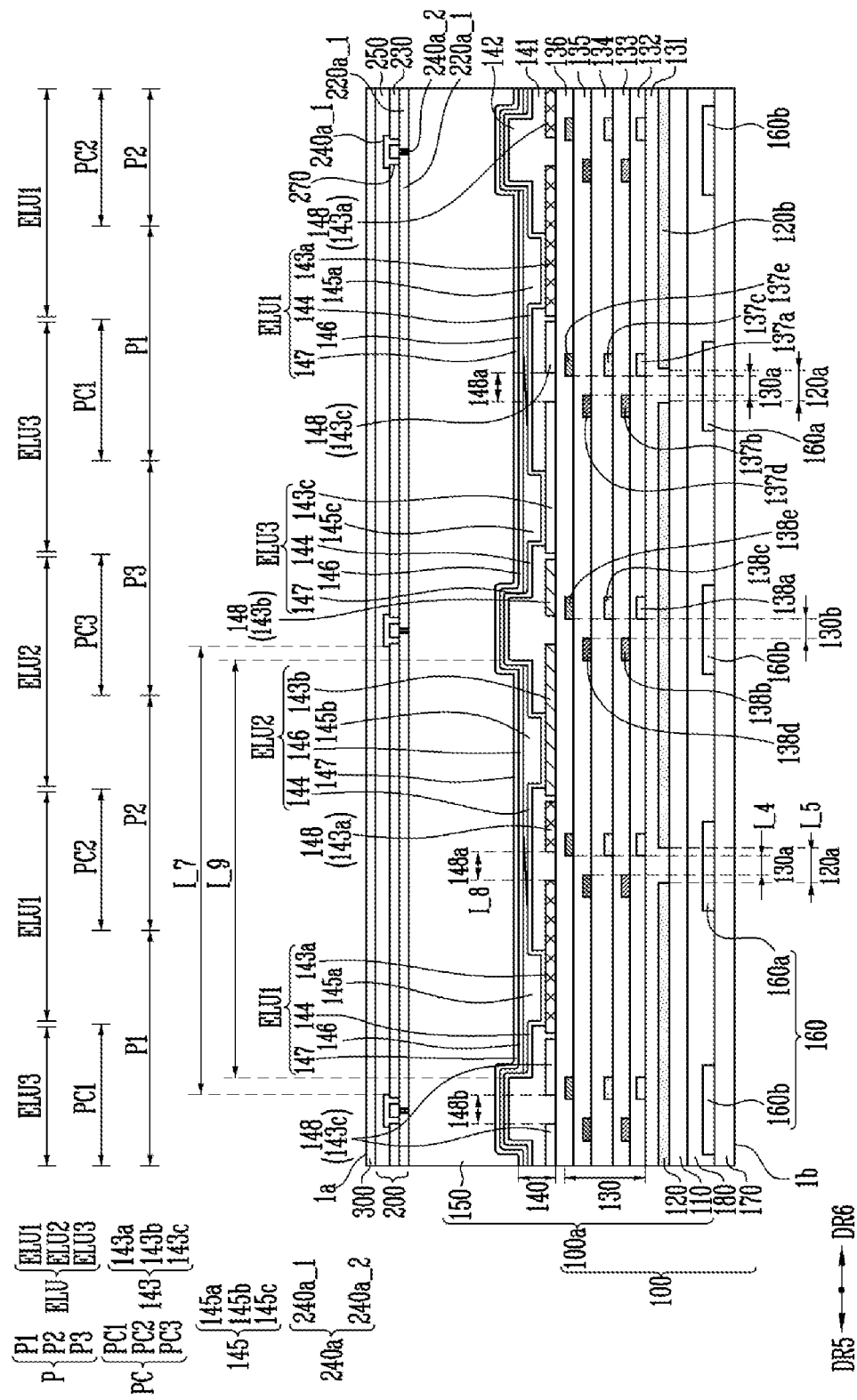
FIG. 16 is a sectional view of an electroluminescent device shown in FIG. 6 in accordance with an embodiment of the present disclosure.

According to embodiments, the luminous module 100a includes a pixel P. The pixel P includes the pixel circuit PC and the electroluminescent unit ELU electrically connected to the pixel circuit PC. As illustrated in FIG. 9A, the pixel circuit PC and the electroluminescent unit ELU do not overlap each other. Alternatively, according to other embodiments, as illustrated in FIGS. 15 and 16, at least a portion of the pixel circuit PC overlaps at least a portion of the electroluminescent unit ELU.

Turning back to FIG. 9A, according to embodiments, the pixel P includes a first pixel P1, a second pixel P2, and a third pixel P3. The pixel circuit PC includes a first pixel circuit PC1, a second pixel circuit PC2, and a third pixel circuit PC3.

According to embodiments, the electroluminescent unit ELU includes the lower electrode 143, the luminous layer 145 disposed on the lower electrode 143, and the upper electrode 147 disposed on the luminous layer 145. The lower electrode 143 includes a first lower electrode 143a, a second lower electrode 143b, and a third lower electrode 143c. The luminous layer 145 includes a first luminous layer 145a, a second luminous layer 145b, and a third luminous layer 145c. The electroluminescent unit ELU can be defined in an area where the lower electrode 143 and the upper electrode 147 overlap each other. The electroluminescent unit ELU includes a first electroluminescent unit ELU1, a second electroluminescent unit ELU2, and a third electroluminescent unit ELU3.

To be more specific, according to embodiments, the first electroluminescent unit ELU1 includes a first lower electrode 143a, a first luminous layer 145a disposed on the first lower electrode 143a, and the upper electrode 147 disposed on the first luminous layer 145a. The second electroluminescent unit ELU2 includes a second lower electrode 143b, a second luminous layer 145b disposed on the second lower electrode 143b, and the upper electrode 147 disposed on the second luminous layer 145b. The third electroluminescent unit ELU3 includes a third lower electrode 143c, a third luminous layer 145c disposed on the third lower electrode 143c, and the upper electrode 147 disposed on the third luminous layer 145c.

As illustrated in FIG. 9A, according to embodiments, the first electroluminescent unit ELU1 and the first pixel circuit PC1 do not overlap each other. Alternatively, in other embodiments, the first electroluminescent unit ELU1 overlaps the first pixel circuit PC1.

As illustrated in FIG. 9A, according to embodiments, the second electroluminescent unit ELU2 and the second pixel circuit PC2 do not overlap each other. Alternatively, in other embodiments, the second electroluminescent unit ELU2 overlaps the second pixel circuit PC2.

As illustrated in FIG. 9A, according to embodiments, the third electroluminescent unit ELU3 and the third pixel circuit PC3 do not overlap each other. Alternatively, in other embodiments, the third electroluminescent unit ELU3 overlaps the third pixel circuit PC3.

According to embodiments, the second light blocking structure 120 includes effective pinholes 120a and a light blocking area 120b. The second light blocking structure 120 selectively transmits the reflected light RL reflected by an object such as a user's finger on the first surface 1a of the electroluminescent device 1. Some of the reflected light RL incident on the second light blocking structure 120 is blocked by the light blocking area 120b, while at least a part of the remaining reflected light RL passes through the effective pinholes 120a to reach the image sensor structure 160 located under the second light blocking structure 120.

According to embodiments, the image sensor structure 160 includes effective image sensors 160a and dummy image sensors 160b, which are distributed at regular intervals to have a predetermined density. The effective image sensors 160a are used to sense an image on the first surface 1a, while the dummy image sensors 160b are not used to sense the image on the first surface 1a.

According to embodiments, the effective image sensor 160a has the same structure as the dummy image sensor 160b. As one example, an upper surface of the effective image sensor 160a senses an image, and an upper surface of the dummy image sensor 160b can likewise sense an image. As another example, upper and lower surfaces of the effective image sensor 160a can sense an image, and upper and lower surfaces of the dummy image sensor 160b can likewise sense an image.

Alternatively, in other embodiments, the effective image sensor 160a has a structure that differs from that of the dummy image sensor 160b. As one example, only the upper surface of the effective image sensor 160a can sense an image, while only the lower surface of the dummy image sensor 160b can sense an image. As another example, only the upper surface of the effective image sensor 160a can sense an image, but both the upper and lower surfaces of the dummy image sensor 160b can sense an image. As another example, both the upper and lower surfaces of the effective image sensor 160a can sense an image, but only the lower surface of the dummy image sensor 160b can sense an image.

According to embodiments, the effective image sensor 160a of the image sensor structure 160 is configured such that at least the upper surface can sense an image, and outputs as a sensing signal an electrical signal corresponding to the reflected light RL received by the upper surface through the effective pinholes 120a. The effective image sensor 160a overlaps the effective pinhole 120a of the second light blocking structure 120. The dummy image sensor 160b overlaps the light blocking area 120b of the second light blocking structure 120 without overlapping the effective pinhole 120a of the second light blocking structure 120.

According to embodiments, the insulation layer 131 is disposed on the second light blocking structure 120. The insulation layer 131 includes an inorganic insulator such as a silicon nitride, a silicon oxide or a silicon oxynitride to prevent impurities from the transparent layer 110 from penetrating into the electroluminescent unit ELU. However, in other embodiments, the insulation layer 131 includes an organic insulating material. The insulation layer 131 may have a single-layered structure or a multi-layered structure.

According to embodiments, the first light blocking structure 130 is disposed on the insulation layer 131. The first light blocking structure 130 includes the effective pinholes 130a that contribute to sensing an image, and the dummy pinholes 130b that do not contribute to sensing an image. The first light blocking structure 130 includes at least one insulation layer and at least one conductive layer. To be more specific, the first light blocking structure 130 include s a first conductive pattern 137a and a first dummy conductive pattern 138a that are located on the insulation layer 131, a gate insulation layer 132 that covers the first conductive pattern 137a and the first dummy conductive pattern 138a and is located on the insulation layer 131, a second conductive pattern 137b and a second dummy conductive pattern 138b that are located on the gate insulation layer 132, a first interlayer insulation layer 133 that covers the second conductive pattern 137b and the second dummy conductive pattern 138b and is located on the gate insulation layer 132, a third conductive pattern 137c and a third dummy conductive pattern 138c that are located on the first interlayer insulation layer 133, a second interlayer insulation layer 134 that covers the third conductive pattern 137c and the third dummy conductive pattern 138c and that is located on the first interlayer insulation layer 133, a fourth conductive pattern 137d and a fourth dummy conductive pattern 138d that are located on the second interlayer insulation layer 134, a third interlayer insulation layer 135 that covers the fourth conductive pattern 137d and the fourth dummy conductive pattern 138d and that is located on the second interlayer insulation layer 134, and a fifth conductive pattern 137e and a fifth dummy conductive pattern 138e that are located on the third interlayer insulation layer 135.

Figure 23:
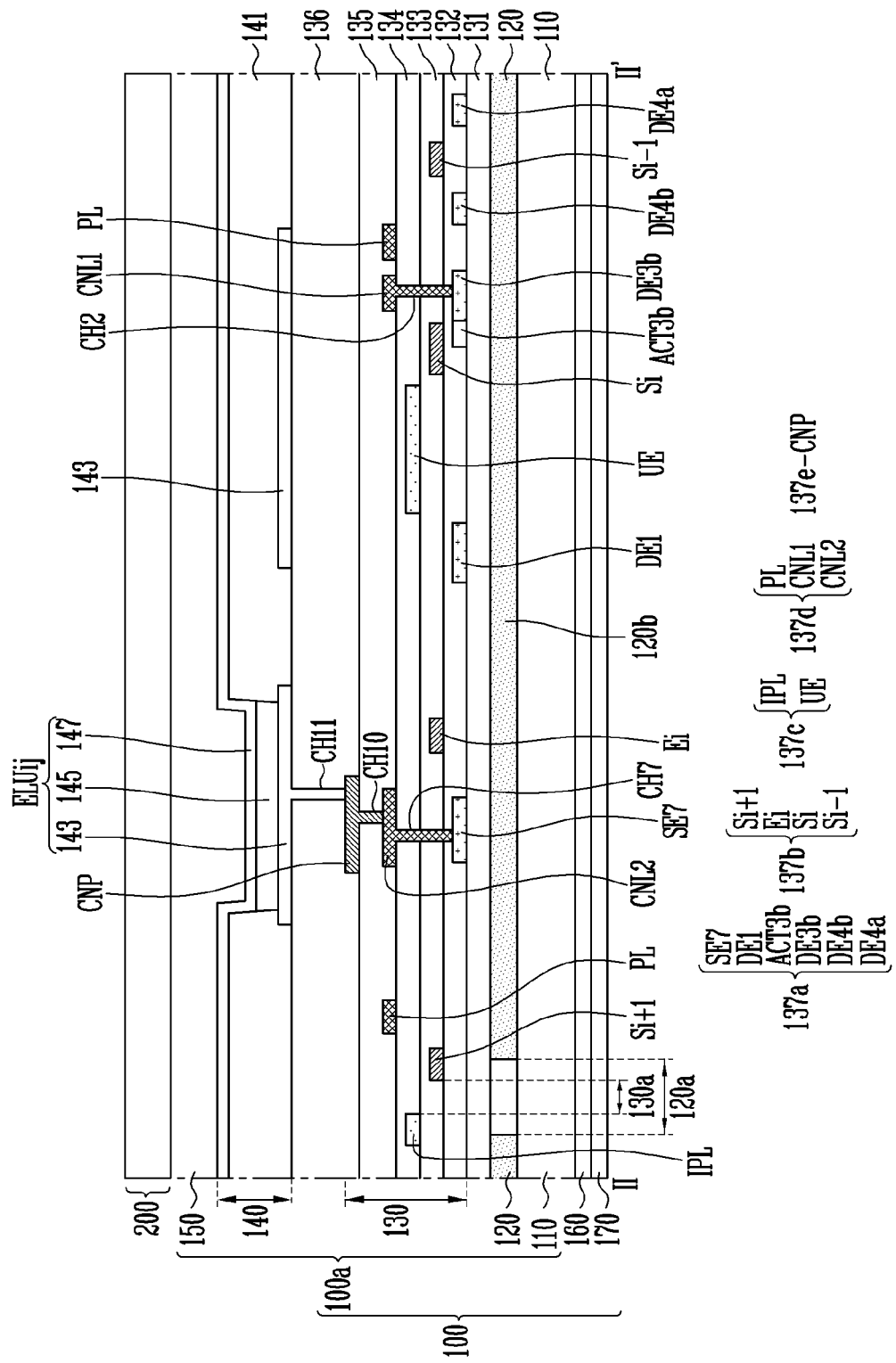
FIG. 23 is a sectional view taken along line II-II' of FIG. 22.

According to embodiments, the first conductive patterns 137a can be any one of a seventh source electrode SE7, a first drain electrode DE1, a 3b-th active pattern ACT3b, a 3b-th drain electrode DE3b, a 4b-th drain electrode DE4b, and a 4a-th drain electrode DE4a, which are shown in FIG. 23. The second conductive patterns 137b can be any one of a i+1-th scan line Si+1, an i-th emission control line Ei, an i-th scan line Si, and an i−1-th scan line Si−1, which are shown in FIG. 23. The third conductive patterns 137c can be any one of an initialization power line IPL and a capacitor upper electrode UE, which are shown in FIG. 23. The fourth conductive patterns 137d can be any one of a pixel power line PL, a first connection line CNL1, and a second connection line CNL2, which are shown in FIG. 23. The fifth conductive patterns 137e may be a connection pattern CNP shown in FIG. 23.

According to embodiments, the first dummy conductive patterns 138a can be any one of a seventh source electrode SE7, a first drain electrode DE1, a 3b-th active pattern ACT3b, a 3b-th drain electrode DE3b, a 4b-th drain electrode DE4b, and a 4a-th drain electrode DE4a, which are shown in FIG. 23. The second dummy conductive patterns 138b can be any one of a i+1-th scan line Si+1, an i-th emission control line Ei, an i-th scan line Si, and an i−1-th scan line Si−1, which are shown in FIG. 23. The third dummy conductive patterns 138c can be any one of an initialization power line IPL and a capacitor upper electrode UE, which are shown in FIG. 23. The fourth dummy conductive patterns 138d can be any one of a first connection line CNL1, a second connection line CNL2, and a pixel power line PL, which are shown in FIG. 23. The fifth dummy conductive patterns 138e can be a connection pattern CNP shown in FIG. 23.

According to embodiments, at least two of the first conductive pattern 137a, the second conductive pattern 137b, the third conductive pattern 137c, the fourth conductive pattern 137d, and the fifth conductive pattern 137e define the effective pinholes 130a of the first light blocking structure 130 in plan view. The effective pinholes 130a of the first light blocking structure 130 overlap the effective pinholes 120a of the second light blocking structure 120.

According to embodiments, at least two of the first dummy conductive pattern 138a, the second dummy conductive pattern 138b, the third dummy conductive pattern 138c, the fourth dummy conductive pattern 138d, and the fifth dummy conductive pattern 138e define the dummy pinholes 130b of the first light blocking structure 130 in plan view. The dummy pinholes 130b of the first light blocking structure 130 overlap the light blocking area 120b of the second light blocking structure 120 without overlapping the effective pinholes 120a of the second light blocking structure 120.

According to embodiments, the effective pinholes 130a of the first light blocking structure 130 may form a grid arrangement in plan view. Furthermore, the effective pinholes 130a and the dummy pinholes 130b of the first light blocking structure 130 may form a single grid arrangement in plan view.

According to embodiments, at least some of the reflected light RL propagates into an area between the effective pinholes 130a of the first light blocking structure 130, an area between the dummy pinholes 130b of the first light blocking structure 130, and an area between the effective pinholes 130a and the dummy pinholes 130b of the first light blocking structure 130. However, the at least some of the reflected light RL is blocked by the light blocking area 120b of the second light blocking structure 120.

According to embodiments, the fifth interlayer insulation layer 136 is disposed on the third interlayer insulation layer 135 and covers the fifth conductive patterns 137e and the fifth dummy conductive patterns 138e.

According to embodiments, the electroluminescent structure 140 includes a first electroluminescent unit ELU1, a second electroluminescent unit ELU2, and a third electroluminescent unit ELU3 and is disposed on the fifth interlayer insulation layer 136.

According to embodiments, the lower electrodes 143 are disposed on the fifth interlayer insulation layer 136. The lower electrodes 143 are reflective individual electrodes, while the upper electrode 147 is a transparent or translucent common electrode. Alternatively, in other embodiments, the lower electrodes 143 are transparent or translucent individual electrodes, while the upper electrode 147 is a reflective common electrode.

According to embodiments, two neighboring lower electrodes 143 are spaced apart from each other by a third distance I_3. As illustrated in FIG. 9A, the first lower electrode 143a and the second lower electrode 143b are spaced apart from each other by the third distance I_3.

According to embodiments, the effective pinholes 130a of the first light blocking structure 130 are located in the second pixel circuit PC2, and do not overlap the lower electrode 143. To be more specific, the effective pinholes 130a of the first light blocking structure 130 do not overlap the second lower electrode 143b of the second electroluminescent unit ELU2.

According to embodiments, the dummy pinholes 130b of the first light blocking structure 130 are located in the third pixel circuit PC3, and do not overlap the lower electrode 143. To be more specific, the dummy pinholes 130b of the first light blocking structure 130 located in the third pixel circuit PC3 do not overlap the first, second and third lower electrodes 143a, 143b and 143c included in the first, second and third electroluminescent units ELU1, ELU2 and ELU3, respectively.

Alternatively, in other embodiments, the dummy pinholes 130b of the first light blocking structure 130 overlap the lower electrode 143. In this case, the lower electrode 143 blocks the reflected light RL incident on the dummy pinholes 130b of the first light blocking structure 130. Thus, the image sensor structure 160 can detect a relatively clear image.

As illustrated in FIG. 9A, according to embodiments, the optical center of the effective pinhole 130a located in the second pixel circuit PC2 of the second pixel P2 is spaced apart from the first lower electrode 143a in the fifth direction DR5 by a first distance D1, and the optical center of the effective pinhole 130a located in the second pixel circuit PC2 of the second pixel P2 is spaced apart from the second lower electrode 143b in the sixth direction DR6 by a third distance D3. The first distance D1 is equal to the third distance D3. Here, the optical center of the effective pinhole 130a is a point where a vertical line passing through the focus F intersects a plane of a central portion of the effective pinhole 130a. If the focus F is formed in the effective pinhole 130a, the optical center of the effective pinhole 130a becomes the focus F.

As illustrated in FIG. 9A, according to embodiments, the optical center of the effective pinhole 130a is spaced apart from an inner walled of the effective pinhole 130a in the fifth direction DR5 by a second distance D2 and in the sixth direction DR6 by a fourth distance D4. The second distance D2 is equal to the fourth distance D4. The second distance D2 is less than the first distance D1. The fourth distance D4 is less than the third distance D3.

According to embodiments, the electroluminescent structure 140 includes a pixel defining layer 141 and spacers 142. The pixel defining layer 141 is disposed on the fifth interlayer insulation layer 136 and covers an edge of the lower electrode 143. The spacers 142 are disposed on the pixel defining layer 141. The spacers 142 are higher than the pixel defining layer 141. To be more specific, the upper surface of the spacer 142 is higher than the upper surface of the pixel defining layer 141. The spacer 142 includes a same material as the pixel defining layer 141, and is integrated with the pixel defining layer 141. Two neighboring spacers 142 are spaced apart from each other by a sixth distance I_6.

According to embodiments, the electroluminescent unit ELU further includes a first function layer 144 disposed between the lower electrode 143 and the luminous layer 145. The first function layer 144 is a common layer. In this case, the first function layer 144 is located above the lower electrode 143, the pixel defining layer 141 and the spacer 142.

According to embodiments, when the lower electrode 143 is an anode, the first function layer 144 may be a hole injection layer (HIL), a hole transporting layer (HTL) or a multi-layered structure having a HIL and a HTL located on the HIL.

According to embodiments, the luminous layer 145 is an individual layer. The luminous layer 145 may include an organic electroluminescent material or an inorganic electroluminescent material. The first luminous layer 145a, the second luminous layer 145b, and the third luminous layer 145c emit red, green and blue light, respectively. Alternatively, in other embodiments, the first luminous layer 145a, the second luminous layer 145b, and the third luminous layer 145c emit magenta, cyan, and yellow light, respectively.

According to embodiments, at least two neighboring layers of the first luminous layer 145a, the second luminous layer 145b, and the third luminous layer 145c overlap a portion PT of the pixel defining layer 141 where no spacers 142 are located. For example, as illustrated in FIG. 9B, the first luminous layer 145a and the second luminous layer 145b overlap a portion PT of the pixel defining layer 141 where no spacer 142 is located. An overlap area E of the first luminous layer 145a and the second luminous layer 145b overlaps the effective pinhole 130a of the first light blocking structure 130. Therefore, the distance between the first electroluminescent unit ELU1, the second electroluminescent unit ELU2, and the third electroluminescent unit ELU3 is reduced to achieve a higher resolution and to reduce the scattering of reflected light RL by the spacer 142, thus obtaining a clearer fingerprint image.

According to embodiments, the electroluminescent unit ELU further includes a second function layer 146 disposed between the luminous layer 145 and the upper electrode 147. The second function layer 146 is a common layer. When the upper electrode 147 is a cathode, the second function layer 146 may be an electron injection layer (EIL), an electron transporting layer (ETL) or a multi-layered structure having an EIL and an ETL located on the EIL.

According to embodiments, the electroluminescent unit ELU includes the upper electrode 147 disposed on the second function layer 146. The upper electrode 147 is a cathode. The upper electrode 147 is a common electrode.

According to embodiments, the encapsulation structure 150 is disposed on the upper electrode 147 and covers the upper electrode 147. The encapsulation structure 150 includes a first inorganic layer, an organic layer on the first inorganic layer, and a second inorganic layer on the organic layer. Alternatively, in other embodiments, the encapsulation structure 150 is a glass layer.

As illustrated in FIG. 9A, according to embodiments, the optical center of the effective pinhole 130a located in the second pixel circuit PC2 of the second pixel P2 is spaced apart from the spacer 142 in the fifth direction DR5 by a fifth distance D5 and in the sixth direction DR6 by a seventh distance D7. The fifth distance D5 is equal to the seventh distance D7. The fifth distance D5 is greater than the first distance D1. The seventh distance D7 is greater than the third distance D3.

According to embodiments, when the effective pinholes 130a of the first light blocking structure 130 and the spacer 142 overlap each other, the reflected light RL is absorbed or scattered by the spacer 142 prior to being incident on the effective pinholes 130a, which diminishes the intensity of the reflected light RL and reduces the sharpness of the fingerprint due to the diminished reflected light RL. Therefore, the spacers 142 are disposed on the pixel defining layer 141 without overlapping the effective pinholes 130a, so that a relatively clear fingerprint image can be obtained.

Alternatively, in other embodiments, if the spacer 142 has a circular or curved edge when viewed in a plane and has a curved edge between upper and side surfaces when viewed in a cross-section, so that the spacer 142 serves as a condensing lens, the spacer 142 overlaps the effective pinholes 130a of the first light blocking structure 130. Since the spacer 142 serves as the condensing lens, the intensity of the reflected light RL is increased, so that it is possible to obtain a clearer fingerprint image. Furthermore, since no luminous material is applied to the upper surface of the spacer 142, it is possible to obtain a clearer fingerprint image.

According to embodiments, the bridge 240a of the touch sensing structure 200 does not overlap the effective pinhole 130a of the first light blocking structure 130. When the bridge 240a overlaps the effective pinhole 130a, the reflected light RL incident on the effective pinhole 130a is absorbed or reflected to be diminished by the bridge 240a. The diminished reflected light RL reduces the sharpness of the fingerprint. Therefore, the bridge 240a is disposed to not overlap the effective pinhole 130a, thus preventing a reduction in the intensity of the reflected light RL incident on the effective pinhole 130a.

According to embodiments, two neighboring bridges 240a in a horizontal direction may be spaced apart from each other in the fifth direction DR5 by a seventh distance I_7. Here, the seventh distance I_7 is greater than the sixth distance I_6.

As illustrated in FIG. 9A, according to embodiments, the optical center of the effective pinhole 130a of the first light blocking structure 130 located in the second pixel circuit PC2 of the second pixel P2 is spaced apart from the bridge 240a adjacent to the optical center in the fifth direction DR5 by a ninth distance D9 and in the sixth direction DR6 by an eleventh distance D11. The ninth distance D9 is equal to the eleventh distance D11. The ninth distance D9 is greater than the fifth distance D5. The eleventh distance D11 is greater than the seventh distance D7.

According to embodiments, the first light blocking structure 130 includes the dummy pinhole 130b. The dummy pinhole 130b overlaps the light blocking area 120b of the second light blocking structure 120. The dummy pinhole 130b overlaps the dummy image sensor 160b. Reflected light RL passing through the dummy pinhole 130b is blocked by the light blocking area 120b of the second light blocking structure 120. Therefore, the reflected light RL does not reach the dummy image sensor 160b.

According to embodiments, the size of the dummy pinhole 130b is equal to that of the effective pinhole 130a. In this case, since the pixel circuit PC in which the effective pinhole 130a is formed and the pixel circuit PC in which the dummy pinhole 130b is located are equivalently designed, formation uniformity between the pixel circuits PC can be increased.

Alternatively, in other embodiments, the size of the dummy pinhole 130b is greater than that of the effective pinhole 130a. The dummy pinhole 130b is used as a passage to remove gas or impurities that may remain in the pixel circuit structure 130 after forming the pixel circuit structure 130 to reduce defects that can occur when the gas or the impurities are collected in one place. When the size of the dummy pinhole 130b is larger than that of the effective pinhole 130a, the gas or the impurities can be more smoothly removed.

Furthermore, according to still other embodiments, the size of the dummy pinhole 130b is less than that of the effective pinhole 130a, or no dummy pinhole 130b is formed. Some reflected light RL passing through the dummy pinhole 130b may propagate to the effective pinhole 120a, and pass through the effective pinhole 120a. Thereby, this is detected as noise by the effective image sensor 160a. In this case, an unclear fingerprint image is obtained. Therefore, the size of the dummy pinhole 130b is less than that of the effective pinhole 130a, or no dummy pinhole 130b is formed, thus reducing noise.

The dummy pinhole 130b may not overlap the spacer 142 and the bridge 240a. Alternatively, according to embodiments, the dummy pinhole 130b overlaps at least one of the spacer 142 and/or the bridge 240a. In this case, reflected light RL incident on the dummy pinhole 130b can be reduced.

According to embodiments, an intermediate layer 180 is disposed on the image sensor structure 160. The intermediate layer 180 attaches the image sensor structure 160 to the transparent layer 110. For example, the intermediate layer 180 is an optical clear adhesive (OCA).

According to embodiments, a predetermined voltage is applied to the light blocking area 120b of the second light blocking structure 120.

When the second light blocking structure 120 is in an electrically floating state, the voltage of the second light blocking structure 120 changes according to external influences, thus electrically unpredictably affecting the transistor and the capacitor in the pixel circuit PC. Thus, according to embodiments, the second light blocking structure 120 has a ground state with one of a predetermined positive voltage, a predetermined negative voltage and a predetermined 0V. That is, the second light blocking structure 120 is electrically biased. Furthermore, when the second light blocking structure 120 has a ground state, the second light blocking structure 120 is connected to at least one electric conductor in the electroluminescent device 1 to be used as a static-electricity receiving member that discharges any static electricity accumulates in the electric conductor.

According to embodiments, a part of the inner walled of the effective pinhole 130a of the first light blocking structure 130 is defined by a part of an outer wall of the lower electrode 143. In this case, the part of the inner walled of the effective pinhole 130a of the first light blocking structure 130 and the part of the outer wall of the lower electrode 143 vertically correspond to each other. This will be described in detail with reference to FIG. 24.

Figure 10:
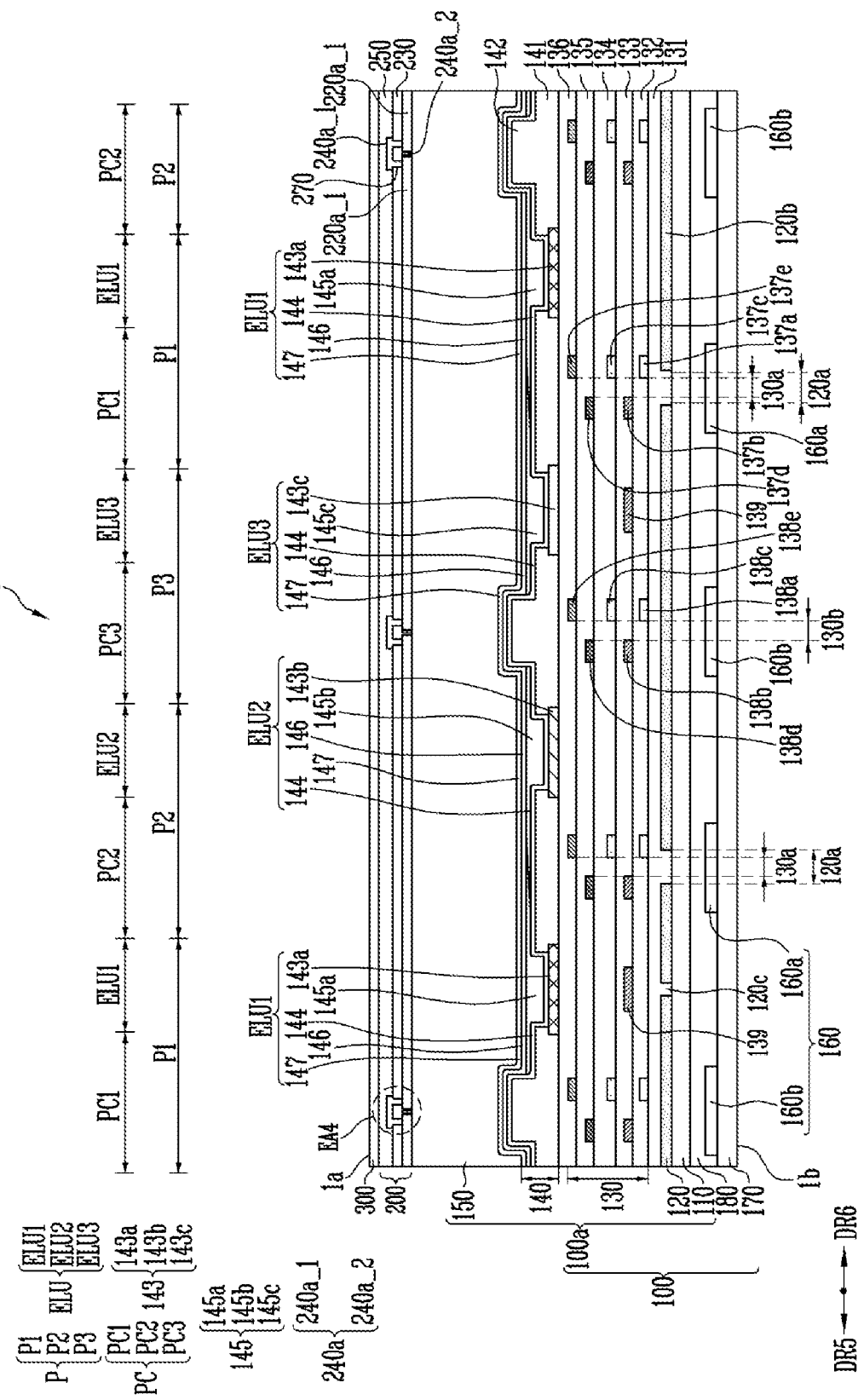
FIG. 10 is a sectional view of an electroluminescent device shown in FIG. 6 in accordance with an embodiment of the present disclosure.

FIG. 10 is a sectional view of an electroluminescent device shown in FIG. 6 in accordance with an embodiment of the present disclosure. The description of components that are already described in FIGS. 1A to 9C will be omitted herein.

Referring to FIGS. 1A to 10, according to embodiments, the second light blocking structure 120 has an additional pinhole 120c, and the first light blocking structure 130 includes a light blocking member 139 (hereinafter, also referred as a lower light blocking member 139).

According to embodiments, the additional pinhole 120c is used as a passage to remove gas or impurities to reduce defects that may occur when the gas or impurities are collected in one place. Furthermore, the additional pinhole 120c increase a surface area of the second light blocking structure 120 to increase an adhesive force between the insulation layer 131 and the second light blocking structure 120.

According to embodiments, the additional pinhole 120c is the same size as the effective pinhole 120a. When the additional pinhole 120c is the same size as the effective pinhole 120a, holes of a mask used to form the first light blocking structure 130 can be uniformly formed, which simplifies a fabrication process.

Alternatively, in other embodiments, the additional pinhole 120c has a size that is greater than that of the effective pinhole 120a. In this case, the additional pinhole 120c can more effectively remove the gas or impurities.

Alternatively, in other embodiments, the additional pinhole 120c has a size that is less than that of the effective pinhole 120a. When the additional pinhole 120c is smaller than the effective pinhole 120a, the intensity of the reflected light RL that passes through the additional pinhole 120c is diminished. Thus, noise generated by the reflected light RL passing through the additional pinhole 120c can be reduced.

According to embodiments, the additional pinhole 120c overlaps the lower electrode 143. Therefore, the lower electrode 143 reduces the intensity of the reflected light RL reflected towards the additional pinhole 120c. As one example, the additional pinhole 120c located in the first pixel P1 overlaps the first lower electrode 143a. As another example, the additional pinhole 120c located in the third pixel P3 overlaps the third lower electrode 143c.

According to embodiments, the first light blocking structure 130 includes the light blocking member 139. The light blocking member 139 overlaps the additional pinhole 120c and the first lower electrode 143a. Therefore, the light blocking member 139 reduces the intensity of the reflected light RL reflected towards the additional pinhole 120c. Thus, noise generated by the reflected light RL passing through the additional pinhole 120c can be reduced.

According to embodiments, the light blocking member 139 has a size greater than that of the additional pinhole 120c. Therefore, the light blocking member 139 effectively reduces the intensity of the reflected light RL incident on the additional pinhole 120c.

According to embodiments, the light shielding member 139 is disposed on at least one of a first layer on which the first conductive pattern 137a is disposed, a second layer on which the second conductive pattern 137b is disposed, a third layer on which the third conductive pattern 137c is disposed, a fourth layer on which the fourth conductive pattern 137d is disposed, and/or a fifth layer on which the fifth conductive pattern 137e is disposed.

As one example, according to embodiments, the light blocking member 139 has a single-layered structure. As another example, the light blocking member 139 has a multi-layered structure that includes a first light blocking layer, an insulation layer on the first light blocking layer, and a second light blocking layer on the insulation layer.

As illustrated in FIG. 10, according to embodiments, the light blocking member 139 is located above the second light blocking structure 120. Alternatively, in other embodiments, the light blocking member 139 is located under the second light blocking structure 120. In this case, the light blocking member 139 is located at least between the effective image sensor 160a and the additional pinhole 120c to block the reflected light RL that passes through the additional pinhole 120c from propagating towards the effective image sensor 160a.

Figure 11:
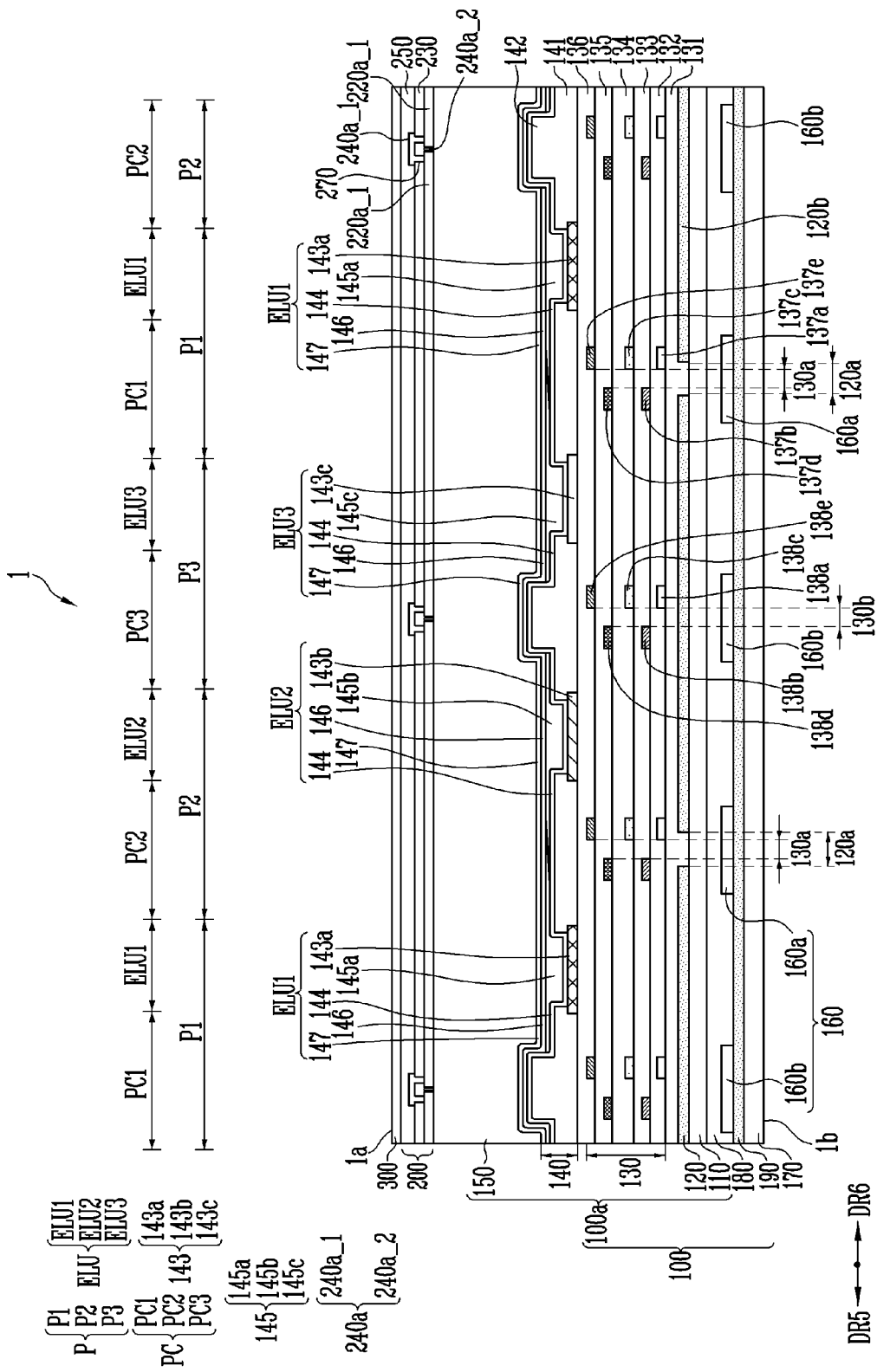
FIG. 11 is a sectional view of an electroluminescent device shown in FIG. 6 in accordance with an embodiment of the present disclosure.

FIG. 11 is a sectional view of an electroluminescent device shown in FIG. 6 in accordance with an embodiment of the present disclosure. The description of components that are already described in FIGS. 1A to 10 will be omitted herein.

Referring to FIGS. 1A to 11, according to embodiments, a third light blocking structure 190 is located under the intermediate layer 180 and between the image sensor structure 160 and the protective layer 170.

According to embodiments, the third light blocking structure 190 prevents light incident on the second surface 1b of the electroluminescent device 1 from propagating towards the image sensor structure 160. The third light blocking structure 190 includes a light blocking material. The light blocking material may be a reflecting material or a light absorbing material.

In addition, at least one intermediate layer may be located between the third light blocking structure 190 and the image sensor structure 160. The intermediate layer includes a transparent insulating material.

Figure 12:
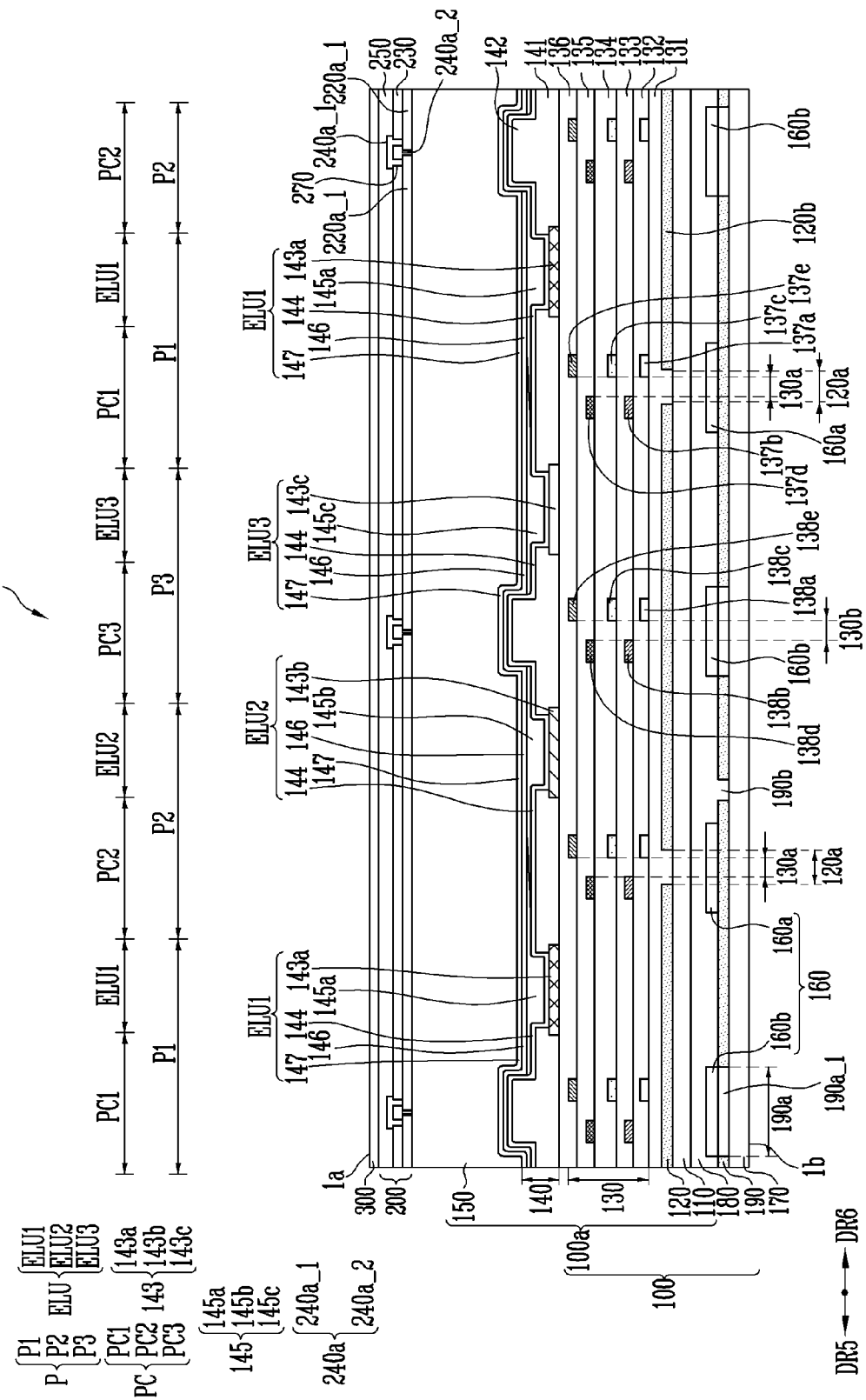
FIG. 12 is a sectional view of an electroluminescent device shown in FIG. 6 in accordance with an embodiment of the present disclosure.

FIG. 12 is a sectional view of an electroluminescent device shown in FIG. 6 in accordance with an embodiment of the present disclosure. The description of components that are already described in FIGS. 1A to 11 will be omitted herein.

Referring to FIGS. 1A to 12, according to embodiments, the third light blocking structure 190 has an effective pinhole 190a and a dummy pinhole 190b. The effective pinhole 190a overlaps the dummy image sensor 160b of the image sensor structure 160 and the spacer 142 on the pixel defining layer 141 of the electroluminescent structure 140, but does not overlap the effective image sensor 160a.

According to embodiments, the effective pinhole 190a is filled with a transparent insulation layer 190a_1. The transparent insulation layer 190a_1 includes an organic material.

According to embodiments, a portion of the light incident on the second surface 1b of the electroluminescent device 1 is blocked by the third light blocking structure 190, while a portion of the remaining light reaches the dummy image sensor 160b through the effective pinhole 190a. Of the upper and lower surfaces of the dummy image sensor 160b, at least the lower surface is configured to perform a light sensing function, thus detecting a user's fingerprint, etc., on the second surface 1b. Here, when the optical recognition sensitivity of the dummy image sensor 160b is relatively high, the dummy image sensors 160b function as a camera that photographs an object that is spaced apart from the second surface 1b.

In addition, at least one intermediate layer is located between the third light blocking structure 190 and the image sensor structure 160. The intermediate layer includes a transparent insulating material. In this case, the transparent insulation layer 190a_1 is a part of the intermediate layer.

According to embodiments, the effective pinhole 190a is the same size as the dummy image sensor 160b, or is larger in size than the dummy image sensor 160b. In this case, it is possible to prevent a reduction of the intensity of light that passes through the effective pinhole 190a and is incident on the dummy image sensor 160b.

Alternatively, in other embodiments, the effective pinholes 190a are smaller in size than the dummy image sensor 160b. In this case, the intensity of noise light that passes through the effective pinhole 190a and, then, sensed by the effective image sensor 160a can be reduced.

According to embodiments, the dummy pinhole 190b of the third light blocking structure 190 is located between neighboring effective pinholes 190a. Gas or impurities remaining in the electroluminescent device 1 can be discharged from the electroluminescent device 1 through the dummy pinhole 190b of the third light blocking structure 190. Furthermore, the dummy pinhole 190b increases the surface area of the third light blocking structure 190 which increases an adhesive force between the intermediate layer 180 and the third light blocking structure 190.

According to embodiments, the dummy pinhole 190b does not overlap the effective image sensor 160a. Therefore, light passing through the dummy pinhole 190b from the second surface 1b is prevented from propagating to the effective image sensor 160a and acting as noise.

Alternatively, in other embodiments, the dummy pinhole 190b overlaps the effective image sensor 160a. In this case, the lower surface of the effective image sensor 160a is configured to not sense light. Therefore, a case where the light passing through the dummy pinhole 190b from the second surface 1b propagates to the effective image sensor 160a to act as noise can be minimized.

According to embodiments, the dummy pinhole 190b of the third light blocking structure 190 is smaller in size than the effective pinhole 190a. In this case, light incident through the dummy pinhole 190b can be prevented from propagating to the dummy image sensor 160b or the effective image sensor 160a and acting as noise.

In addition, a light blocking member is located between the dummy pinhole 190b and the dummy image sensor 160b or between the dummy pinhole 190b and the effective image sensor 160a. The light blocking member prevents light passing through the dummy pinhole 190b from propagating to the dummy image sensor 160b or the effective image sensor 160a and acting as noise.

Figure 13:
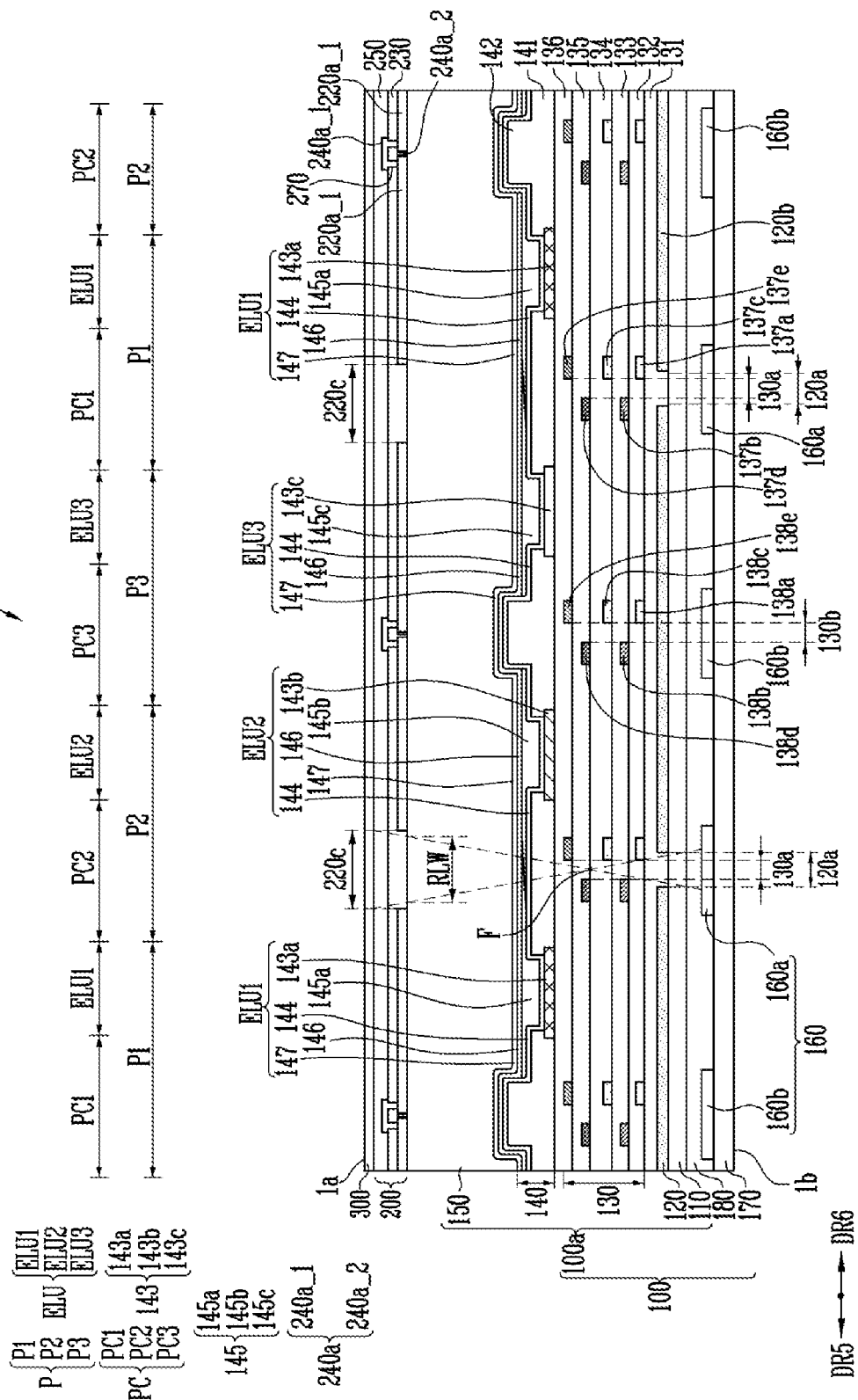
FIG. 13 is a sectional view of an electroluminescent device shown in FIG. 6 in accordance with an embodiment of the present disclosure.

FIG. 13 is a sectional view of an electroluminescent device shown in FIG. 6 in accordance with an embodiment of the present disclosure. The description of components that are already described in FIGS. 1A to 12 will be omitted herein.

Referring to FIGS. 1A to 13, according to embodiments, the sensing electrode 220a includes an opening 220c. For example, as illustrated in FIG. 13, a first sensing electrode 220a_1 includes an opening 220c. The opening 220c overlaps the effective pinhole 130a. As one example, one opening 220c vertically corresponds to the effective pinhole 130a and overlaps the effective pinhole 130a. As another example, at least two neighboring openings 220c vertically correspond to one effective pinhole 130a and overlap one effective pinhole 130a.

According to embodiments, a width of the opening 220c is equal to or greater than a width RLW of the reflected light RL measured by the sensing electrode 220a. For example, as illustrated in FIG. 13, when the focus F is located at the effective pinhole 130a of the first light blocking structure 130, the width of the opening 220c is greater than the width of the effective pinhole 130a. Therefore, it is possible to prevent the reflected light RL from being absorbed or reflected by the sensing electrode 220a, thus preventing reduction of the intensity of the reflected light RL.

According to embodiments, when the bridge 240a is relatively large, the bridge 240a also includes an effective pinhole that overlaps the effective pinhole 130a. Therefore, it is possible to prevent the reflected light RL from being absorbed or reflected by the bridge 240a, thus preventing reduction of the intensity of the reflected light RL.

According to embodiments, the opening 220c is larger than the hole H of the sensing electrode 220a shown in FIG. 9A. The sensing electrode 220a includes both the hole H shown in FIG. 9A and the opening 220c shown in FIG. 13. The bridge 240a also includes both the hole H shown in FIG. 9A and the opening 220c shown in FIG. 13.

Figure 14:
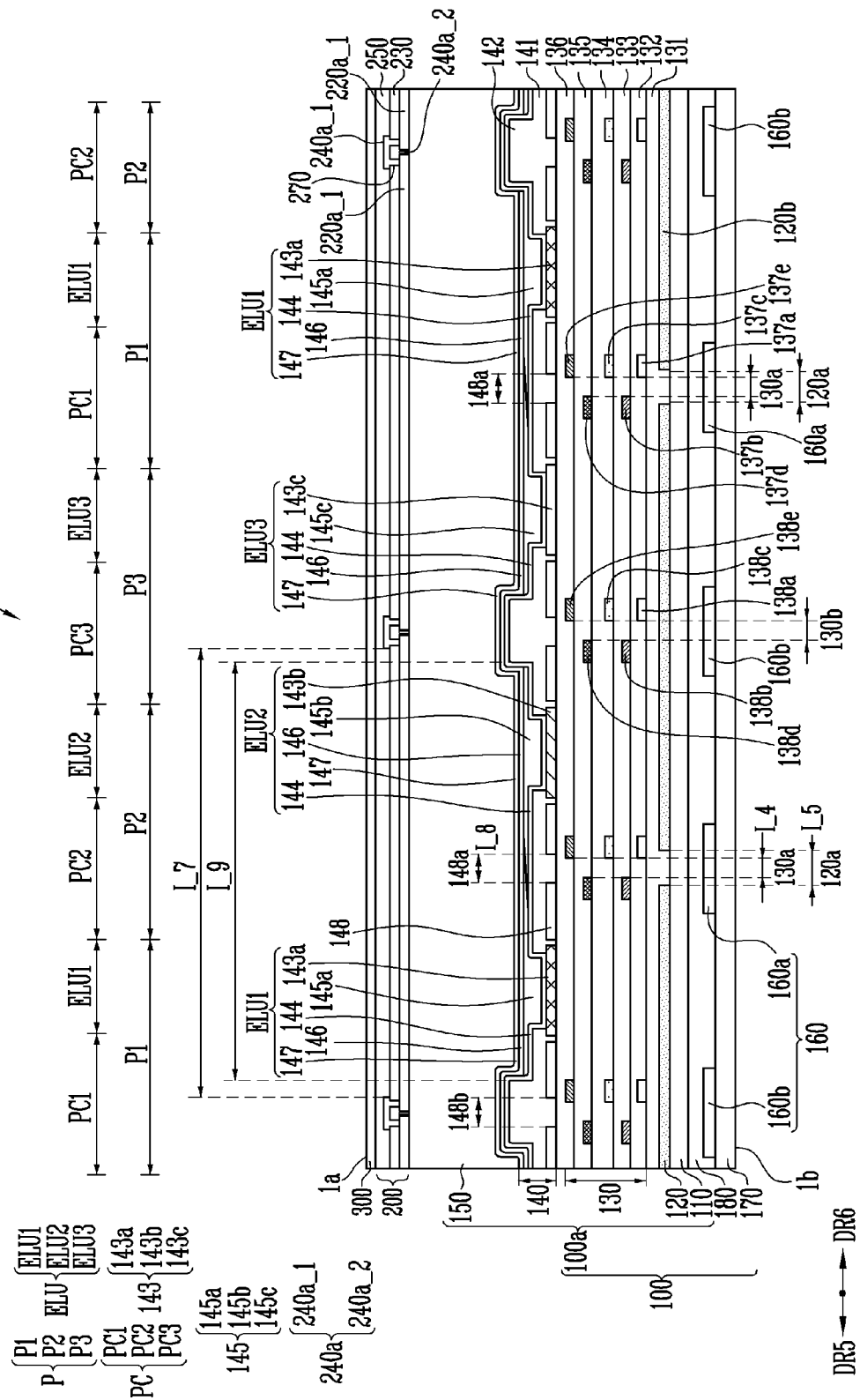
FIG. 14 is a sectional view of an electroluminescent device shown in FIG. 6 in accordance with an embodiment of the present disclosure.

FIG. 14 is a sectional view of an electroluminescent device shown in FIG. 6 in accordance with an embodiment of the present disclosure. The description of components that are already described in FIGS. 1A to 13 will be omitted herein.

Referring to FIGS. 1A to 14, according to embodiments, the electroluminescent device 1 includes fourth light blocking structures 148 located between the fifth interlayer insulation layer 136 and the pixel defining layer 141. For example, the fourth light blocking structure 148 is disposed on the same layer as the lower electrode 143. The fourth light blocking structures 148 have island shapes that do not surround the lower electrode 143.

According to embodiments, the fourth light blocking structure 148 includes at least one of an effective pinhole 148a and/or a dummy pinhole 148b.

According to embodiments, the effective pinhole 148a of the fourth light blocking structure 148, the effective pinhole 130a of the first light blocking structure 130, the effective pinhole 120a of the second light blocking structure 120, and the effective image sensor 160a overlap each other. Therefore, the reflected light RL can sequentially pass through the effective pinhole 148a, the effective pinhole 130a, and the effective pinhole 120a to be incident on the effective image sensor 160a.

According to embodiments, the dummy pinhole 148b of the fourth light blocking structure 148, the dummy pinhole 130b of the first light blocking structure 130, the light blocking area 120b of the second light blocking structure 120, and the dummy image sensor 160b overlap each other.

Therefore, after the reflected light RL sequentially passes through the dummy pinhole 148b and the dummy pinhole 130b, the reflected light RL may be blocked by the light blocking area 120b and is not incident on the dummy image sensor 160b.

According to embodiments, the dummy pinhole 148b of the fourth light blocking structure 148 overlaps the spacer 142 on the pixel defining layer 141 of the electroluminescent structure 140. Therefore, after the reflected light RL is absorbed or scattered by the spacer 142 and the intensity of the reflected light RL is reduced, the reflected light RL is incident on the dummy pinhole 148b.

According to embodiments, the dummy pinhole 148b of the fourth light blocking structure 148 has the same size as the effective pinhole 148a. In this case, holes of a mask used to form the fourth light blocking structure 148 can be uniformly formed, which simplifies a fabrication process.

Alternatively, in other embodiments, the dummy pinhole 148b of the fourth light blocking structure 148 is larger than the effective pinhole 148a. The dummy pinhole 148b is used as a passage to remove gas or impurities that remain in the electroluminescent device 1 to reduce defects that can occur when the gas or the impurities are collected in one place. When the size of the dummy pinhole 130b is larger than that of the effective pinhole 148a, the gas or the impurities can be more effectively removed.

Alternatively, in still other embodiments, the dummy pinhole 148b of the fourth light blocking structure 148 is smaller than the effective pinhole 148a. After the reflected light RL that passes through the dummy pinhole 148b passes through the dummy pinhole 130b, most of the reflected light RL is blocked by the second light blocking structure 120. However, some of the reflected light RL may propagate through the effective pinhole 120a of the second light blocking structure 120, thus acting as noise. Therefore, the dummy pinhole 148b of the fourth light blocking structure 148 can be formed smaller than the effective pinhole 148a to reduce noise.

According to embodiments, the fourth light blocking structure 148 is not electrically connected to the lower electrode 143. As one example, the fourth light blocking structure 148 is electrically floated. As another example, a positive voltage, a negative voltage or a zero voltage is constantly applied to the fourth light blocking structure 148. This can prevent the occurrence of cross talk due to voltage fluctuations of the fourth light blocking structure 148.

According to embodiments, the focus of the reflected light RL is on the effective pinhole 148a of the fourth light blocking structure 148. In this case, a ninth distance I_9 is greater than an eighth distance I_8, a seventh distance I_7 is greater than the ninth distance I_9, a fourth distance I_4 is greater than the eighth distance I_8, and a fifth distance I_5 is greater than the fourth distance I_4.

According to other embodiments, the focus of the reflected light RL is on the effective pinhole 130a of the first light blocking structure 130. In this case, the eighth distance I_8 is greater than the fourth distance I_4, the ninth distance I_9 is greater than the eighth distance I_8, the seventh distance I_7 is greater larger than the ninth distance I_9, and the fifth distance I_5 is greater than the fourth distance I_4.

According to still other embodiments, the focus of the reflected light RL is on the effective pinhole 120a of the second light blocking structure 120. In this case, the fourth distance I_4 is greater than the fifth distance I_5, the eighth distance I_8 is greater than the fourth distance I_4, the ninth distance I_9 is greater than the eighth distance I_8, and the seventh distance I_7 is greater than the ninth distance I_9.

According to embodiments, an upper light blocking member is located above the dummy pinhole 148b of the fourth light blocking structure 148. The upper light blocking member prevents the reflected light RL from being incident on the dummy pinhole 148b. The upper light blocking member is wider than the dummy pinhole 148b.

According to embodiments, a lower light blocking member is located under the dummy pinhole 148b of the fourth light blocking structure 148. The lower light blocking member blocks the reflected light RL that has passes through the dummy pinhole 148b. The lower light blocking member is wider than the dummy pinhole 148b. The lower light blocking member includes at least a part of a light blocking layer in the first light blocking structure 130.

According to embodiments, the light blocking layer is a conductive layer. For instance, the light blocking layer includes an opaque metal. Alternatively, in other embodiments, the light blocking layer is an insulation layer. For instance, the light blocking layer includes a black matrix material.

If the fourth light blocking structure 148 is in an electrically floating state, the voltage of the fourth light blocking structure 148 changes according to external influences, thus electrically unpredictably affecting the transistor and the capacitor in the pixel circuit PC. Thus, according to embodiments, the fourth light blocking structure 148 has a ground state with one of a predetermined positive voltage, a predetermined negative voltage and a predetermined 0V. That is, the fourth light blocking structure 148 is electrically biased. The fourth light blocking structure 148 is electrically connected to the upper electrode 147.

FIG. 15 is a sectional view of an electroluminescent device shown in FIG. 6 in accordance with an embodiment of the present disclosure. The description of components that are already described in FIGS. 1A to 14 will be omitted herein.

Referring to FIGS. 1A to 15, according to embodiments, the electroluminescent structure 140 includes the fourth light blocking structure 148 that has at least one of the effective pinhole 148a and/or the dummy pinhole 148b.

According to embodiments, the fourth light blocking structure 148 is integrated with the lower electrode 143. As one example, the fourth light blocking structure 148 with effective pinhole 148a in the second pixel circuit PC2 of the second pixel P2 is integrated with a second lower electrode 143b. As another example, the fourth light blocking structure 148 with dummy pinhole 148b in the third pixel circuit PC3 of the third pixel P3 is integrated with a third lower electrode 143c.

According to embodiments, since the effective pinhole 148a and the dummy pinhole 148b shown in FIG. 15 are substantially the same as the effective pinhole 148a and the dummy pinhole 148b already described in FIG. 14, a detailed description thereof will be omitted herein.

According to embodiments, since the upper light blocking member and the lower light blocking member of FIG. 15 are substantially the same as the upper light blocking member and the lower light blocking member already described with respect to FIG. 14, a detailed description thereof will be omitted herein.

According to embodiments, since the relationships between the ninth distance I_9, the fourth distance I_4, the fifth distance I_5, the eighth distance I_8, and the seventh distance I_7 shown in FIG. 15 are substantially equal to the relationships between the ninth distance I_9, the fourth distance I_4, the fifth distance I_5, the eighth distance I_8, and the seventh distance I_7 that have been already described in FIG. 14, the description thereof will be omitted herein.

FIG. 16 is a sectional view of an electroluminescent device shown in FIG. 6 in accordance with an embodiment of the present disclosure. The description of components that are already described in FIGS. 1A to 15 will be omitted herein.

Referring to FIGS. 1A to 16, the electroluminescent structure 140 includes the fourth light blocking structure 148 having at least one of the effective pinhole 148a and/or the dummy pinhole 148b.

As one example, the fourth light blocking structure 148 with the effective pinhole 148a located in the second pixel circuit PC2 of the second pixel P2 is integrated with the first lower electrode 143a. As another example, the fourth light blocking structure 148 with the dummy pinhole 148b located in the third pixel circuit PC3 of the third pixel P3 is integrated with the second lower electrode 143b.

According to embodiments, since the effective pinhole 148a and the dummy pinhole 148b shown in FIG. 16 are substantially the same as the effective pinhole 148a and the dummy pinhole 148b already described in FIG. 14, a detailed description thereof will be omitted herein.

According to embodiments, since the upper light blocking member and the lower light blocking member of FIG. 16 are substantially that same as the upper light blocking member and the lower light blocking member already described with respect to FIG. 14, a detailed description thereof will be omitted herein.

According to embodiments, since the relationships between the ninth distance I_9, the fourth distance I_4, the fifth distance I_5, the eighth distance I_8, and the seventh distance I_7 shown in FIG. 16 are substantially equal to the relationships between the ninth distance I_9, the fourth distance I_4, the fifth distance I_5, the eighth distance I_8, and the seventh distance I_7 that have been already described in FIG. 14, a description thereof will be omitted herein.

Figure 17:
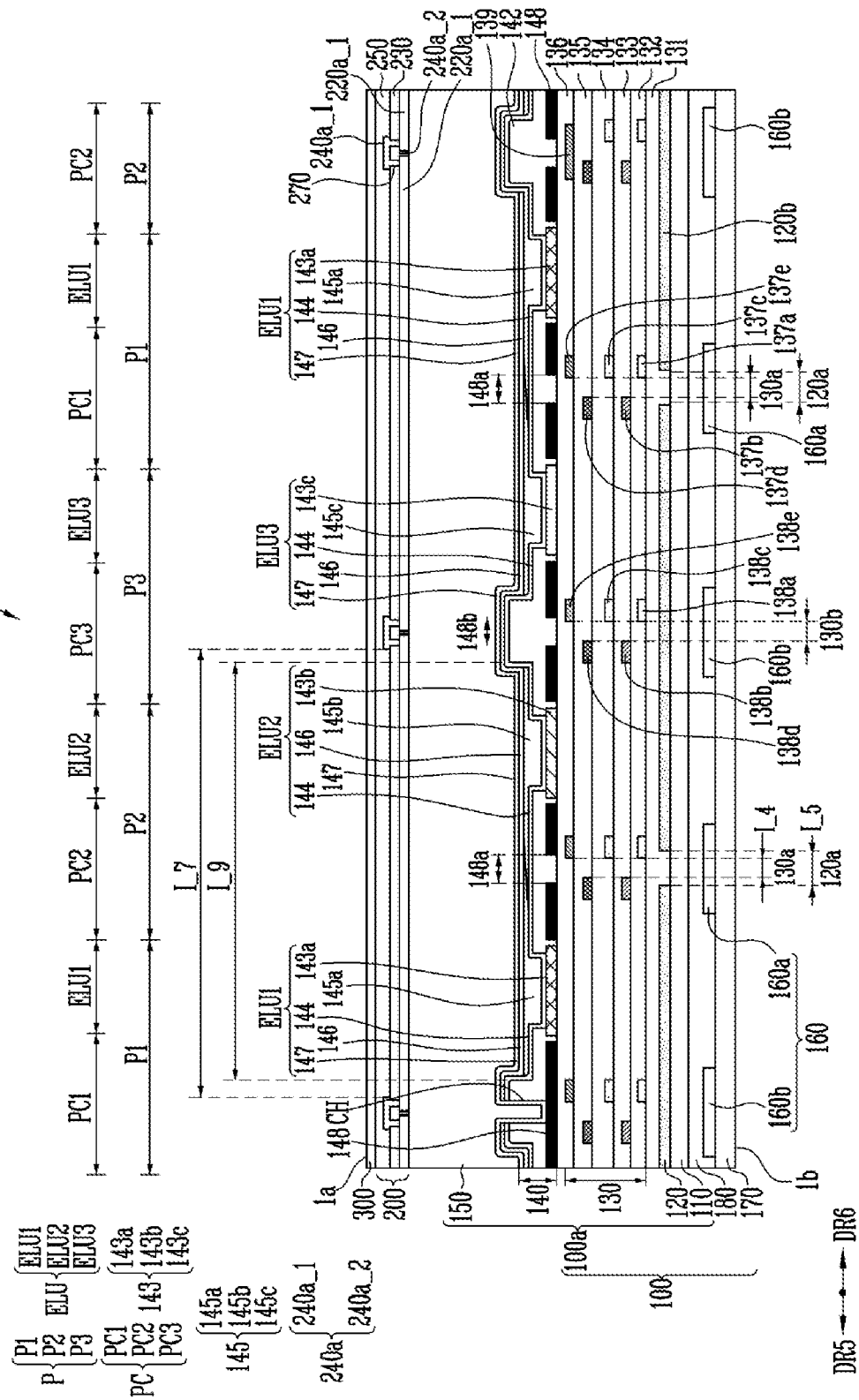
FIG. 17 is a sectional view of an electroluminescent device shown in FIG. 6 in accordance with an embodiment of the present disclosure.
Figure 18:
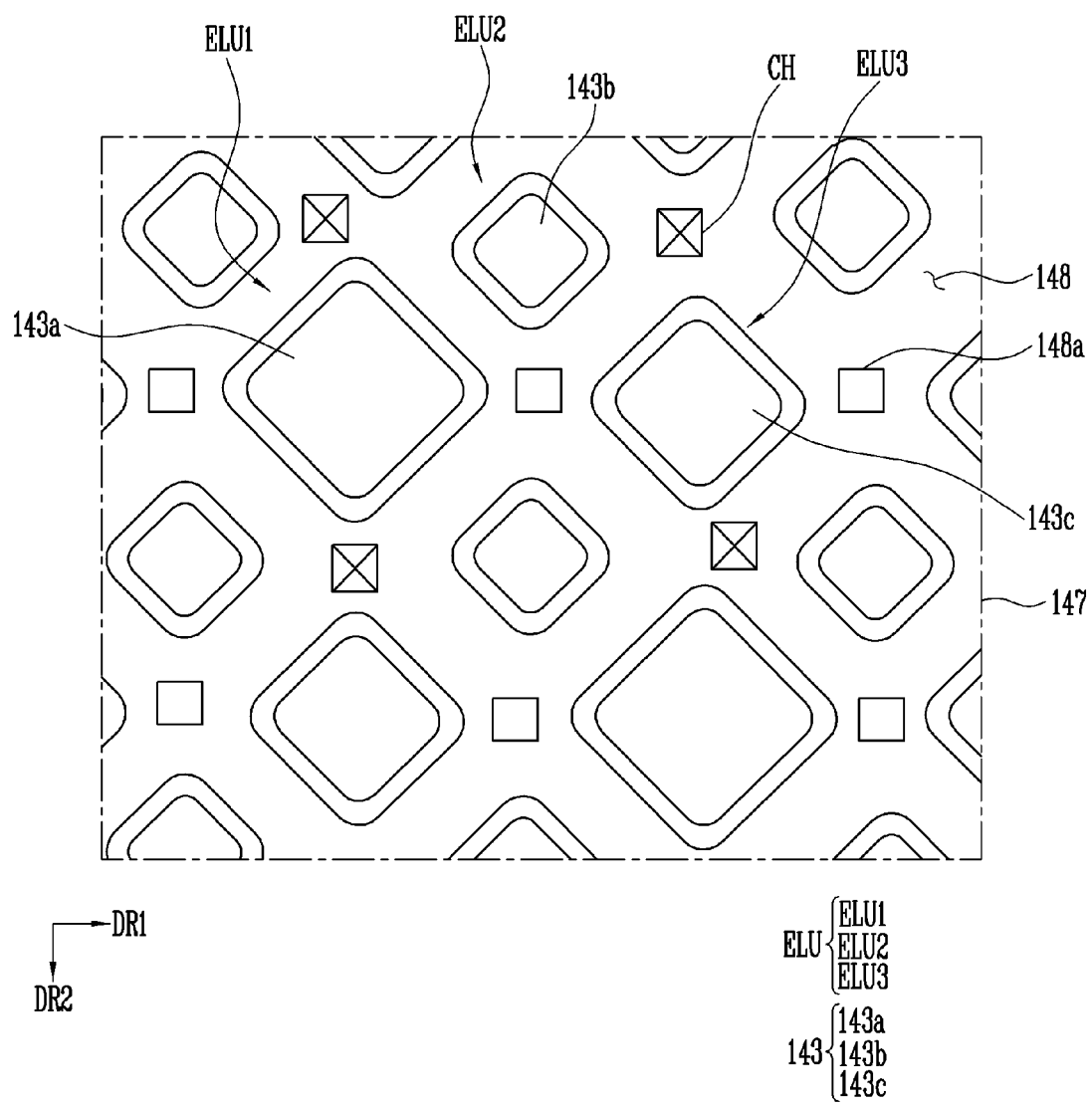
FIG. 18 is a plan view of an electroluminescent device shown in FIG. 17 in accordance with an embodiment of the present disclosure.

FIG. 17 is a sectional view of an electroluminescent device shown in FIG. 6 in accordance with an embodiment of the present disclosure. FIG. 18 is a plan view of an electroluminescent device shown in FIG. 17 in accordance with an embodiment of the present disclosure. The description of components already described in FIGS. 1A to 16 will be omitted herein.

Referring to FIGS. 1A to 18, according to embodiments, the electroluminescent device 1 includes the fourth light blocking structure 148 and a lower light blocking member 139. The fourth light blocking structure 148 has at least one of the effective pinhole 148a and/or the dummy pinhole 148b.

According to embodiments, the fourth light blocking structure 148 and the lower electrode 143 are disposed on the same layer. The fourth light blocking structure 148 and the lower electrode 143 include the same material, and are formed by the same process. The fourth light blocking structure 148 is spaced apart from the lower electrode 143. The fourth light blocking structure 148 has a mesh structure that surrounds the lower electrodes 143 in plan view.

According to embodiments, the fourth light blocking structure 148 includes an opaque material that can reflect or absorb light. For instance, the fourth light blocking structure 148 includes an opaque conductive material. The opaque conductive material includes a metal.

According to embodiments, the fourth light blocking structure 148 is connected to the upper electrode 147 through the contact hole CH that penetrates at least the pixel defining layer 141. As one example, the contact hole CH penetrates the pixel defining layer 141. As another example, the contact hole CH penetrates the pixel defining layer 141 and the spacer 142.

According to embodiments, when the fourth light blocking structure 148 is connected to the upper electrode 147 through the contact hole CH and is connected to a second pixel power supply ELVSS shown in FIG. 21, a voltage drop of the upper electrode 147 can be reduced.

If the fourth light blocking structure 148 is in an electrically floating state without being electrically connected to the upper electrode 147, the voltage of the fourth light blocking structure 148 changes according to external influences, thus electrically unpredictably affecting the transistor and the capacitor in the pixel circuit PC. Thus, in other embodiments, if the fourth light blocking structure 148 is not electrically connected to the upper electrode 147, the fourth light blocking structure 148 has a ground state with one of a predetermined positive voltage, a predetermined negative voltage and a predetermined 0V. That is, if the fourth light blocking structure 148 is not electrically connected to the upper electrode 147, the fourth light blocking structure 148 is electrically biased.

According to embodiments, since the effective pinhole 148a and the dummy pinhole 148b shown in FIG. 17 are substantially the same as the effective pinhole 148a and the dummy pinhole 148b that have been already described in FIG. 14, a detailed description thereof will be omitted herein.

According to embodiments, since the upper light blocking member is substantially that same as the upper light blocking member already described with respect to FIG. 14, a detailed description thereof will be omitted herein.

According to embodiments, the lower light blocking member 139 is located under the dummy pinhole 148b of the fourth light blocking structure 148. The lower light blocking member 139 blocks the reflected light RL passing through the dummy pinhole 148b. The lower light blocking member 139 is wider than the dummy pinhole 148b. The lower light blocking member 139 includes at least a part of the light blocking layer in the first light blocking structure 130. In some embodiments, the light blocking layer is a conductive layer. For example, the light blocking layer includes the same material as the fifth conductive pattern 137e and the fifth dummy conductive pattern 138e disposed on the third interlayer insulation layer 135, and is formed in the same process. Alternatively, in other embodiment, the light blocking layer is an insulation layer. For instance, the light blocking layer includes a black matrix material.

According to embodiments, since the relationships between the ninth distance I_9, the fourth distance I_4, the fifth distance I_5, the eighth distance I_8, and the seventh distance I_7 shown in FIG. 17 are substantially equal to the relationships between the ninth distance I_9, the fourth distance I_4, the fifth distance I_5, the eighth distance I_8, and the seventh distance I_7 already described in FIG. 14, a description thereof will be omitted herein.

Figure 19:
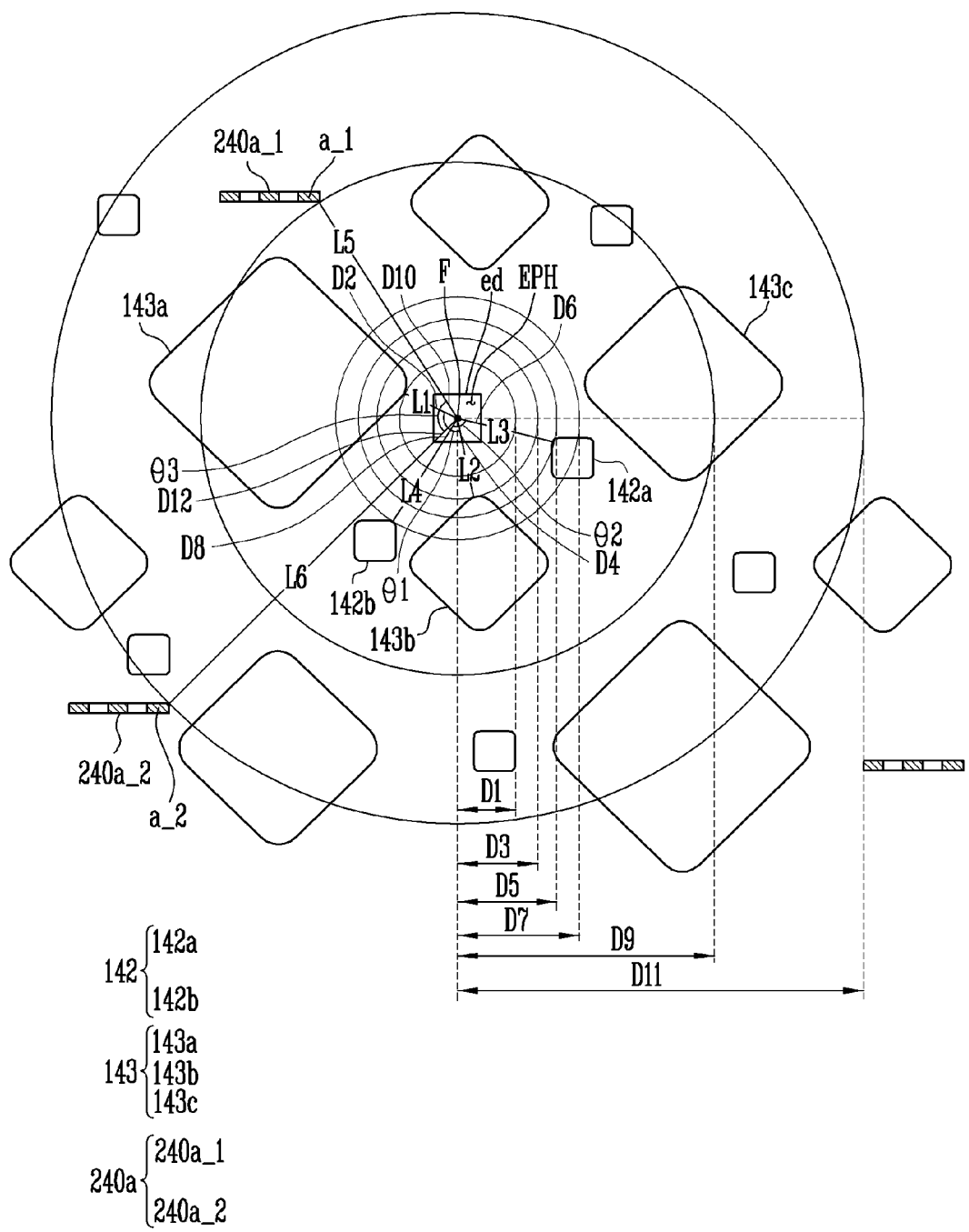
FIG. 19 is a plan view of a positional relationship between effective pinholes, lower electrodes, spacers and bridges in accordance with an embodiment of the present disclosure.

FIG. 19 is a plan view of a positional relationship between effective pinholes, lower electrodes, spacers and bridges in accordance with an embodiment of the present disclosure. At least one effective pinhole needs to satisfy conditions described with reference to FIG. 19, but not all of the effective pinholes need to satisfy the conditions.

Referring to FIGS. 1A to 8C and FIG. 19, according to embodiments, an effective pinhole EPH has a square shape in plane. Alternatively, in other embodiments, the effective pinhole EPH may have the shape of a rectangle, a circle, an ellipse, or a polygon in plane.

According to embodiments, of the effective pinhole 130a of the first light blocking structure 130, the effective pinhole 120a of the second light blocking structure 120, and the effective pinhole 148a of the fourth light blocking structure 148 shown in FIG. 14, a location where the focus F is formed becomes the effective pinhole EPH of FIG. 19.

According to embodiments, multiple lower electrodes 143, multiple spacers 142, and multiple bridges 240a are located around the effective pinhole EPH in plan view. The lower electrodes 143 include a first lower electrode 143a, a second lower electrode 143b, and a third lower electrode 143c. The spacers 142 include a first spacer 142a and a second spacer 142b. The bridges 240a include a first bridge 240a_1 and a second bridge 240a_2.

According to embodiments, the multiple lower electrodes 143 include a single first lower electrode 143a that is firstly closest in plan view to the focus F formed on the effective pinhole EPH. The shortest distance between the single first lower electrode 143a and the focus F is a first distance D1 that is the length of a first line L1. The focus F is spaced apart from the inner walled of the effective pinhole EPH by a second distance D2 in an extension direction of the first line L1. The first distance D1 is equal to or greater than the second distance D2. For example, the first distance D1 is greater than the second distance D2.

According to embodiments, the multiple lower electrodes 143 include a single second lower electrode 143b that is secondly closest in plan view to the focus F formed on the effective pinhole EPH. Alternatively, in other embodiments, the multiple lower electrodes 143 include at least two second lower electrodes 143b that are secondly closest in plan view to the focus F. The shortest distance between the second lower electrode 143b and the focus F is a third distance D3 that is the length of a second line L2. The focus F is spaced apart from the inner walled of the effective pinhole EPH by a fourth distance D4 in an extension direction of the second line L2. The third distance D3 is equal to or greater than the fourth distance D4. For example, the third distance D3 is greater than the fourth distance D4.

According to embodiments, the multiple spacers 142 include a single first spacer 142a that is firstly closest in plan view to the focus F formed on the effective pinhole EPH. The shortest distance between the single first spacer 142a and the focus F is a fifth distance D5 that is the length of a third line L3. The focus F is spaced apart from the inner walled of the effective pinhole EPH by a sixth distance D6 in an extension direction of the third line L3. The fifth distance D5 is equal to or greater than the sixth distance D6. For example, the fifth distance D5 is greater than the sixth distance D6.

According to embodiments, the multiple spacers 142 include a single second spacer 142b that is secondly closest in plan view to the focus F formed on the effective pinhole EPH. Alternatively, in other embodiments, the multiple spacers 142 include at least two second spacers 142b that are secondly closest in plan view to the focus F formed on the effective pinhole EPH. The shortest distance between the second spacer 142b and the focus F is a seventh distance D7 that is the length of a fourth line L4. The focus F is spaced apart from the inner walled of the effective pinhole EPH by an eighth distance D8 in an extension direction of the fourth line L4. The seventh distance D7 is equal to or greater than the eighth distance D8. For example, the seventh distance D7 is greater than the eighth distance D8.

According to embodiments, the multiple bridges 240*a* include a single first bridge 240*a*_1 that is firstly closest in plan view to the focus F formed on the effective pinhole EPH. The shortest distance between the single first bridge 240*a*_1 and the focus F is a ninth distance D9 that is the length of the fifth line L5. The focus F is spaced apart from the inner walled of the effective pinhole EPH by a tenth distance D10 in an extension direction of the fifth line L5. The ninth distance D9 is equal to or greater than the tenth distance D10. For example, the ninth distance D9 is greater than the tenth distance D10.

According to embodiments, the first bridge 240*a*_1 has an overlap area a_1 that overlaps the first sensing electrode 220*a*_1 illustrated in FIG. 8A, and the light transmissivity of the touch sensing structure 200 is lower at the overlap area a_1. Therefore, the fifth line L5 may be set between the focus F and the overlap area a_1 of the single first bridge 240*a*_1 that is firstly closest in plane to the focus F.

According to embodiments, the multiple bridges 240*a* include a single second bridge 240*a*_2 that is secondly closest in plan view to the focus F formed on the effective pinhole EPH. Alternatively, in other embodiments, the multiple bridges 240*a* include at least two second bridges 240*a*_2 that are secondly closest in plan view to the focus F formed on the effective pinhole EPH. The shortest distance between the focus F and the second bridge 240*a*_2 that is secondly closest in plane to the focus F is an eleventh distance D11 that is the length of a sixth line L6. The focus F is spaced apart from the inner walled of the effective pinhole EPH by a twelfth distance D12 in an extension direction of the sixth line L6. The eleventh distance D11 is equal to or greater than the twelfth distance D12. For example, the eleventh distance D11 is greater than the twelfth distance D12.

According to embodiments, the second bridge 240*a*_2 has an overlap area a_2 that overlaps the second sensing electrode 220*a*_2 illustrated in FIG. 8A, and the light transmissivity of the touch sensing structure 200 is lower at the overlap area a_2. Therefore, the sixth line L6 may be set between the focus F and the overlap area a_2 of the single second bridge 240*a*_2 that is secondly closest in plane to the focus F.

According to embodiments, the first distance D1, the third distance D3, the fifth distance D5, the seventh distance D7, the ninth distance D9, and the eleventh distance D11 are equal to or greater than the second distance D2, the fourth distance D4, the sixth distance D6, the eighth distance D8, the tenth distance D10, and the twelfth distance D12, respectively. Therefore, at least a part of an optical path along which the reflected light RL propagates is blocked to prevent an intensity reduction of the reflected light RL.

According to embodiments, the third distance D3 is equal to or greater than the first distance D1. The fifth distance D5 is equal to or greater than the third distance D3. The seventh distance D7 is equal to or greater than the fifth distance D5. The ninth distance D9 is equal to or greater than the seventh distance D7. The eleventh distance D11 is equal to or greater than the ninth distance D9. Therefore, the optical path of the reflected light RL can be sufficiently secured. Therefore, at least a part of an optical path along which the reflected light RL propagates can be blocked to prevent an intensity reduction of the reflected light RL.

According to embodiments, a sum of the fifth distance D5 and the seventh distance D7 is equal to or greater than a sum of the first distance D1 and the third distance D3. A sum of the ninth distance D9 and the eleventh distance D11 is equal to or greater than the sum of the fifth distance D5 and the seventh distance D7. Therefore, at least a part of an optical path along which the reflected light RL propagates can be blocked to prevent an intensity reduction of the reflected light RL.

According to embodiments, a first angle θ1 between the first line L1 and the second line L2 is not 'k×180°'. Here, 'k' is an integer other than zero. A second angle θ2 between the third line L3 and the fourth line L4 is not 'm×180°'. Here, 'm' is an integer other than zero. A third angle θ3 between the fifth line L5 and the sixth line L6 is not 'n×180°'. Here, 'n' is an integer other than zero. At least one of the conditions of the first angle θ1, the conditions of the second angle θ2, and/or the conditions of the third angle θ3 can be satisfied. Therefore, the formation of the effective pinhole EPH does not prevent the resolution of the electroluminescent device 1 from increasing.

Figure 20:
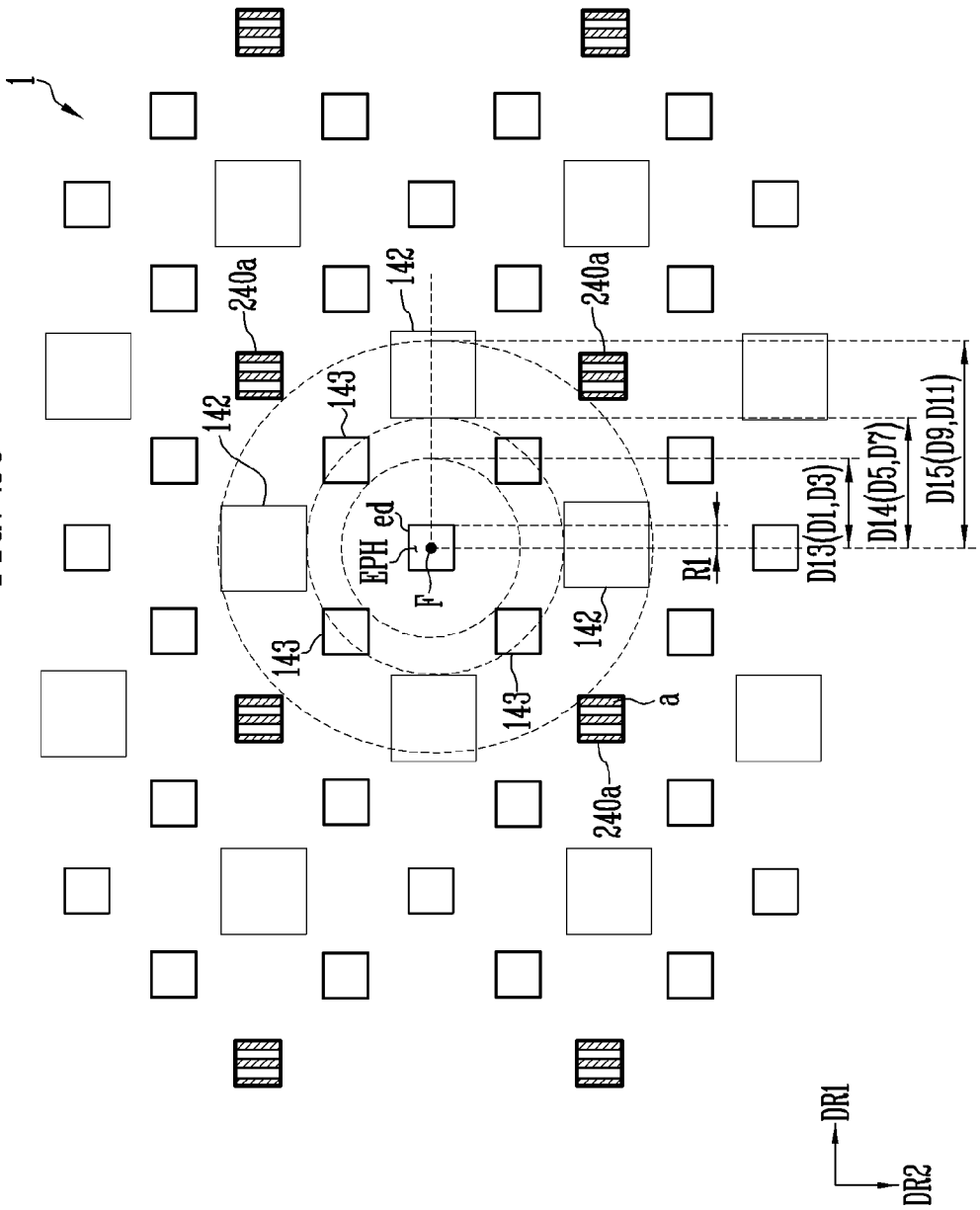
FIG. 20 is a plan view of a positional relationship between effective pinholes, lower electrodes, spacers and bridges in accordance with an embodiment of the present disclosure.

FIG. 20 is a plan view is the positional relationship between the effective pinholes, the lower electrodes, the spacers and the bridges in accordance with an embodiment of the present disclosure. A description of components that have been already described in FIG. 19 will be omitted herein. At least one effective pinhole needs to satisfy the conditions described with reference to FIG. 20, but not all of the effective pinholes need to satisfy the conditions.

Referring to FIGS. 1A to 20, according to embodiments, the electroluminescent device 1 includes at least two lower electrodes 143 that are firstly closest in plan view to the focus F formed on the effective pinhole EPH. The shortest distance between the focus F and the at least two lower electrodes 143 is a 13-th distance D13. The 13-th distance D13 may correspond the first distance D1 or the third distance D3 illustrated in FIG. 19.

According to embodiments, the electroluminescent device 1 includes at least two spacers 142 that are firstly closest in plan view to the focus F formed on the effective pinhole EPH. The shortest distance between the focus F and the at least two spacers 142 is a 14-th distance D14. The 14-th distance D14 may correspond the fifth distance D5 or the seventh distance D7 illustrated in FIG. 19.

According to embodiments, the electroluminescent device 1 includes at least two bridges 240*a* that are firstly closest in plan view to the focus F formed on the effective pinhole EPH. The shortest distance between the focus F and the at least two bridges 240*a* is a 15-th distance D15. The 15-th distance D15 may correspond the ninth distance D9 or the eleventh distance D11 illustrated in FIG. 19.

According to embodiments, the bridge 240*a* has an overlap area a that overlaps the sensing electrode 220*a* illustrated in FIG. 8A, and the light transmissivity of the touch sensing structure 200 is lower at the overlap area a. Therefore, the 15-th distance D15 may be set between the focus F and the overlap areas a of at least two bridges 240*a* that are firstly closest to the focus F.

According to embodiments, the 14-th distance D14 is equal to or greater than the 13-th distance D13. The 15-th distance D15 is equal to or greater than the 14-th distance D14. Therefore, the optical path of the reflected light RL can be sufficiently secured. Therefore, an intensity reduction of the reflected light RL may be prevented. The intensity reduction of the reflected light RL may be caused by blocking at least a part of an optical path along which the reflected light RL propagates. Besides, the distance between the focus F formed on the effective pinhole EPH and the inner walled of the effective pinhole EPH is length R1.

FIG. 21 is a circuit diagram of a pixel circuit shown in FIG. 1A or FIG. 1B in accordance with an embodiment of the present disclosure.

Referring to FIGS. 1A, 1B and 21, according to embodiments, the pixel Pij is arranged in an i-th, row, where 'i' is a natural number, and a j-th column, where 'j' is a natural number, of the display area DA of the electroluminescent device 1. The pixel circuit PCij of the pixel Pij is coupled to an i-th scan line Si and a j-th data line Dj of the display area DA. The pixel circuit PCij is coupled to a first pixel power supply ELVDD and a second pixel power supply ELVSS.

According to embodiments, the pixel Pij includes the pixel circuit PCij and the electroluminescent unit ELUij. The pixel circuit PCij is electrically coupled to the electroluminescent unit ELUij. An outer portion of the pixel circuit PCij substantially has the shape of a tetragon, such as a square or a rectangle.

According to embodiments, the pixel circuit PCij is further coupled to at least one different scan line. For example, the pixel circuit PCij is further coupled to at least one of an i−1-th scan line Si−1 and/or an i+1-th scan line Si+1.

According to embodiments, the pixel circuit PCij is further coupled to a third power supply in addition to the first pixel power supply ELVDD and the second pixel power supply ELVSS. For instance, the pixel circuit PCij is also coupled to an initialization power supply Vint.

According to embodiments, the pixel circuit PCij includes first to seventh transistors T1, T2, T3, T4, T5, T6 and T7 and a storage capacitor Cst.

According to embodiments, a source electrode of the first transistor T1 is coupled to the first pixel power supply ELVDD via the fifth transistor T5. A drain electrode of the first transistor T1 is coupled to the electroluminescent unit ELUij via the sixth transistor T6. A gate electrode of the first transistor T1 is coupled to a first node N1. The first transistor T1 controls a driving current that flows between the first pixel power supply ELVDD and the second pixel power supply ELVSS so that the driving current flows through the electroluminescent unit ELUij in response to the voltage of the first node N1.

According to embodiments, the second transistor T2 is coupled between a j-th data line Dj and the source electrode of the first transistor T1. The gate electrode of the second transistor T2 is coupled to the i-th scan line Si. When the scan signal of the gate-on voltage, such as a low voltage, is received from the i-th scan line Si, the second transistor T2 turns on to electrically connect the j-th data line Dj to the source electrode of the first transistor T1. Hence, if the second transistor T2 is turned on, a data signal received from the j-th data line Dj is transmitted to the first transistor T1.

According to embodiments, the third transistor T3 is coupled between the drain electrode of the first transistor T1 and the first node N1. The gate electrode of the third transistor T3 is coupled to the i-th scan line Si. When the scan signal of the gate-on voltage is received from the i-th scan line Si, the third transistor T3 turns on to electrically connect the drain electrode of the first transistor T1 to the first node N1.

According to embodiments, the fourth transistor T4 is coupled between the first node N1 and the initialization power line IPL over which the initialization power supply Vint is transmitted. The gate electrode of the fourth transistor T4 is coupled to a preceding scan line, such as the i−1-th scan line Si−1. When the scan signal of the gate-on voltage is received from the i−1-th scan line Si−1, the fourth transistor T4 turns on so that the voltage of the initialization power supply Vint flows to the first node N1. Here, the initialization power supply Vint has a voltage that is equal to or less than a minimum voltage of the data signal.

According to embodiments, the fifth transistor T5 is coupled between the first pixel power supply ELVDD and the first transistor T1. The gate electrode of the fifth transistor T5 is coupled to a corresponding emission control line, such as an i-th emission control line Ei. The fifth transistor T5 turns off when an emission control signal having a gate-off voltage is received by the i-th emission control line Ei, and can be turned on in other cases.

According to embodiments, the sixth transistor T6 is coupled between the first transistor T1 and the electroluminescent unit ELUij. The gate electrode of the sixth transistor T6 is coupled to the i-th emission control line Ei. The sixth transistor T6 turns off when an emission control signal having a gate-off voltage is supplied to the i-th emission control line Ei, and may be turned on in other cases.

According to embodiments, the seventh transistor T7 is coupled between the electroluminescent unit ELUij and the initialization power line IPL. The gate electrode of the seventh transistor T7 is coupled to any one of scan lines of a subsequent stage, such as the i+1-th scan line Si+1. When the scan signal of the gate-on voltage is supplied to the i+1-th scan line Si+1, the seventh transistor T7 turns on so that the voltage of the initialization power supply Vint flows to the electroluminescent unit ELUij.

According to embodiments, the storage capacitor Cst is coupled between the first pixel power supply ELVDD and the first node N1. The storage capacitor Cst stores a voltage that corresponds to the data signal supplied to the first node N1 during each frame period and to the threshold voltage of the first transistor T1.

According to embodiments, an anode of the electroluminescent unit ELUij is coupled to the first transistor T1 via the sixth transistor T6, and a cathode of the electroluminescent unit ELUij is coupled to the second pixel power supply ELVSS. The electroluminescent unit ELUij emits light having a predetermined luminance that corresponds to current received from the first transistor T1. The voltage of the first pixel power supply ELVDD to be transmitted to the pixel power line PL is higher than that of the second pixel power supply ELVSS to allow current to flow to the electroluminescent unit ELUij. A potential difference between the first pixel power supply ELVDD and the second pixel power supply ELVSS is equal to or higher than a threshold voltage of the electroluminescent unit ELUij for the light emitting period of the pixel Pij.

Figure 22:
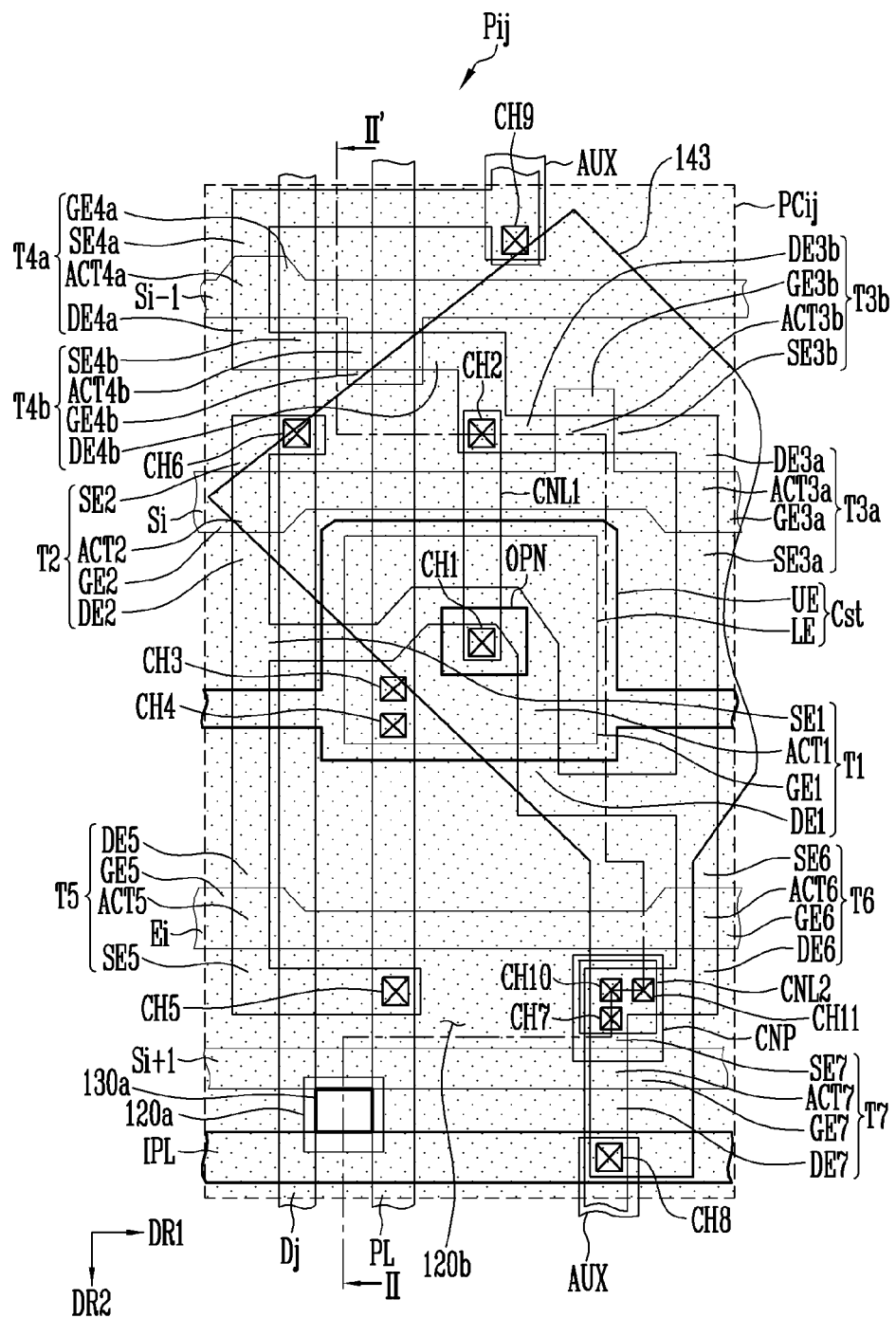
FIG. 22 is a plan view of a pixel shown in FIG. 21 in accordance with an embodiment of the present disclosure.

FIG. 22 is a plan view of a pixel shown in FIG. 21 in accordance with an embodiment of the present disclosure. FIG. 23 is a sectional view taken along line II-II' of FIG. 22.

According to embodiments, of the scan lines Si−1, Si and Si+1 over which the scan signal is transmitted, an i−1-th row of the scan lines is referred to as an "i−1-th scan line Si−1, an i-th row of the scan lines is referred to as an "i-th scan line Si", and an i+1-th row of the scan lines is referred to as an "i+1-th scan line Si+1". An i-th row of the emission control lines over which an emission control signal is transmitted is referred to as an "i-th emission control line Ei". A j-th column of the data lines over which a data signal is transmitted is referred to as a "j-th data line Dj". A j-th column of the pixel power lines over which the first pixel power supply ELVDD is transmitted is referred to as a "pixel power line PL".

Referring to FIGS. 1A to 8C and FIGS. 21 to 23, according to embodiments, the pixel Pij is disposed on the transparent layer 110. The electroluminescent device 1 includes a display area DA and a non-display area NDA. The pixel Pij is disposed in the display area DA.

According to embodiments, the scan lines Si−1, Si and Si+1 transmit the scan signal to the pixel circuit PCij. The i-th emission control line Ei transmits the emission control signal to the pixel circuit PCij. The j-th data line Dj transmits the data signal to the pixel circuit PCij. The initialization power line IPL transmits the initialization power to the pixel circuit PCij. The pixel power line PL transmits the first pixel power supply ELVDD to the pixel circuit PCij.

According to embodiments, the scan lines Si−1, Si and Si+1 extend in the first direction DR1 on the transparent layer 110. The scan lines Si−1, Si, and Si+1 are sequentially arranged in the second direction DR2. Each of the scan lines Si−1, Si, and Si+1 receive a scan signal. The scan lines Si−1, Si, and Si+1 are disposed on the gate insulation layer 132.

According to embodiments, the i-th emission control line Ei extends in the first direction DR1 on the transparent layer 110. The i-th emission control line Ei is disposed on the gate insulation layer 132.

According to embodiments, the j-th data line Dj extends on the transparent layer 110 in the second direction DR2 that intersecting with the first direction DR1. The j-th data line Dj receives a data signal. The j-th data line Dj is disposed on the second interlayer insulation layer 134.

According to embodiments, the pixel power line PL substantially extends in the same direction as the j-th data line Dj, which is the second direction DR2, on the transparent layer 110. The first pixel power supply ELVDD is transmitted over the pixel power line PL. The pixel power line PL is disposed on the second interlayer insulation layer 134.

According to embodiments, the initialization power line IPL extends in the first direction DR1 on the transparent layer 110. The initialization power supply Vint is transmitted over the initialization power line IPL. The initialization power line IPL is disposed on the first interlayer insulation layer 133.

According to embodiments, the pixel Pij includes an electroluminescent structure 140 that includes at least one electroluminescent unit ELUij, a pixel circuit structure 130 that includes a pixel circuit PCij that drives the electroluminescent unit ELUij, and a second light blocking structure 120 located between the pixel circuit structure 130 and the transparent layer 110.

According to embodiments, the pixel circuit structure 130 includes the effective pinholes 130a. Therefore, the pixel circuit structure 130 is used as the first light blocking structure 130 to selectively transmit the reflected light RL reflected by a user. Hereinafter, the pixel circuit structure 130 is referred to as the first light blocking structure 130.

According to embodiments, the second light blocking structure 120 is disposed between the electroluminescent structure 140 and the image sensor structure 160 to selectively transmit the incident reflected light RL.

According to embodiments, the second light blocking structure 120 includes effective pinholes 120a and a light blocking area 120b. The light blocking area 120b includes a light blocking material. For example, the light blocking area 120b includes an opaque metal.

According to embodiments, the first light blocking structure 130 includes the pixel circuit PCij coupled to the electroluminescent unit ELUij.

According to embodiments, the pixel circuit PCij includes first to seventh transistors T1, T2, T3, T4, T5, T6 and T7 and the storage capacitor Cst. The pixel circuit PCij is disposed on the insulation layer 131.

According to embodiments, the first transistor T1 includes a first gate electrode GE1, a first active pattern ACT1, a first source electrode SE1, a first drain electrode DE1, and a first connection line CNL1. The first gate electrode GE1 is coupled to a 3b-th drain electrode DE3b of a 3b-th transistor T3b and a 4b-th drain electrode DE4b of a 4b-th transistor T4b.

According to embodiments, the second transistor T2 includes a second gate electrode GE2, a second active pattern ACT2, a second source electrode SE2, and a second drain electrode DE2.

According to embodiments, the third transistor T3 has a double gate structure to prevent current leakage. In other words, the third transistor T3 includes a 3a-th transistor T3a and a 3b-th transistor T3b. The 3a-th transistor T3a includes a 3a-th gate electrode GE3a, a 3a-th active pattern ACT3a, a 3a-th source electrode SE3a, and a 3a-th drain electrode DE3a. The 3b-th transistor T3b includes a 3b-th gate electrode GE3b, a 3b-th active pattern ACT3b, a 3b-th source electrode SE3b, and a 3b-th drain electrode DE3b. The other end of the 3b-th drain electrode DE3b is coupled to the first gate electrode GE1 by the first and second contact holes CH1 and CH2 and the first connection line CNL1.

According to embodiments, the fourth transistor T4 has a double gate structure to prevent current leakage, similar to the third transistor T3. In other words, the fourth transistor T4 includes a 4a-th transistor T4a and a 4b-th transistor T4b. The 4a-th transistor T4a includes a 4a-th gate electrode GE4a, a 4a-th active pattern ACT4a, a 4a-th source electrode SE4a, and a 4a-th drain electrode DE4a. The 4b-th transistor T4b includes a 4b-th gate electrode GE4b, a 4b-th active pattern ACT4b, a 4b-th source electrode SE4b, and a 4b-th drain electrode DE4b. The 4a-th source electrode SE4a is coupled to an auxiliary connection line AUX through a ninth contact hole CH9. The 4b-th drain electrode DE4b is coupled to the first gate electrode GE1 of the first transistor T1 through the first and second contact holes CH1 and CH2 and the first connection line CNL1.

According to embodiments, the fifth transistor T5 includes a fifth gate electrode GE5, a fifth active pattern ACT5, a fifth source electrode SE5, and a fifth drain electrode DE5. The fifth source electrode SE5 is coupled to the pixel power line PL through a fifth contact hole CH5.

According to embodiments, the sixth transistor T6 includes a sixth gate electrode GE6, a sixth active pattern ACT6, a sixth source electrode SE6, and a sixth drain electrode DE6. The sixth source electrode SE6 is coupled to the first drain electrode DE1 and the 3a-th source electrode SE3a. The sixth drain electrode DE6 is coupled to a second connection line CNL2 through a seventh contact hole CH7. The second connection line CNL2 is coupled to a connection pattern CNP through a tenth contact hole CH10. The connection pattern CNP is coupled to the second connection line CNL2 through the tenth contact hole CH10 that penetrates the third interlayer insulation layer 135, and is coupled to the lower electrode 143 of the electroluminescent structure 140 through the eleventh contact hole CH11 that penetrates the fifth interlayer insulation layer 136.

According to embodiments, the seventh transistor T7 includes a seventh gate electrode GE7, a seventh active pattern ACT7, a seventh source electrode SE7, and a seventh drain electrode DE7. The seventh source electrode SE7 is coupled to the sixth drain electrode DE6, and the seventh drain electrode DE7 is coupled to the initialization power line IPL through an eighth contact hole CH8 and is coupled to the 4a-th source electrode SE4a of a pixel P(i+1)j corresponding the i+1-th row of the scan lines.

According to embodiments, the storage capacitor Cst includes a capacitor lower electrode LE and a capacitor upper electrode UE. The capacitor lower electrode LE is integrated with the first gate electrode GE1 of the first transistor T1. The capacitor upper electrode UE overlaps the capacitor lower electrode LE, and covers the capacitor lower electrode LE when viewed from a plane. The capacitor upper electrode UE is electrically connected to the pixel power line PL through third and fourth contact holes CH3 and CH4. The capacitor upper electrode UE includes an opening OPN that corresponds to an area in which the first contact hole CH1 is formed. The first gate electrode GE1 of the first transistor T1 is coupled with the first connection line CNL1 through the first contact hole CH1.

According to embodiments, the electroluminescent unit ELUij includes the lower electrode 143, the upper electrode 147, and the luminous layer 145 disposed between the lower electrode 143 and the upper electrode 147. All of the lower electrode 143, the luminous layer 145 and the upper electrode 147 overlap each other without the intervention of an insulation layer, so that an area where light is actually emitted is the luminous area.

According to embodiments, the first light blocking structure 130 of the sensing area SA has effective pinholes 130a that overlap the effective pinholes 120a of the second light blocking structure 120. The focus F of the reflected light RL is located on the effective pinhole 130a of the first light blocking structure 130. In this case, the size of the effective pinholes 130a of the first light blocking structure 130 is smaller than that of the effective pinholes 120a of the second light blocking structure 120. Alternatively, in other embodiments, the focus F of the reflected light RL is located on the effective pinhole 120a of the second light blocking structure 120. In this case, the size of the effective pinholes 120a of the second light blocking structure 120 is smaller than that of the effective pinholes 130a of the first light blocking structure 130.

According to embodiments, the effective pinhole 130a of the first light blocking structure 130 is defined by at least two of the first to fifth conductive patterns 137a, 137b, 137c, 137d, and 137e.

For example, according to embodiments, the first conductive pattern 137a is one of a seventh source electrode SE7, a first drain electrode DE1, a 3b-th active pattern ACT3b, a 3b-th drain electrode DE3b, a 4b-th drain electrode DE4b, and a 4a-th drain electrode DE4a, which are shown in FIG. 23. The second conductive pattern 137b is one of a i+1-th scan line Si+1, an i-th emission control line Ei, an i-th scan line Si, and an i−1-th scan line Si−1, which are shown in FIG. 23. The third conductive pattern 137c is one of an initialization power line IPL and a capacitor upper electrode UE, which are shown in FIG. 23. The fourth conductive pattern 137d is one of a pixel power line PL, a first connection line CNL1, and a second connection line CNL2, which are shown in FIG. 23. The fifth conductive pattern 137e is a connection pattern CNP shown in FIG. 23.

According to embodiments, the electroluminescent device 1 further includes the touch sensing structure 200 disposed on the electroluminescent structure 140. Since the touch sensing structure 200 has been described in FIGS. 7 and 8D, a duplicate description thereof will be omitted herein.

Figure 24:
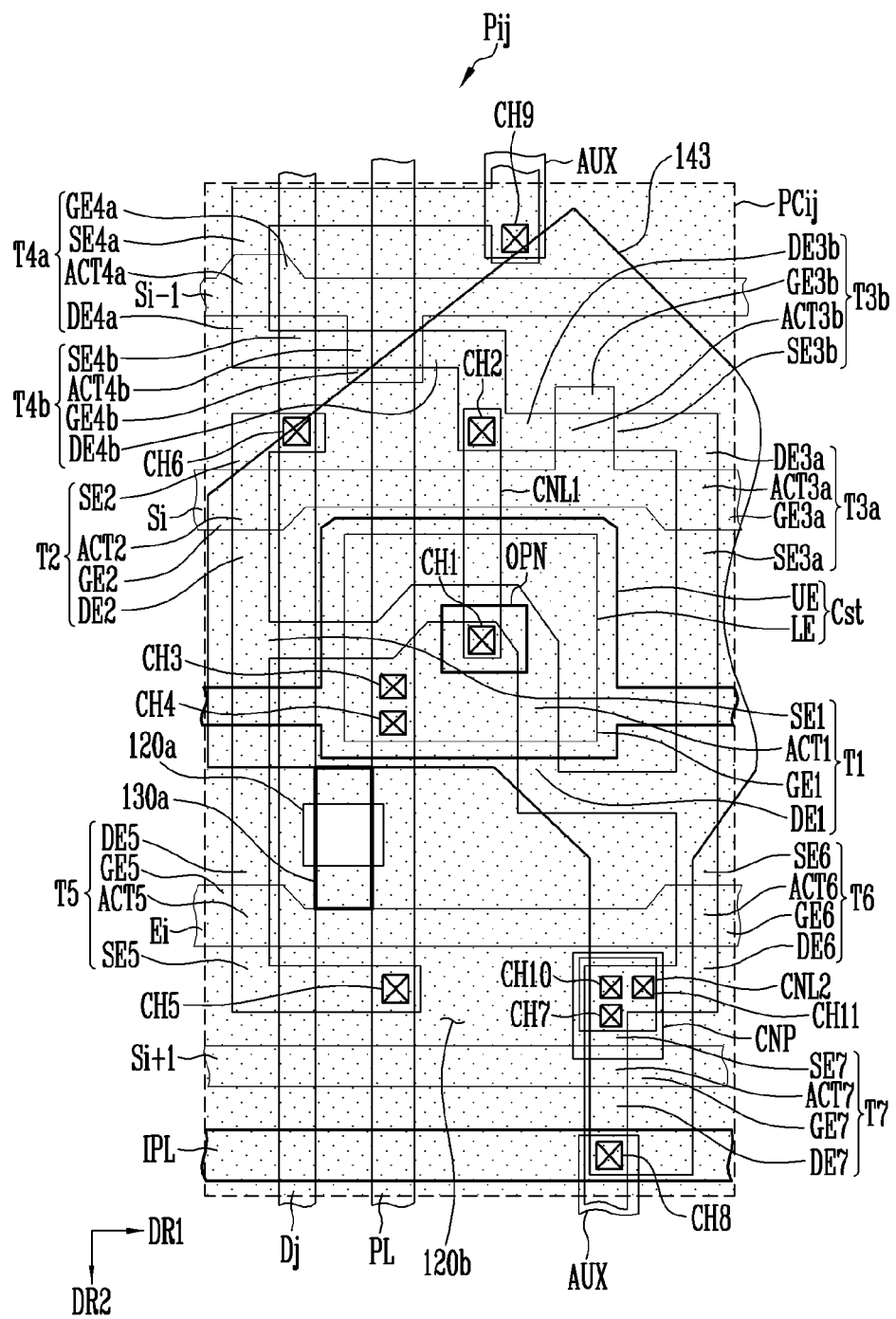
FIG. 24 is a plan view of a pixel shown in FIG. 21 in accordance with an embodiment of the present disclosure.

FIG. 24 is a plan view of a pixel shown in FIG. 21 in accordance with an embodiment of the present disclosure.

According to embodiments, the effective pinholes 130a of the first light blocking structure 130 shown in FIG. 24 are defined by the j-th data line Dj, the pixel power line PL, the i-th emission control line Ei, and the lower electrode 143.

According to embodiments, a part of the inner wall of the effective pinhole 130a of the first light blocking structure 130 is defined by a part of an outer wall of the lower electrode 143. In other words, the part of the inner wall of the effective pinhole 130a of the first light blocking structure 130 and the part of the outer wall of the lower electrode 143 vertically correspond to each other. In this case, the lower electrode 143 is also included in the first light blocking structure 130.

While various exemplary embodiments have been described above, those skilled in the art will appreciate that various modifications, additions and substitutions are possible, without departing from the scope and spirit of the present disclosure.

Therefore, exemplary embodiments disclosed in this specification are only for illustrative purposes rather than limiting the technical spirit of the present disclosure. The scope of exemplary embodiments of the present disclosure is defined by the accompanying claims.

An electroluminescent device according to an embodiment of the present disclosure can improve the accuracy of fingerprinting sensing by using a light emitting element provided in a pixel as a light source and increasing the quantity of light of the light source.

Furthermore, an electroluminescent device according to an embodiment of the present disclosure has at least one effective pinhole provided in a pixel, and the effective pinhole and some components of a touch sensing structure are spaced apart from each other, thus increasing the intensity (or quantity) of reflected light incident on an image sensor, and thereby allowing a user's fingerprint to be accurately sensed, and realizing a slimmer electroluminescent device.

What is claimed is:

1. An electroluminescent device, comprising:
   an electroluminescent structure that includes lower electrodes, luminous layers on the lower electrodes, and an upper electrode on the luminous layers;
   a light blocking structure disposed under the electroluminescent structure and that includes effective pinholes that do not overlap the lower electrodes;
   image sensors disposed under the light blocking structure and that overlap the effective pinholes; and
   a touch sensing structure disposed on the electroluminescent structure and that does not overlap the effective pinholes.

2. The electroluminescent device of claim 1, wherein the touch sensing structure includes touch sensing electrodes and bridges that electrically couple two neighboring touch sensing electrodes to each other,
   wherein the electroluminescent structure comprises luminous areas where the lower electrodes, the luminous layers and the upper electrode overlap each other and emit light, and
   wherein at least one of the touch sensing electrodes or at least one of the bridges further includes a hole that overlaps the luminous area.

3. The electroluminescent device of claim 1, wherein the light blocking structure further includes dummy pinholes,
   wherein the dummy pinholes are located between the effective pinholes, and
   wherein the effective pinholes and the dummy pinholes form a single grid arrangement in a plan view.

4. The electroluminescent device of claim 1, wherein the light blocking structure comprises:
   a first light blocking structure that includes first effective pinholes and first dummy pinholes; and a second light blocking structure disposed between the first light blocking structure and the image sensors, wherein the second light blocking structure includes a second light blocking area and second effective pinholes, wherein the second light blocking area does not overlap the first effective pinholes and blocks light passing through the first dummy pinholes, and wherein the second effective pinholes overlap the first effective pinholes and form the effective pinholes.

5. The electroluminescent device of claim 1, wherein the light blocking structure comprises:

a first light blocking structure that includes first effective pinholes; and a second light blocking structure disposed between the first light blocking structure and the image sensors, wherein the second light blocking structure includes a second light blocking area and second effective pinholes, wherein the second light blocking area does not overlap the first effective pinholes, and wherein the second effective pinholes overlap the first effective pinholes and form the effective pinholes.

6. The electroluminescent device of claim 1, wherein a shortest planar distance from an optical center of one of the effective pinholes to the lower electrodes is greater than a planar distance measured from the optical center of the one effective pinhole to an inner wall of the one effective pinhole in a first direction in which the shortest planar distance from the optical center of the one effective pinhole to the lower electrodes is measured.

7. The electroluminescent device of claim 6, wherein the lower electrodes include a single first lower electrode that is closest to the optical center of the one effective pinhole in a plan view, and a single second lower electrode that is second closest to the optical center of the one effective pinhole in a plan view.

8. The electroluminescent device of claim 7, wherein a shortest planar distance from the optical center of the one effective pinhole to the single second lower electrode is measured in a second direction, and wherein an angle between the first and second directions is not k×180°, where k is an integer other than zero.

9. The electroluminescent device of claim 6, wherein the lower electrodes include a single first lower electrode that is closest to the optical center of the one effective pinhole in a plan view, and at least two second lower electrodes that are second closest to the optical center of the one effective pinhole, in a plan view.

10. The electroluminescent device of claim 6, wherein the lower electrodes include at least two first lower electrodes that are closest to the optical center of the one effective pinhole, in a plan view.

11. The electroluminescent device of claim 6, further comprising:

an insulation layer on which the lower electrodes are located, a pixel defining layer disposed on the insulation layer and that covers edges of the lower electrodes, and spacers disposed on the pixel defining layer and higher than the pixel defining layer, wherein a shortest planar distance from the optical center of the one effective pinhole to the spacers is greater than the shortest planar distance from the optical center of the one effective pinhole to the lower electrodes.

12. The electroluminescent device of claim 11, wherein the touch sensing structure includes touch sensing electrodes and bridges, wherein each of the bridges electrically couples two neighboring touch sensing electrodes to each other, and wherein a shortest planar distance from the optical center of the one effective pinhole to the bridges is greater than the shortest planar distance from the optical center of the one effective pinhole to the spacers.

13. The electroluminescent device of claim 1, further comprising:

an insulation layer on which the lower electrodes are located, a pixel defining layer disposed on the insulation layer and that covers edges of the lower electrodes, and spacers disposed on the pixel defining layer and higher than the pixel defining layer, wherein a shortest planar distance from an optical center of one of the effective pinholes to the spacers is greater than a planar distance measured from the optical center of the one effective pinhole to an inner wall of the one effective pinhole in a third direction in which the shortest planar distance from the optical center of the one effective pinhole to the spacers is measured.

14. The electroluminescent device of claim 13, wherein the spacers include a single first spacer that is closest to the optical center of the one effective pinhole in a plan view, and a single second spacer that is second closest to the optical center of the one effective pinhole in a plan view.

15. The electroluminescent device of claim 14, wherein a shortest planar distance from the optical center of the one effective pinhole to the single second spacer is measured in a fourth direction, and wherein the third and fourth directions form a second angle, and the second angle is not m×180°, wherein m is an integer other than zero.

16. The electroluminescent device of claim 13, wherein the spacers include a single first spacer that is first closest to the optical center of the one effective pinhole in a plan view, and at least two second spacers that are second closest to the optical center of the one effective pinhole in a plan view.

17. The electroluminescent device of claim 13, wherein the spacers include at least two first spacers that are first closest to the optical center of the one effective pinhole in a plan view.

18. The electroluminescent device of claim 13, wherein the touch sensing structure includes touch sensing electrodes and bridges, wherein each of the bridges electrically couple two neighboring touch sensing electrodes to each other, and wherein a shortest planar distance from the optical center of the one effective pinhole to the bridges is greater than the shortest planar distance from the optical center of the one effective pinhole to the spacers.

19. The electroluminescent device of claim 1, wherein the touch sensing structure includes touch sensing electrodes and bridges, wherein each of the bridges electrically couples two neighboring touch sensing electrodes to each other, and wherein a shortest planar distance from an optical center of one of the effective pinholes to the bridges is greater than a planar distance measured from the optical center of the one effective pinhole to an inner wall of the one effective pinhole in a fifth direction in which the shortest planar distance from the optical center of the one effective pinhole to the bridges is measured.

20. The electroluminescent device of claim 19, wherein the bridges include a single first bridge that is closest to the optical center of the one effective pinhole in a plan view, and a single second bridge that is second closest to the optical center of the one effective pinhole in a plan view.

21. The electroluminescent device of claim 20, wherein a shortest planar distance from the optical center of the one effective pinhole to the single second bridge is measured in a sixth direction, and
wherein the fifth and sixth directions form a third angle, and the third angle is not n×180°, wherein n is an integer other than zero.

22. The electroluminescent device of claim 19, wherein the bridges include a single first bridge that is closest to the optical center of the one effective pinhole in a plan view, and at least two second bridges that are second closest to the optical center of the one effective pinhole in a plan view.

23. The electroluminescent device of claim 19, wherein the bridges include at least two first bridges that are first closest to the optical center of the one effective pinhole in a plan view.

24. The electroluminescent device of claim 1, wherein the touch sensing structure includes touch sensing electrodes and bridges,
wherein each of the bridges electrically couples two neighboring touch sensing electrodes to each other,
wherein the bridges include overlap areas that overlap the touch sensing electrodes, and
wherein a shortest planar distance from an optical center of one of the effective pinholes to the overlap areas is greater than a planar distance measured from the optical center of the one effective pinhole to an inner wall of the one effective pinhole in a direction in which the shortest planar distance from the optical center of the one effective pinhole to the overlap areas is measured.

25. The electroluminescent device of claim 1, wherein the electroluminescent structure has overlap areas where at least two luminous layers overlap, and at least one of the effective pinholes overlaps the overlap areas.

26. The electroluminescent device of claim 25, further comprising:
an insulation layer on which the lower electrodes are located,
a pixel defining layer disposed on the insulation layer and that covers edges of the lower electrodes, and
spacers disposed on the pixel defining layer and higher than the pixel defining layer,
wherein the overlap areas do not overlap the spacers.

27. The electroluminescent device of claim 1, further comprising a dummy image sensor located between the image sensors.

28. The electroluminescent device of claim 2, wherein at least one opening that overlaps at least one of the effective pinholes is formed through at least one of the touch sensing electrodes or at least one of the bridges, and
wherein a size of the one opening is greater than a size of the hole.

* * * * *